US012581654B2

(12) United States Patent
Cheng et al.

(10) Patent No.: US 12,581,654 B2
(45) Date of Patent: Mar. 17, 2026

(54) MEMORY DEVICE

(71) Applicant: MACRONIX International Co., Ltd., Hsinchu (TW)

(72) Inventors: Chen-Yu Cheng, Hsinchu City (TW);
Chih-Kai Yang, Kaohsiung City (TW);
Shih-Chin Lee, Taichung City (TW);
Tzung-Ting Han, Hsinchu City (TW)

(73) Assignee: MACRONIX International Co., Ltd., Hsinchu (TW)

(*) Notice: Subject to any disclaimer, the term of this patent is extended or adjusted under 35 U.S.C. 154(b) by 429 days.

(21) Appl. No.: 18/474,615

(22) Filed: Sep. 26, 2023

(65) Prior Publication Data

US 2025/0107082 A1 Mar. 27, 2025

(51) Int. Cl.
H10B 43/27 (2023.01)
(52) U.S. Cl.
CPC .................................... H10B 43/27 (2023.02)
(58) Field of Classification Search
CPC ......... H10B 43/10; H10B 43/27; H10B 43/50
See application file for complete search history.

(56) References Cited

U.S. PATENT DOCUMENTS

2020/0258898 A1* 8/2020 Hu ...................... H01L 23/5226
2022/0367499 A1 11/2022 Matsuno et al.

2022/0406720 A1* 12/2022 Hinoue ............... H01L 23/5226
2023/0097021 A1 3/2023 Kwon et al.
2023/0275026 A1 8/2023 Matsuno et al.
2023/0389317 A1* 11/2023 Togo ...................... H10B 80/00

FOREIGN PATENT DOCUMENTS

TW 201947706 12/2019
TW 202220186 5/2022
TW 202249245 12/2022
TW 202316637 4/2023

OTHER PUBLICATIONS

"Office Action of Taiwan Counterpart Application", issued on Jul. 3, 2024, pp. 1-3.

* cited by examiner

*Primary Examiner* — Jaehwan Oh
(74) *Attorney, Agent, or Firm* — J.C. PATENTS

(57) ABSTRACT

A memory device includes a stack structure, a first stop layer, a dielectric layer, at least one separation wall and a conductive plug. The stacked structure is located over a substrate. The stacked structure has an opening exposing a stepped structure of the stacked structure. The first stop layer covers the stepped structure and at least at least one portion of sidewalls of the opening. The dielectric layer fills the opening and covers the first stop layer. The separation wall extends through the dielectric layer and the first stop layer in the opening. The conductive plug extends through the dielectric layer and the first stop layer, and is electrically connected to the stepped structure. The memory device may be a 3D NAND flash memory with high capacity and high performance.

20 Claims, 51 Drawing Sheets

200W

SM1

402
52
(52')

SM1'

52

MEMORY DEVICE

BACKGROUND

Technical Field

The embodiments of the present disclosure relate to a semiconductor device, and particularly to a memory device.

Description of Related Art

A non-volatile memory device (e.g., a flash memory) has the advantage that stored data does not disappear at power-off, so it becomes a widely used memory device for a personal computer or other electronic equipment.

Currently, the flash memory arrays commonly used in the industry include a NOR flash memory and a NAND flash memory. The NAND flash memory has multiple memory cells connected in series, so the NAND flash memory has better integration and area utilization than the NOR flash memory, and has been widely used in various electronic products. In addition, in order to further enhance the integration of memory devices, a three-dimensional NAND flash memory has been developed. However, there are still many challenges associated with a three-dimensional NAND flash memory.

For example, multiple word lines of a three-dimensional NAND flash memory are electrically connected through multiple conductive plugs. However, since conductive plugs have various depths, it is quite difficult to control the manufacturing process. As a result, some conductive plugs cannot be landed on the word lines, or some conductive plugs penetrate through the word lines and therefore cause short circuits with multiple word lines. Therefore, the yield of the manufacturing process is reduced.

SUMMARY

The disclosure provides a memory device capable of enabling conductive plugs of various depths to land on word lines of a stepped structure and improving the yield of a fabrication process.

A memory device according to an embodiment of the disclosure includes a substrate, a stacked structure, a first stop layer, a dielectric layer, at least one separation wall, and a conductive plug. The stacked structure is located over the substrate. The stacked structure includes a plurality of conductive layers and a plurality of insulating layers stacked alternately, and the stacked structure has an opening exposing a stepped structure of the stacked structure. The first stop layer at least covers the stepped structure and at least one portion of sidewalls of the opening. The dielectric layer fills in the opening and covers the first stop layer. The at least one separation wall extends through the dielectric layer and the first stop layer in the opening. The conductive plug extends through the dielectric layer and the first stop layer, and electrically connected to the stepped structure.

A memory device according to an embodiment of the disclosure includes a substrate, a stacked structure, a first stop layer, a dielectric layer, at least one separation wall, and a conductive plug. The stacked structure is located over the substrate. The stacked structure includes a plurality of conductive layers and a plurality of insulating layers alternately stacked, the stacked structure has an opening exposing a stepped structure of the stacked structure. The opening includes a first sidewall, a second sidewall, a third sidewall, a fourth sidewall, and a bottom. The second sidewall is connected to the first sidewall. The third sidewall is connected to the second sidewall, and the first sidewall is opposite to the third sidewall. The fourth sidewall is connected to the third sidewall, and the second sidewall is opposite to the fourth sidewall. The bottom is connected to the first sidewall, second sidewall, third sidewall and fourth sidewall. The first stop layer includes a first portion and a second portion. The first portion covers the stepped structure. The second portion at least covers the first sidewall and the third sidewall. The dielectric layer fills in the opening and covering the first stop layer. The at least one separation wall extends through the dielectric layer and the first portion and the second portion of the first stop layer in the opening. The conductive plug extends through the dielectric layer and the first portion of the first stop layer, and electrically connected to the stepped structure.

Based on the above, the memory device according to the embodiments of the disclosure is capable of enabling conductive plugs of various depths to land on word lines of a stepped structure and improving the yield of a fabrication process.

DESCRIPTION OF THE EMBODIMENTS

Figure 1A:
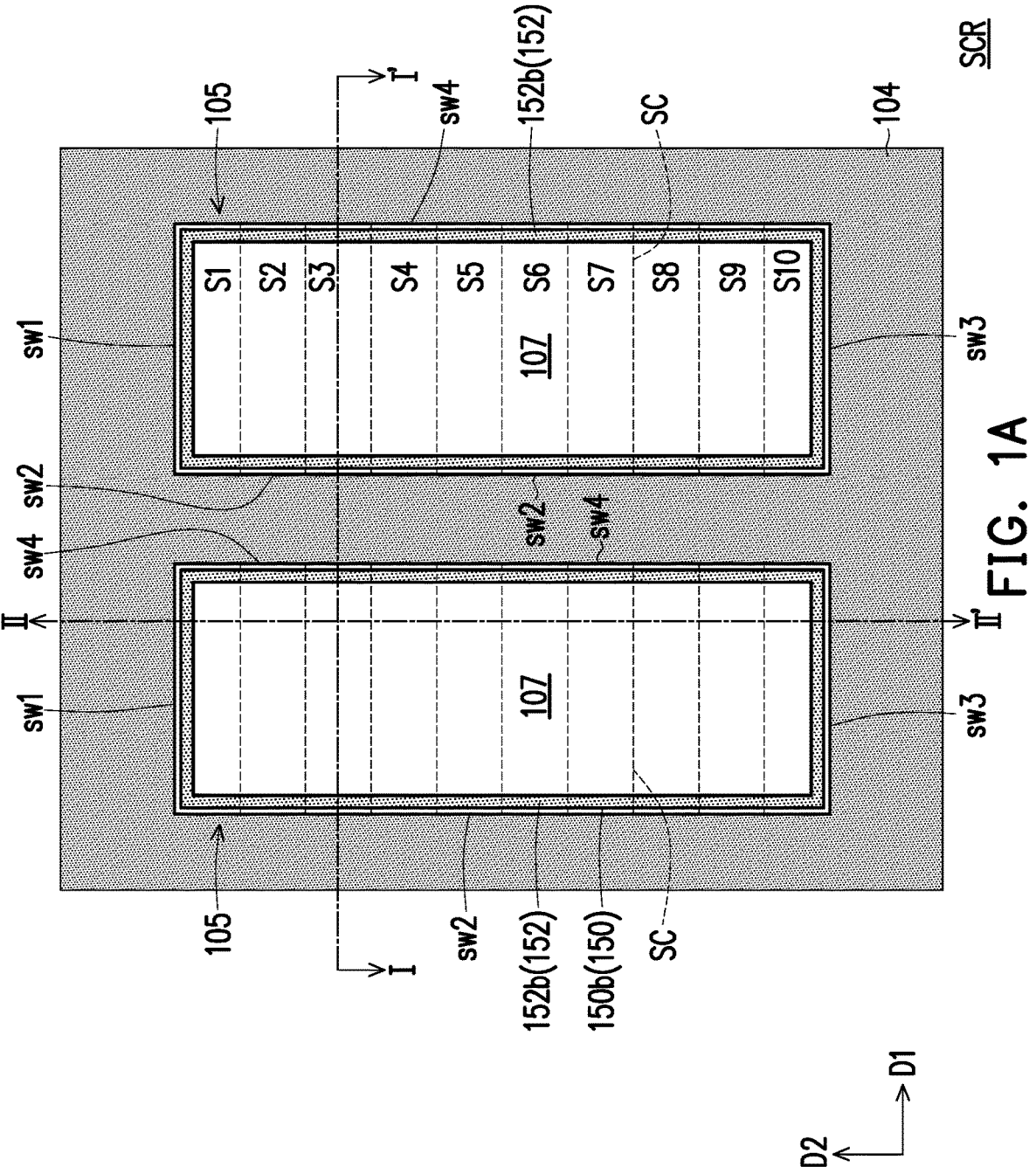
FIG. 1A to FIG. 1D are top views of intermediate stages of a method for fabricating a memory device according to an embodiment of the disclosure.
Figure 1B:
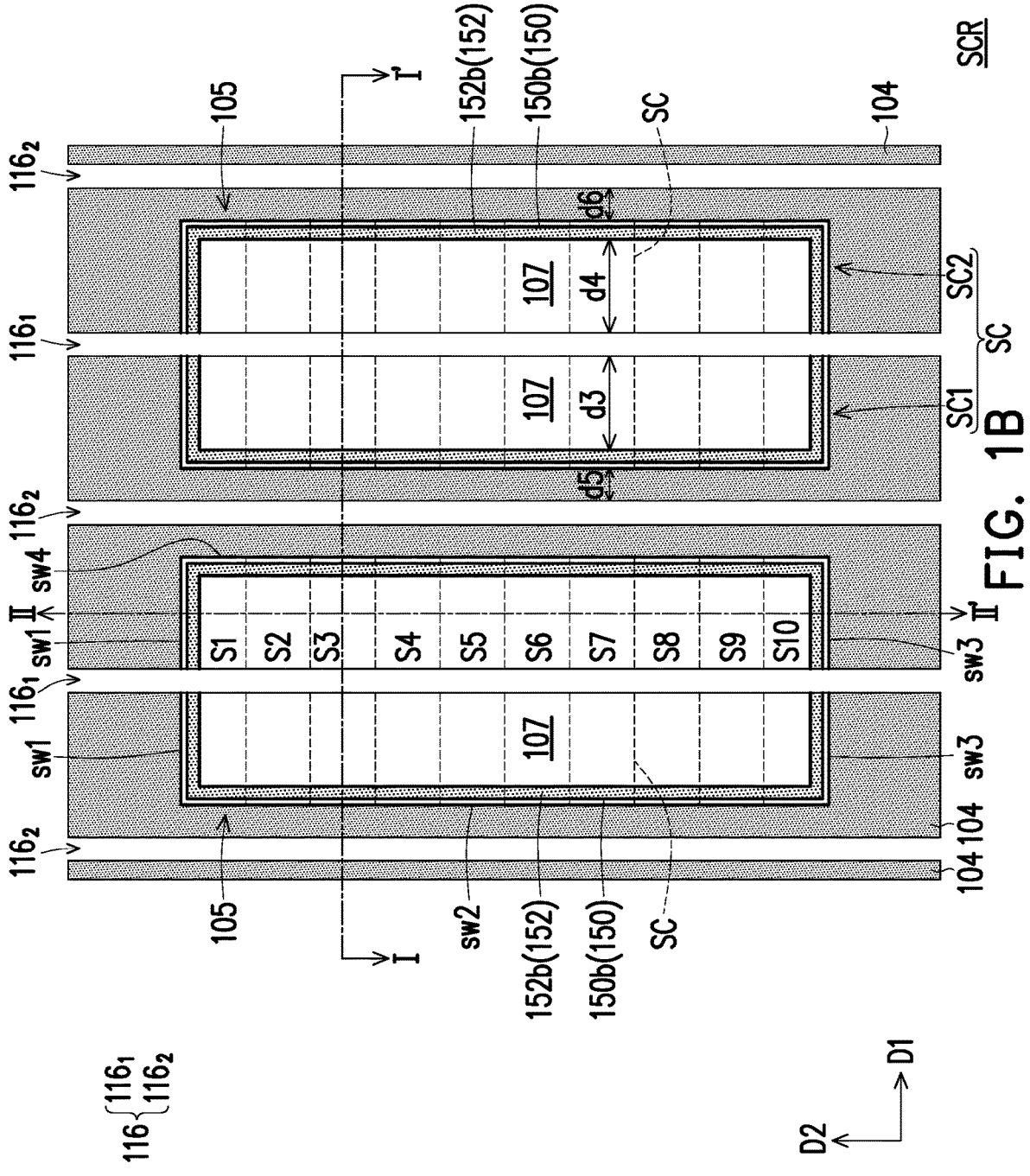
Figure 1C:
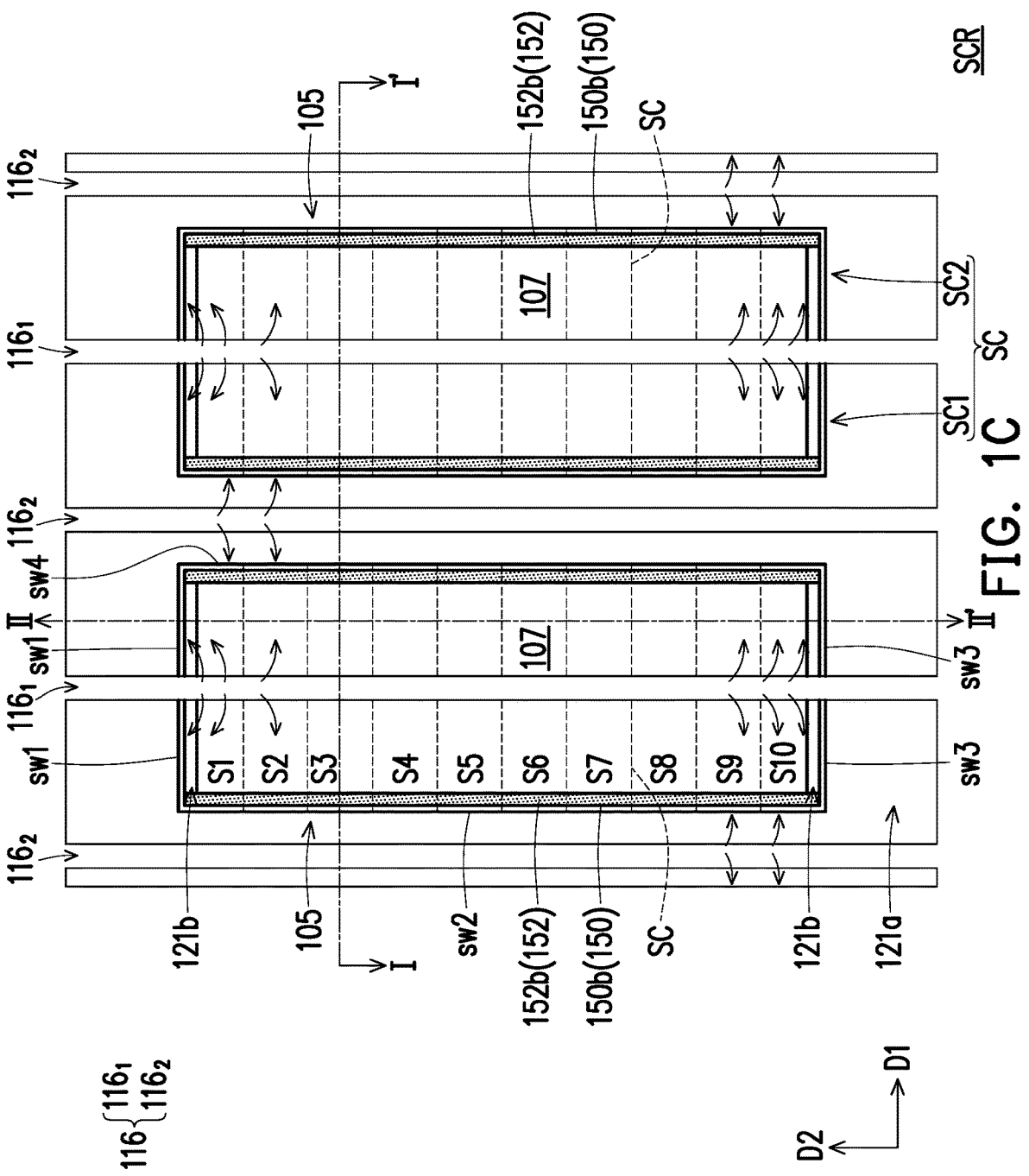
Figure 1D:
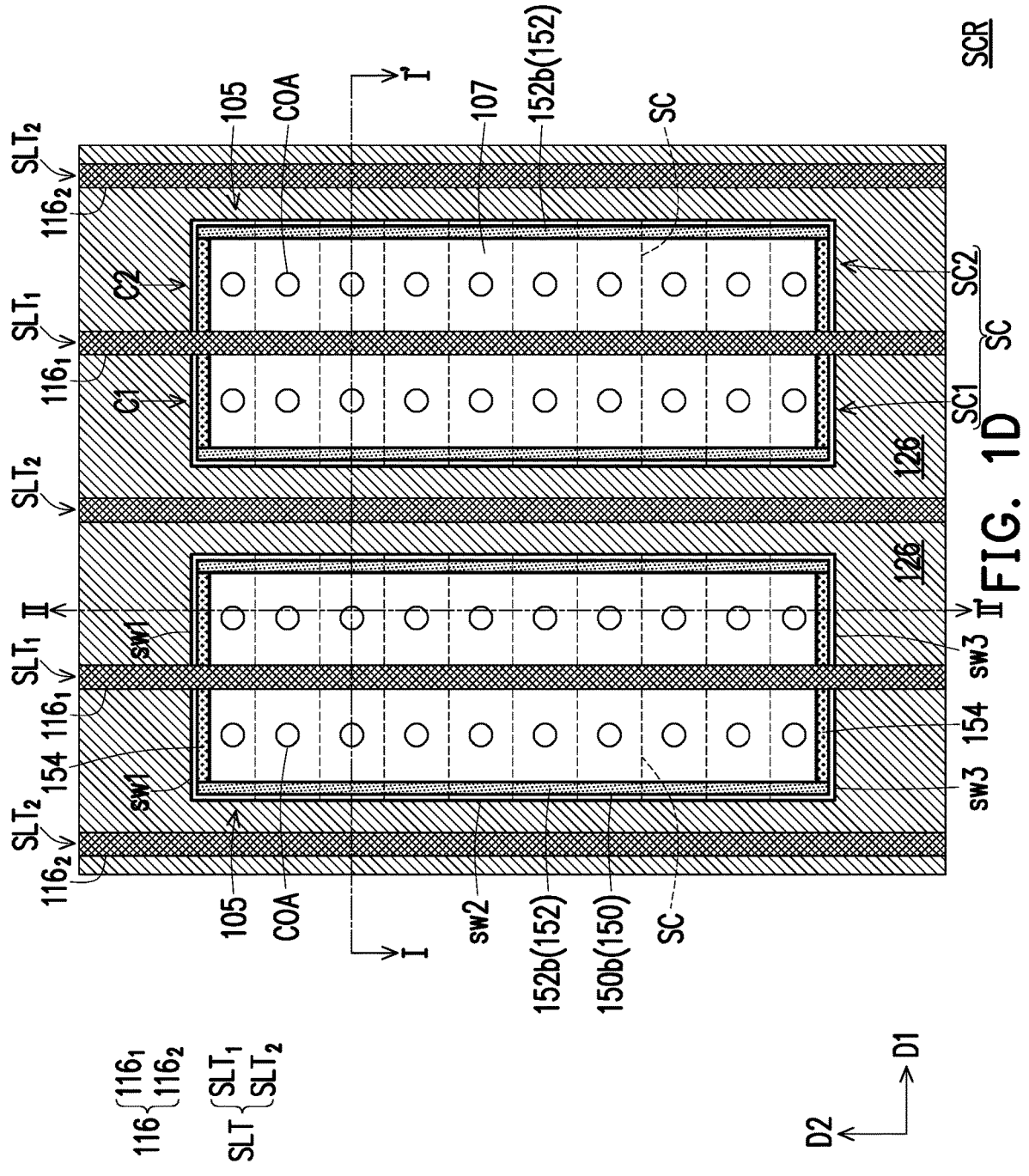
Figure 2A:
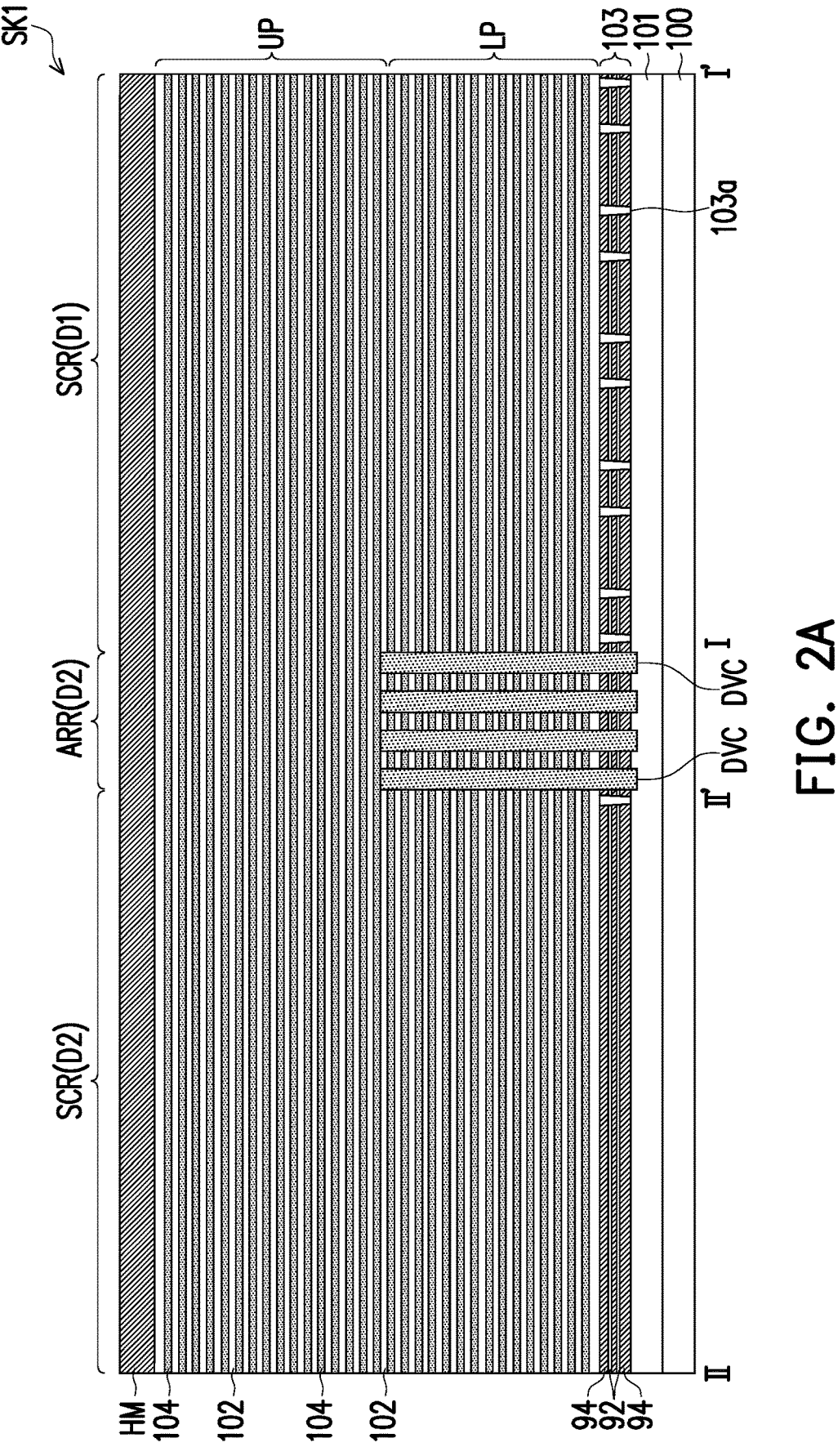
FIG. 2A to FIG. 2R are schematic cross-sectional views of a method for fabricating a memory device according to an embodiment of the disclosure.
Figure 8A:
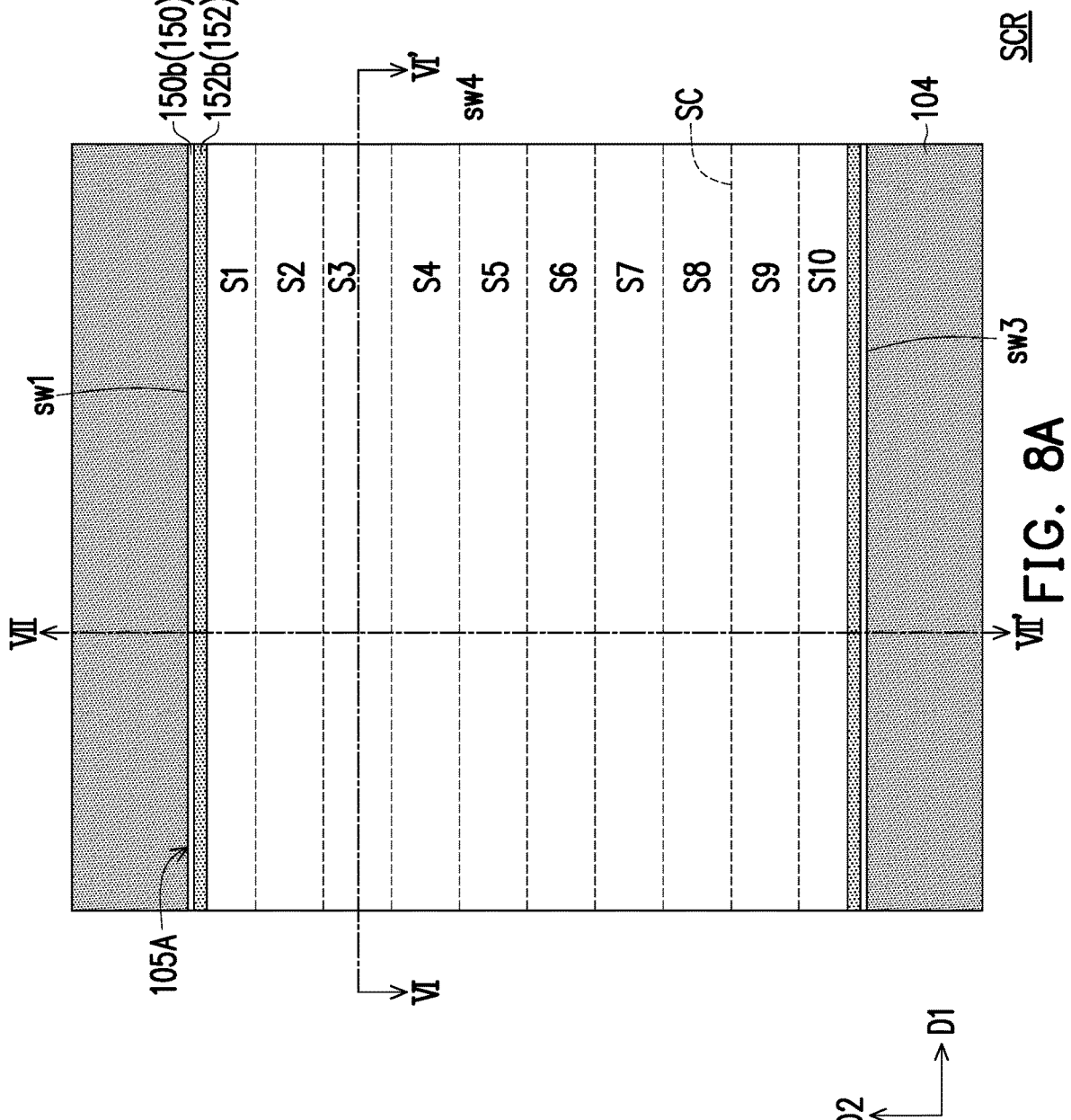
FIG. 8A to FIG. 8D are top views of intermediate stages of a method for fabricating a memory device according to another embodiment of the disclosure.
Figure 8B:
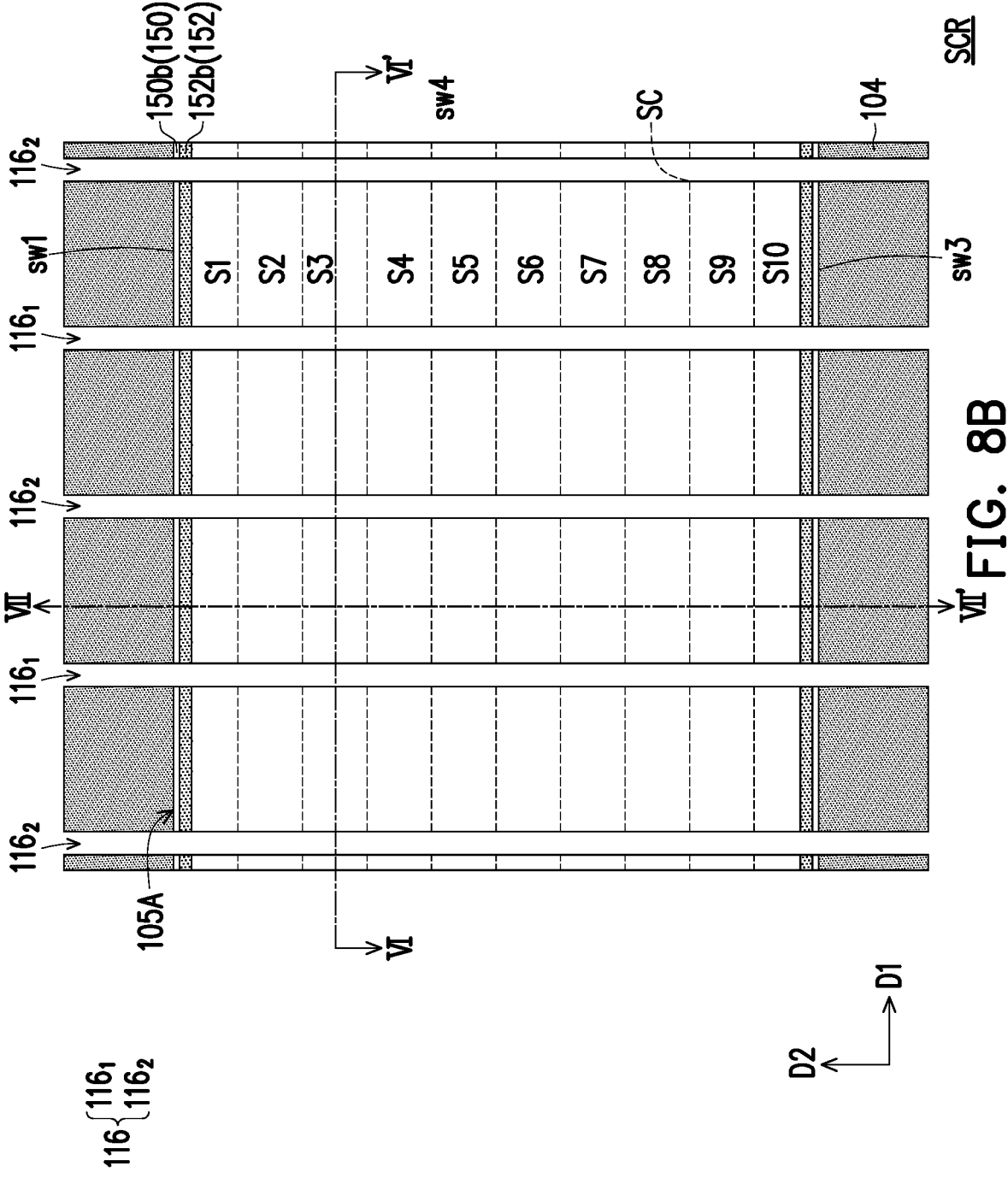
Figure 8C:
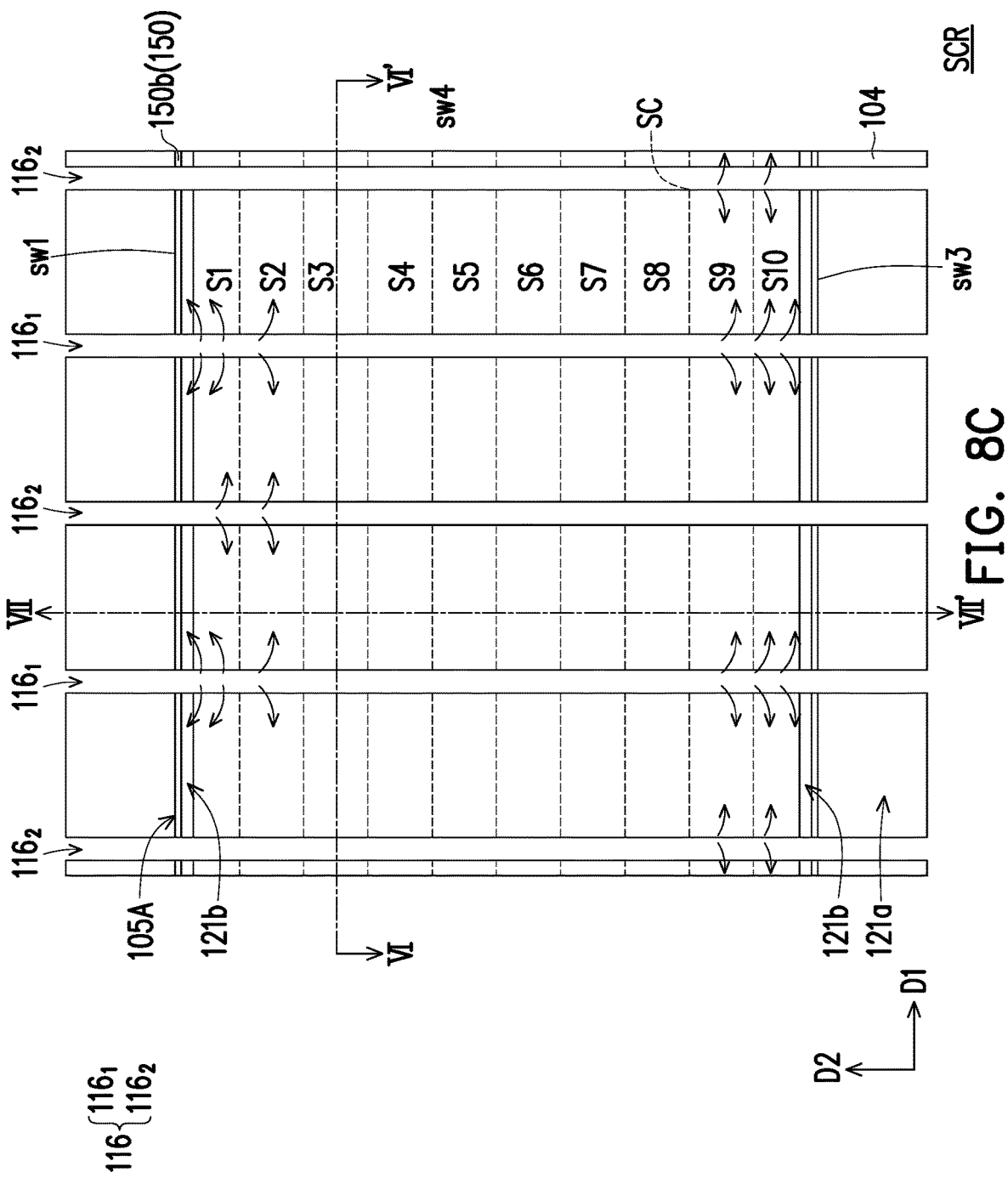
Figure 8D:
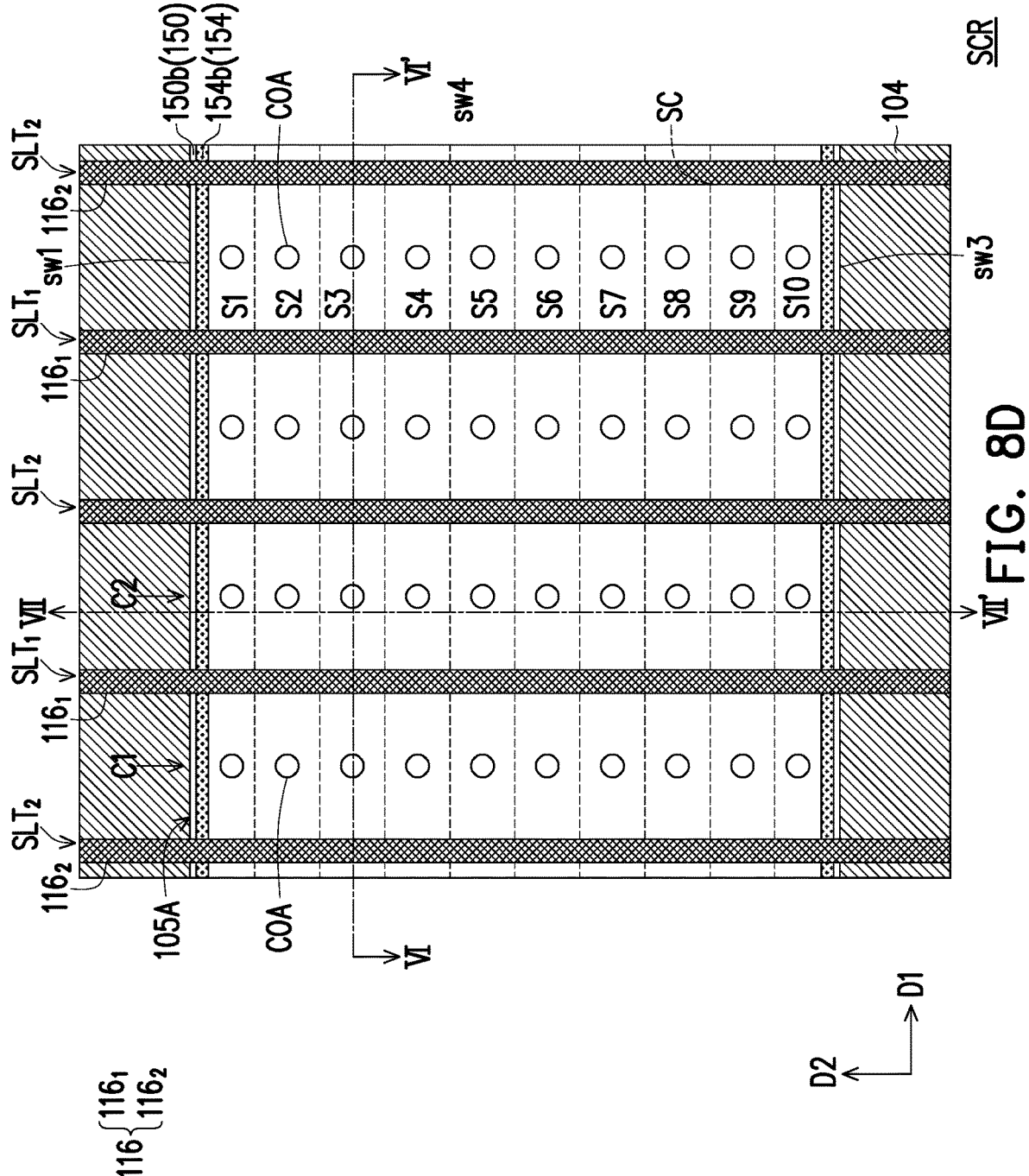
Figure 9A:
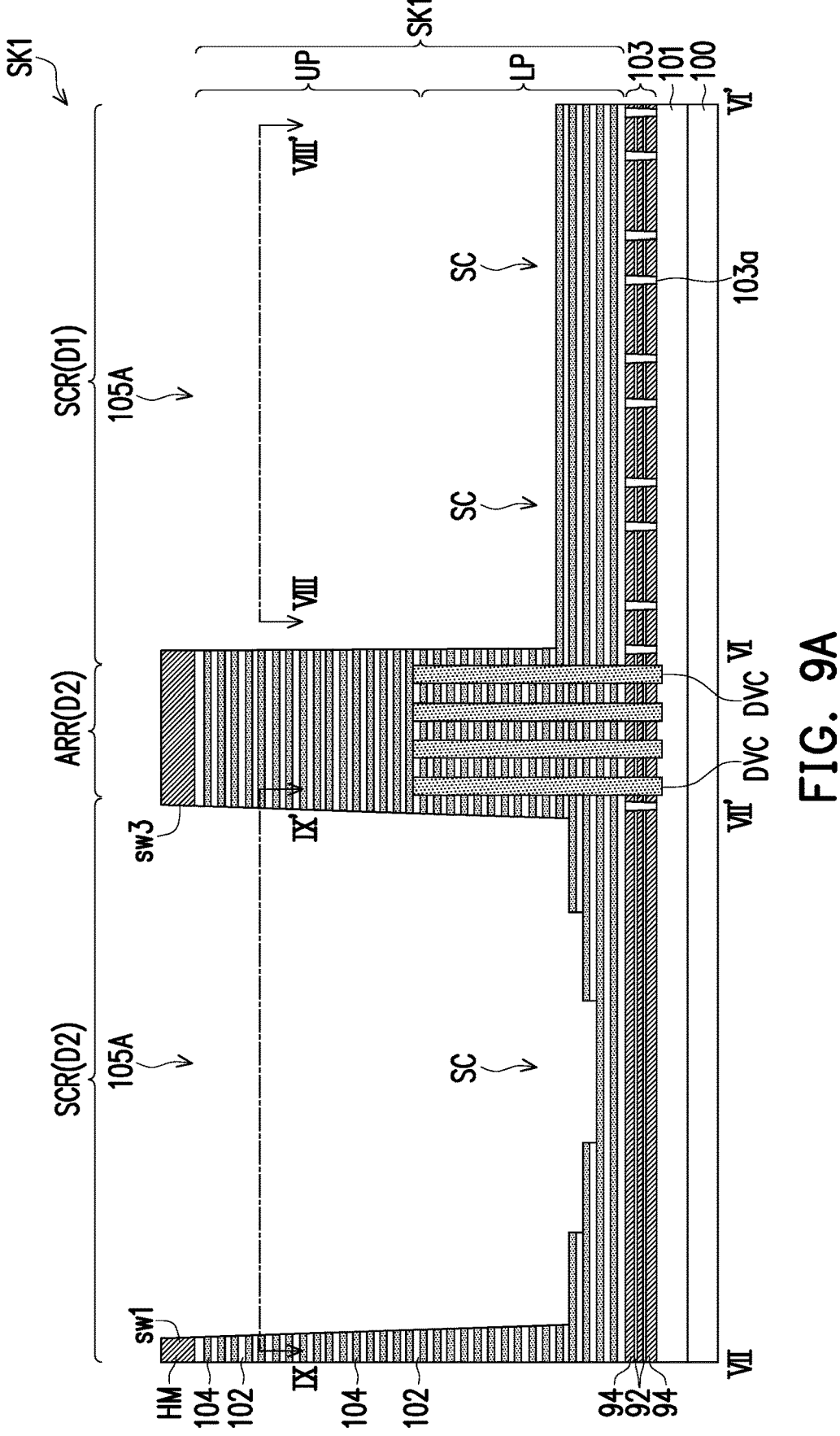
FIG. 9A to FIG. 9E are schematic cross-sectional views of a method for fabricating a memory device according to another embodiment of the disclosure.

FIG. 1D and FIG. 8D are top views of intermediate stages of memory devices according to embodiments of the disclosure. FIG. 2R and FIG. 9E show schematic cross-sectional views of the memory devices according to the embodiments of the disclosure. FIG. 3A and FIG. 3B and FIG. 10A and FIG. 10B show conductive plugs of different depths.

Referring to FIG. 2R and FIG. 9E respectively, memory chips SM1 and SM2 according to the embodiments of the disclosure each include a memory array region ARR, a staircase region SCR, and a peripheral region PRR. A stacked structure SK2 is included in the memory array region ARR. The stacked structure SK2 includes multiple insulating layers 102 and multiple conductive layers 126 stacked alternately. The multiple conductive layers 126 may serve as multiple word lines WL. Multiple channel pillars VC extend through the stacked structure SK2. Multiple charge storage structures 108 surround an outer surface of the channel pillar VC and are located between the multiple conductive layers 126 and the multiple channel pillars VC. The multiple word lines WL, the multiple channel pillars VC, and the multiple charge storage structures 108 interposed therebetween form multiple memory cells MC. The multiple memory cells MC form a memory array ARY. In other words, the memory array ARY is included in the stacked structure SK2.

Referring to FIG. 2R and FIG. 9E, a stacked structure SK1 is included in the peripheral region PRR. The stacked structure SK1 includes multiple insulating layers 102 and multiple intermediate layers 104 stacked alternately. The staircase region SCR includes multiple stepped structures SC exposed by openings 105 or 105A, as shown in FIGS. 2Q and 9D. In FIG. 2R and FIG. 9E, the stepped structure SC is reversed, so it may also be referred to as a reverse stepped structure RSC.

Figure 9B:
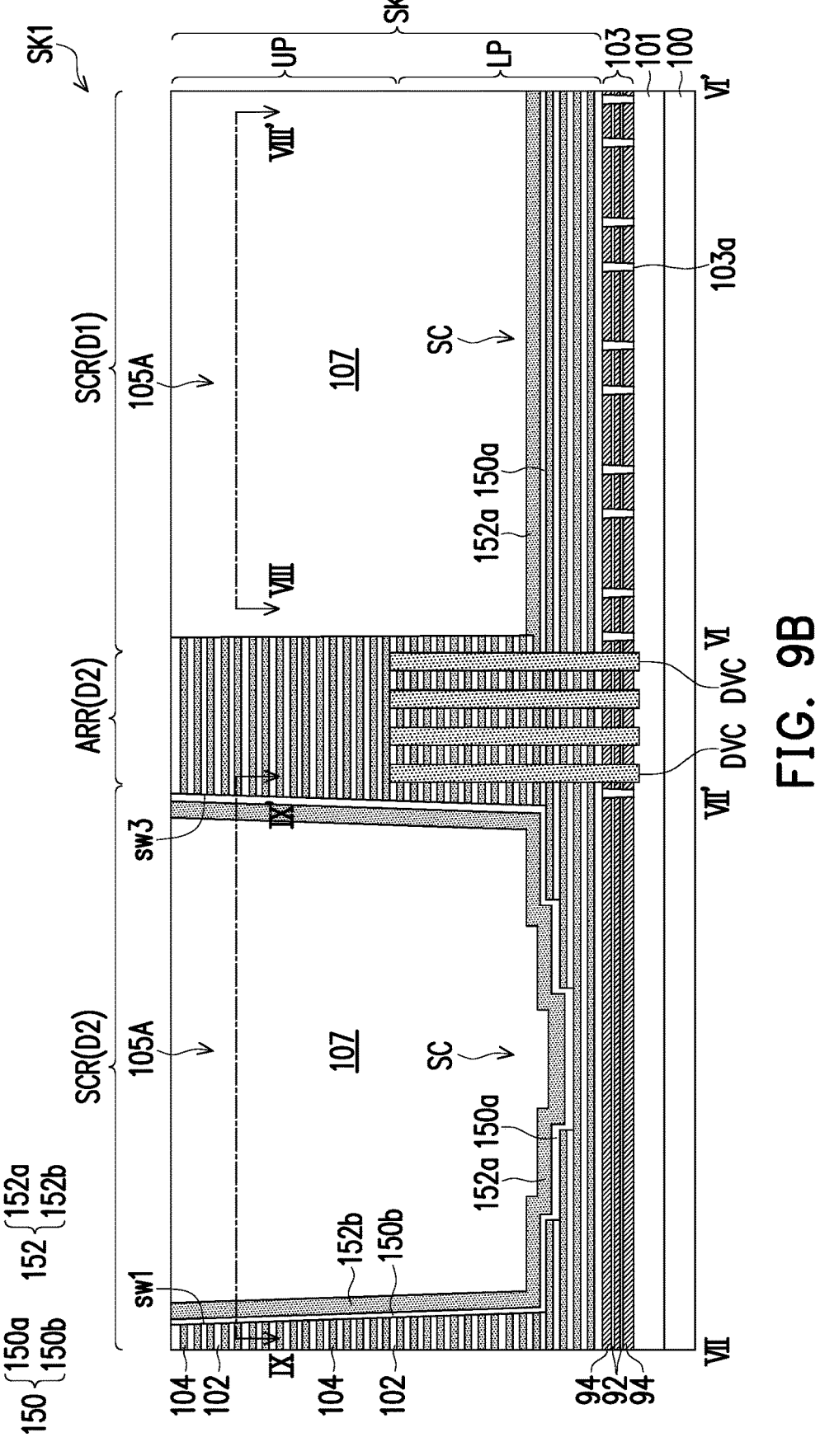
Figure 9C:
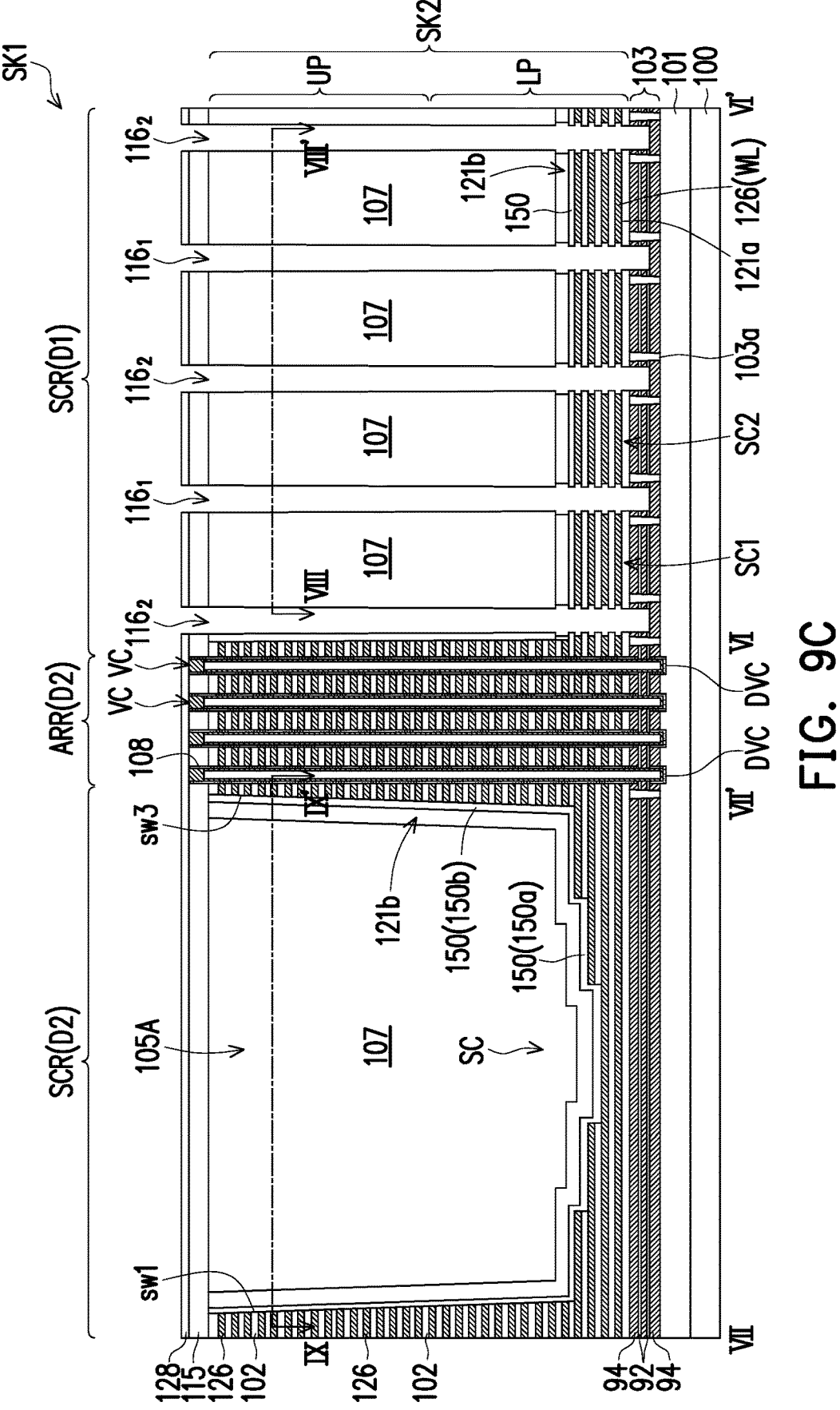
Figure 9D:
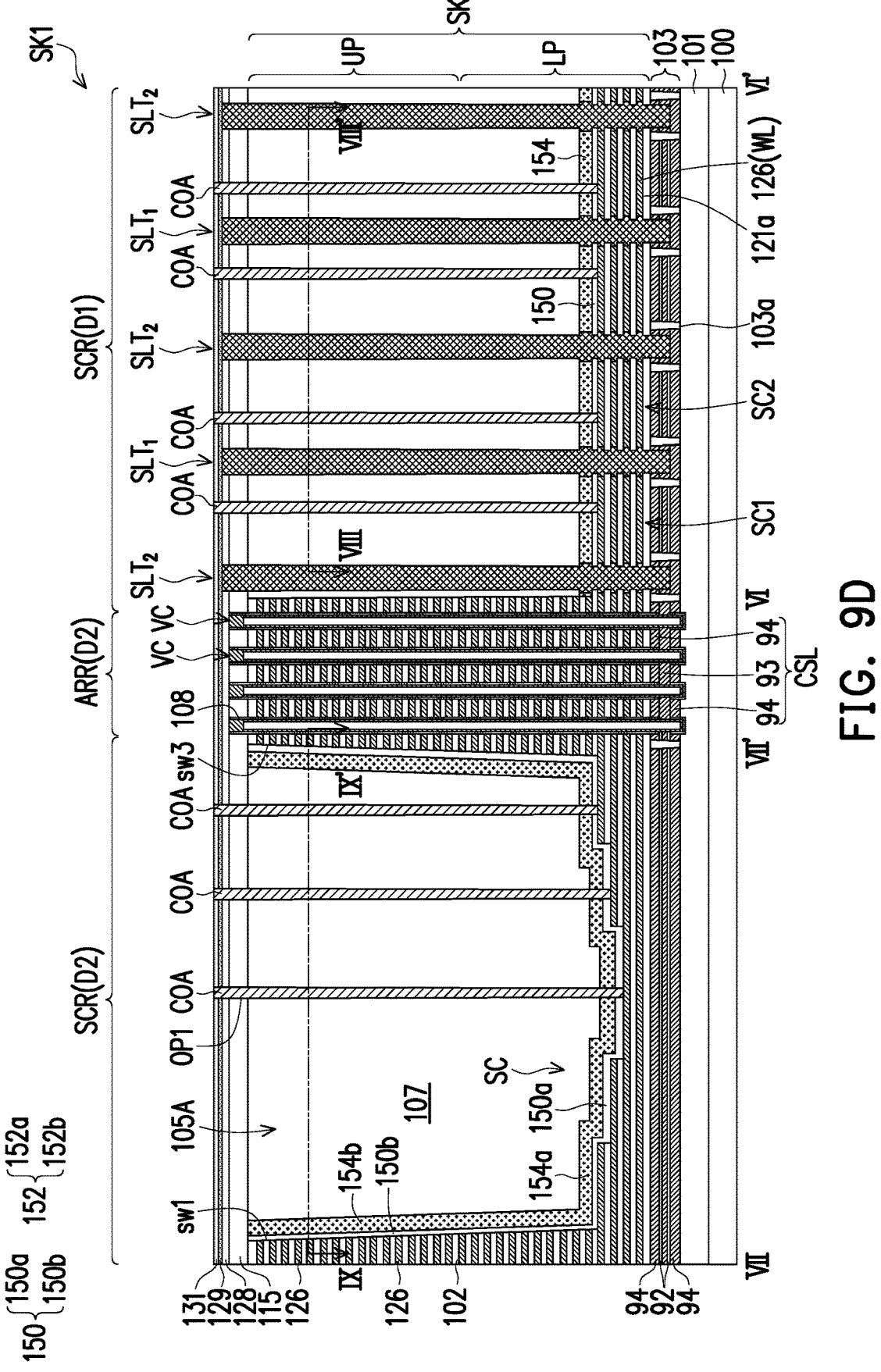
Figure 9E:
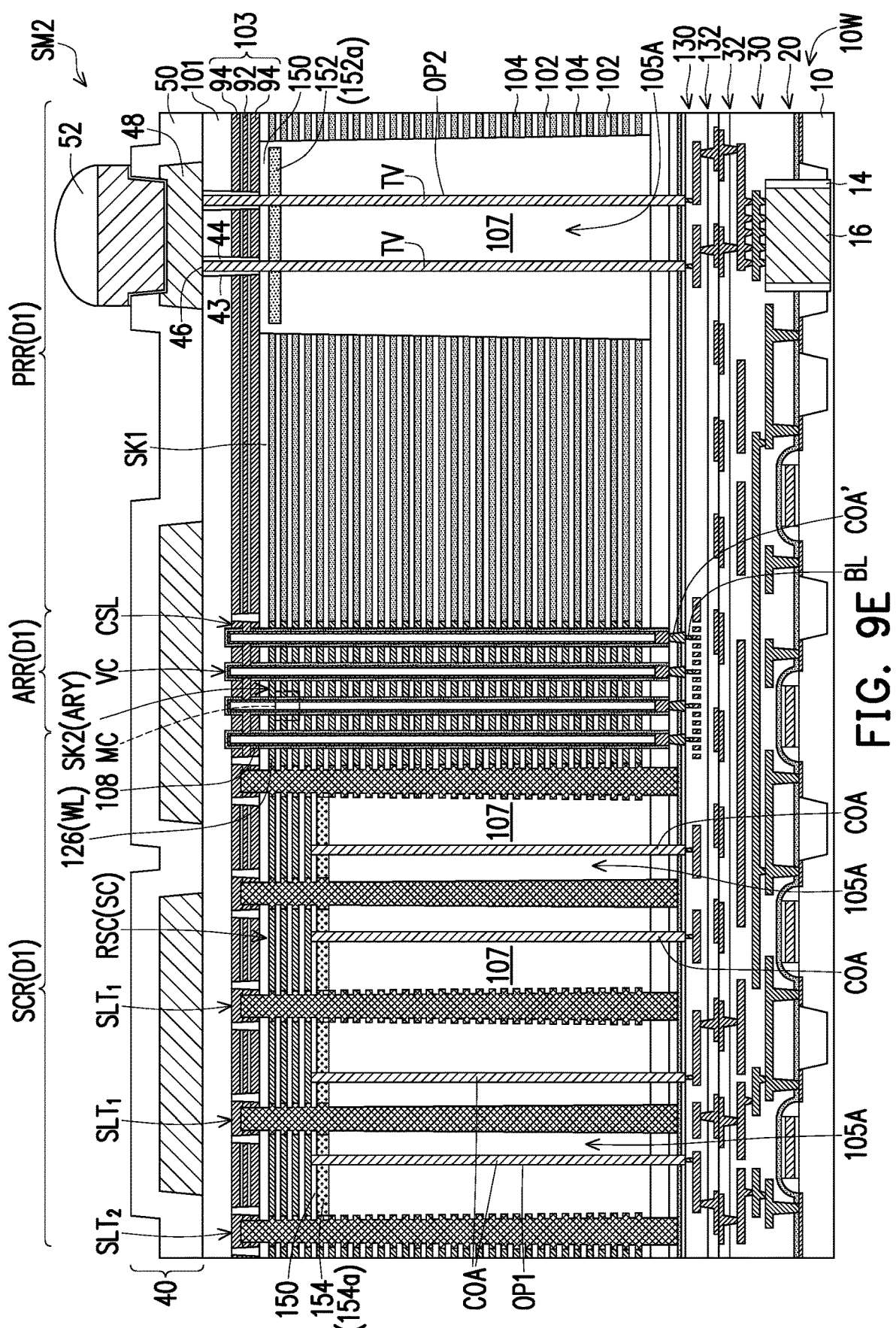
Figures 10A, 10B:
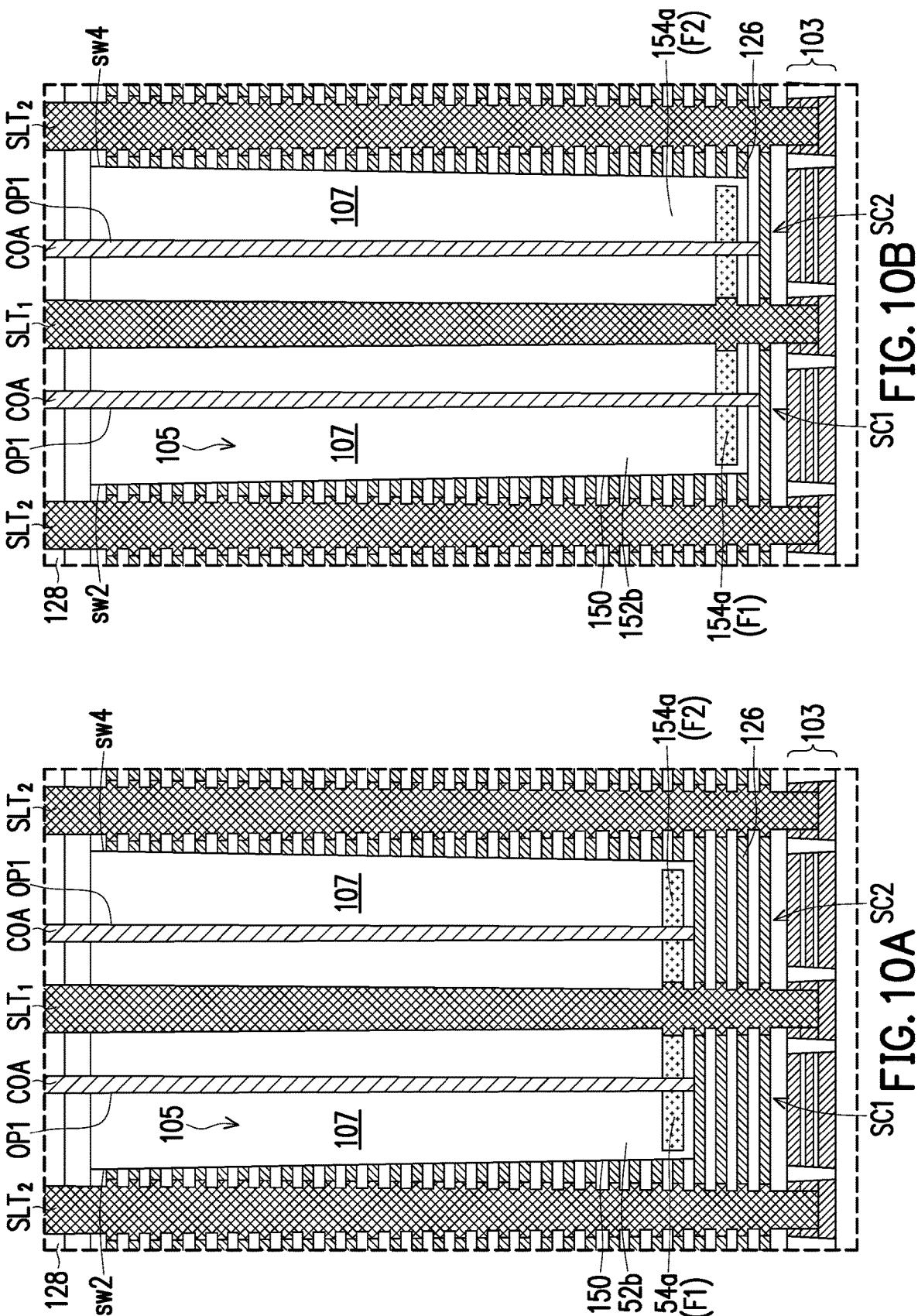
FIG. 10A and FIG. 10B show conductive plugs of different depths.

Referring to FIG. 2R and FIG. 9E, the memory chips SM1 and SM2 further include multiple conductive plugs COA' and COA and through vias TV. The conductive plug COA' is located in the memory array region ARR and electrically connects the multiple channel pillars VC to a bit line BL. The conductive plug COA is located in the staircase region SCR and extends through a dielectric layer 107 in the opening 105 and electrically connects one of the multiple conductive layers 126 (i.e., the multiple word lines WL) of the stepped structure SC to an interconnect structure 130 below. The through via TV is located in the peripheral region PRR, is electrically connected to a conductive plug 46 and a conductive line 48 of an interconnect structure 40 above. Also, the through via TV extends through the dielectric layer 107 in the opening 105 to be electrically connected to the interconnect structure 130 below. Since the conductive plugs COA are connected to the conductive layers 126 at steps of different heights of the stepped structure SC, the multiple conductive plugs COA have various depths. For example, the depth of the conductive plug COA in FIG. 3A or FIG. 10A is shallower, and the depth of the conductive plug COA in FIG. 3B or FIG. 10B is deeper.

Referring to FIG. 2R and FIG. 9E, the multiple conductive plugs COA and the multiple through vias TV have different depths. In particular, the depths of the through vias TV and some of the conductive plugs COA connected to lower steps are quite large, which is very difficult to control in the fabrication process. In the embodiment of the present disclosure, after the stepped structure SC is formed, a liner layer 150 and stop layers 152 and 154 (as shown in FIGS. 1D, 2R, 8D and 9E) are covered on the surface of the stepped structure SC before forming the multiple conductive plugs COA and the multiple through vias TV. As shown in FIGS. 2R and 9E, multiple conductive plug holes OP1 of the multiple conductive plugs COA and multiple through via openings OP2 of the multiple through vias TV are formed through a multi-stage etching process. In the multi-stage etching process, the stop layers 152 and 154 may serve as etching stop layers of a first-stage etching process. The liner layer 150 may serve as an etching stop layer of a second-stage etching process. Therefore, in the embodiment of the disclosure, the arrangement of the liner layer 150 and the stop layers 152 and 154 contributes to forming the multiple conductive plug holes OP1 and the multiple through via openings OP2 of various depths. The more detailed fabricating method of a memory device will be introduced in the later descriptions.

The embodiments of the disclosure may be applied to memory devices of various architectures. As an example, a method for fabricating a memory device with a CMOS-Bonded-Array (CbA) structure will be described below. However, the embodiments of the disclosure are not limited thereto. The embodiments of the disclosure may also be applied to memory devices with a CMOS-Under-Array (CUA) structure.

FIG. 1A to FIG. 1D are top views of intermediate stages of a method for fabricating a memory device according to an embodiment of the disclosure. FIG. 2A to FIG. 2R are schematic cross-sectional views of a method for fabricating a memory device according to an embodiment of the disclosure. For clarity, FIG. 1A and FIG. 1D are shown top views of lines III-III' and IV-IV' of the staircase region SCR in FIG. 2A and FIG. 2Q. FIG. 2A and FIG. 2Q show schematic cross-sectional views of the staircase region SCR (including cross-sections of lines I-I' and II-II' in two different directions D1 and D2 in FIG. 1A to FIG. 1D) and the memory array region ARR. The direction D1 is, for example, parallel to a direction of the bit lines. The direction D2 is, for example, parallel to a direction of the word lines. FIG. 2R shows a schematic cross-sectional view of the staircase region SCR, the memory array region ARR, and the peripheral region PRR.

Referring to FIG. 2A, a substrate 100 is provided. The substrate 100 may be a semiconductor substrate, such as a silicon-containing substrate. An insulating layer 101 and a stop structure 103 are formed on the substrate 100. The insulating layer 101 may include silicon oxide. The stop structure 103 is formed on the insulating layer 101. The stop structure 103 may include multiple insulating layers 92 and multiple conductive layers 94 stacked alternately. The insulating layers 92 may include silicon oxide, and the conductive layers 94 may include polysilicon. An insulating structure 103a has been formed in the stop structure 103.

Referring to FIG. 2A, a lower part LP of a stacked structure SK1 (or called "first stacked structure" in some examples) is formed on the surface of the stop structure 103. The lower part LP of the stacked structure SK1 includes multiple insulating layers 102 and multiple intermediate layers 104 stacked alternately. In some embodiments, the material of the insulating layers 102 includes silicon oxide, and the material of the intermediate layers 104 includes silicon nitride. The intermediate layers 104 may serve as sacrificial layers, which will be partially removed in the subsequent processes.

Referring to FIG. 2A, next, multiple dummy pillars DVC are formed through the lower part LP of the stacked structure SK1. The method of forming the multiple dummy pillars DVC includes performing single-stage lithography and etching processes or multi-stage lithography and etching processes to form multiple openings (not shown). The openings extend through the lower part LP of the stacked structure SK1 and extend to the stop structure 103, and even extend to the insulating layer 101. Then, a filling material (or a self-aligning material) is filled in the openings. The sidewall profiles of the openings formed by multi-stage lithography and etching processes may be bamboo-shaped.

Referring to FIG. 2A, an upper part UP of the stacked structure SK1 is formed over the substrate 100. The upper part UP of the stacked structure SK1 includes multiple insulating layers 102 and multiple intermediate layers 104 stacked on each other. The materials of the insulating layers 102 and the intermediate layers 104 of the upper part UP of the stacked structure SK1 are the same as those described above for the materials of the insulating layer 102 and the intermediate layers 104 of the lower part LP of the stacked structure SK1. Thereafter, a hard mask layer HM is formed on the upper part UP of the stacked structure SK1. The hard mask layer HM includes polysilicon, for example.

Figure 2B:
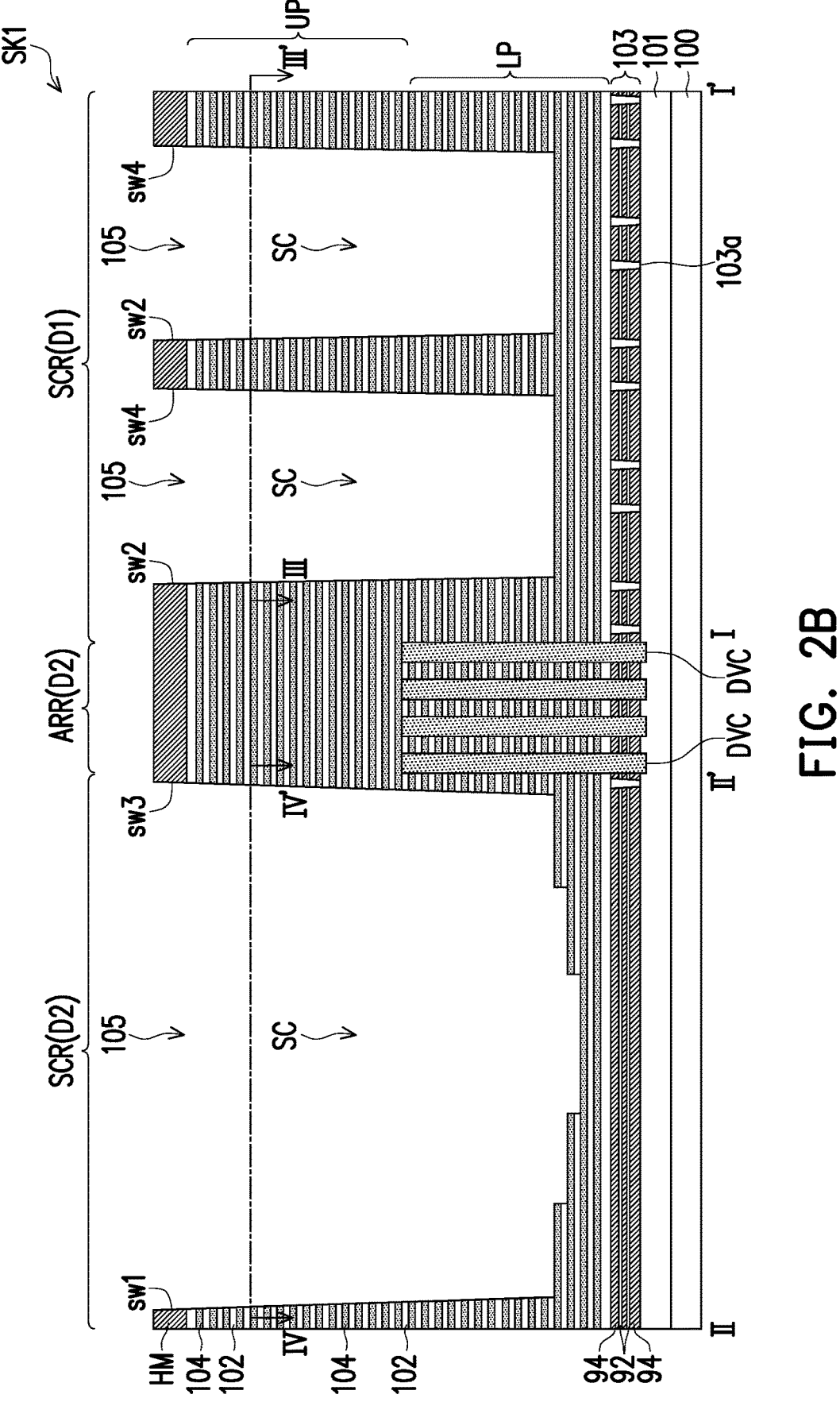

Referring to FIG. 2B, next, the hard mask layer HM is patterned. Thereafter, the intermediate layers 104 and the insulating layer 102 of the stacked structure SK1 are patterned by using the hard mask layer HM as a mask, so as to form an opening 105 and a stepped structure SC. In some embodiments, the opening 105 and the stepped structure SC may be formed through a multi-stage patterning process. The patterning process may include processes such as lithography, etching, and trimming.

Figure 2C:
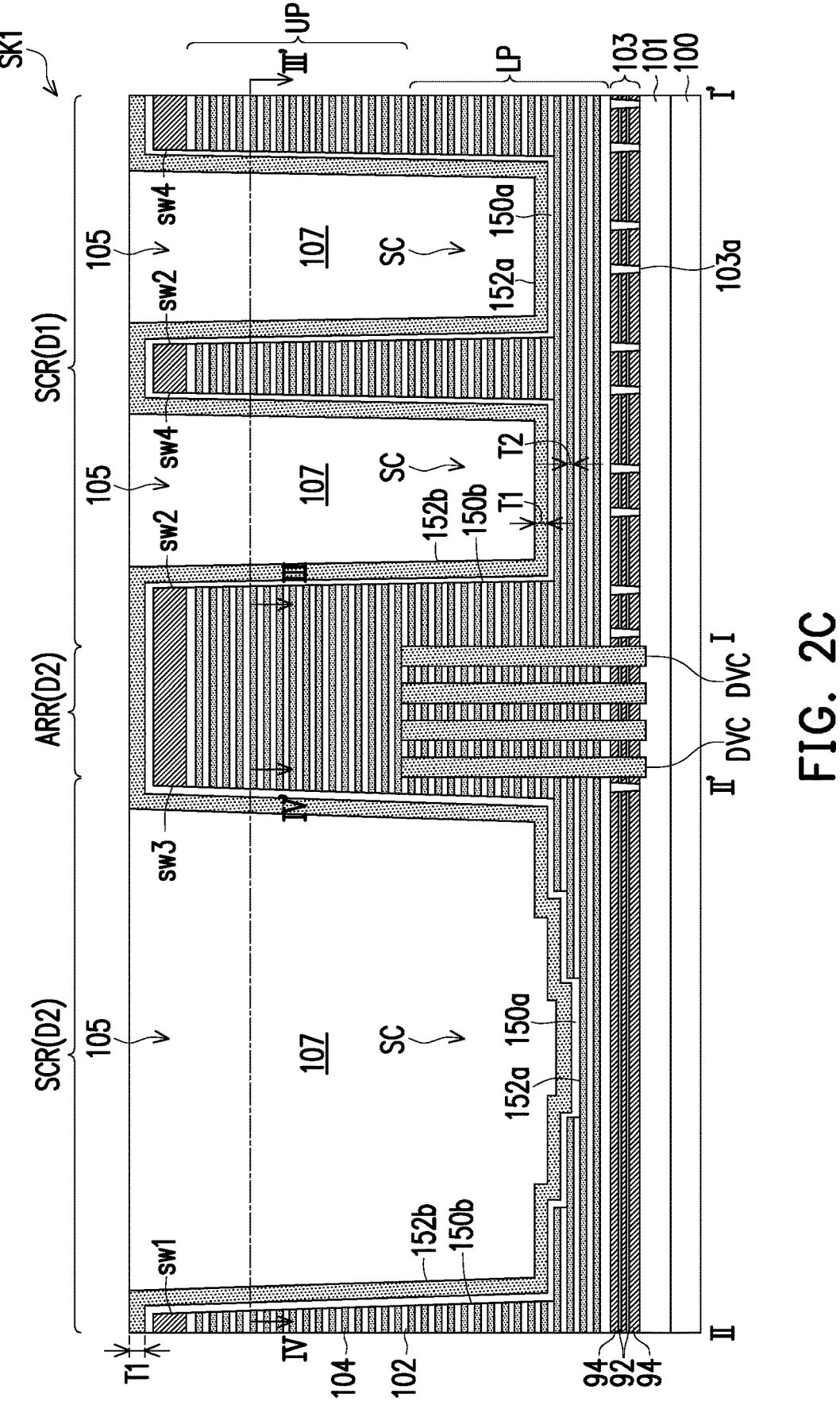
Figure 2D:
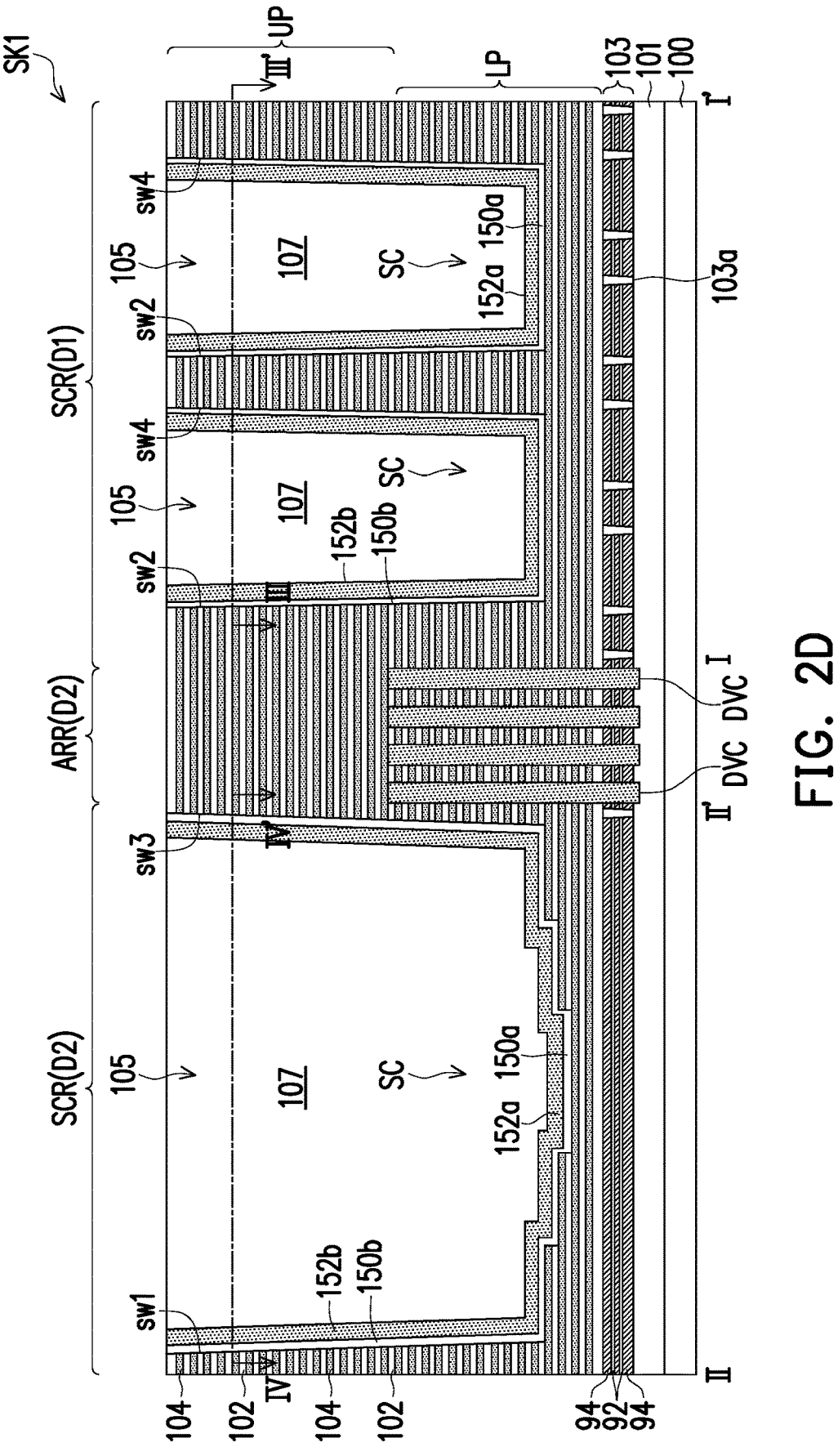

FIG. 1A is a top view along lines III-III' and IV-IV' of FIG. 2B to FIG. 2D.

Referring to FIG. 1A and FIG. 2B, the opening 105 has, for example, a rectangular shape. For example, the opening 105 has four sidewalls sw1, sw2, sw3, and sw4. The sidewall sw1 is connected to the sidewall sw2, the sidewall sw2 is connected to the sidewall sw3, the sidewall sw3 is connected to the sidewall sw4, and the sidewall sw4 is connected to the sidewall sw1. The sidewalls sw1 and sw3 are arranged opposite to each other, and the sidewalls sw2 and sw4 are arranged opposite to each other. The bottom ends of the sidewalls sw1, sw2, sw3, and sw4 are connected to the stepped structure SC at the bottom of the opening 105.

Referring to FIG. 1A and FIG. 2B, a liner layer 150 and a stop layer 152 are formed on the hard mask layer HM and on multiple steps S1 to S10 of the stepped structure SC in the opening 105. The liner layer 150 is a conformal layer covered on the upper surface of the hard mask layer HM, on the surface of the stepped structure SC at the bottom of the opening 105, and on the sidewalls sw1, sw2, sw3, and sw4. The stop layer 152 covers the surface of liner layer 150. The material of the liner layer 150 includes silicon oxide. The material of the stop layer 152 may be the same as or similar to the material of the intermediate layer 104. The material of the stop layer 152 includes silicon nitride. In an embodiment of the disclosure, a thickness T1 of the stop layer 152 is greater than a thickness T2 of the intermediate layer 104. The thickness T1 is, for example, two times or more of the thickness T2.

Referring to FIG. 2B, a dielectric material (not shown) is formed on the stacked structure SK1 and fills in the opening 105. The dielectric material is, for example, silicon oxide. Afterwards, a planarization process, such as a chemical-mechanical polishing process, is performed, and excess insulating material is removed with the hard mask layer HM as a polishing stop layer to form a dielectric layer 107 in the opening 105.

Referring to FIG. 2D, the hard mask layer HM and the liner layer 150 and the stop layer 152 thereon are removed, and the liner layer 150 and the stop layer 152 filling in the opening 105 remain.

Referring to FIG. 1A and FIG. 2C, the liner layer 150 remaining in the opening 105 includes multiple portions 150a and 150b. The stop layer 152 remaining in the opening 105 includes multiple portions 152a and 152b. The portions 150a and 152a cover the surface of the stepped structure SC. The portions 150b and 152b cover the sidewall of the stacked structure SK1 exposed in the opening 105. For simplicity, the portions 150a of the liner layer 150 are also referred to as a liner layer 150a. The portions 150b of the liner layer 150 are also referred to as a liner layer 150b. The portions 152a of the stop layer 152 are also referred to as a stop layer 152a. The portions 152b of the stop layer 152 are also referred to as a stop layer 152b.

Figure 2E:
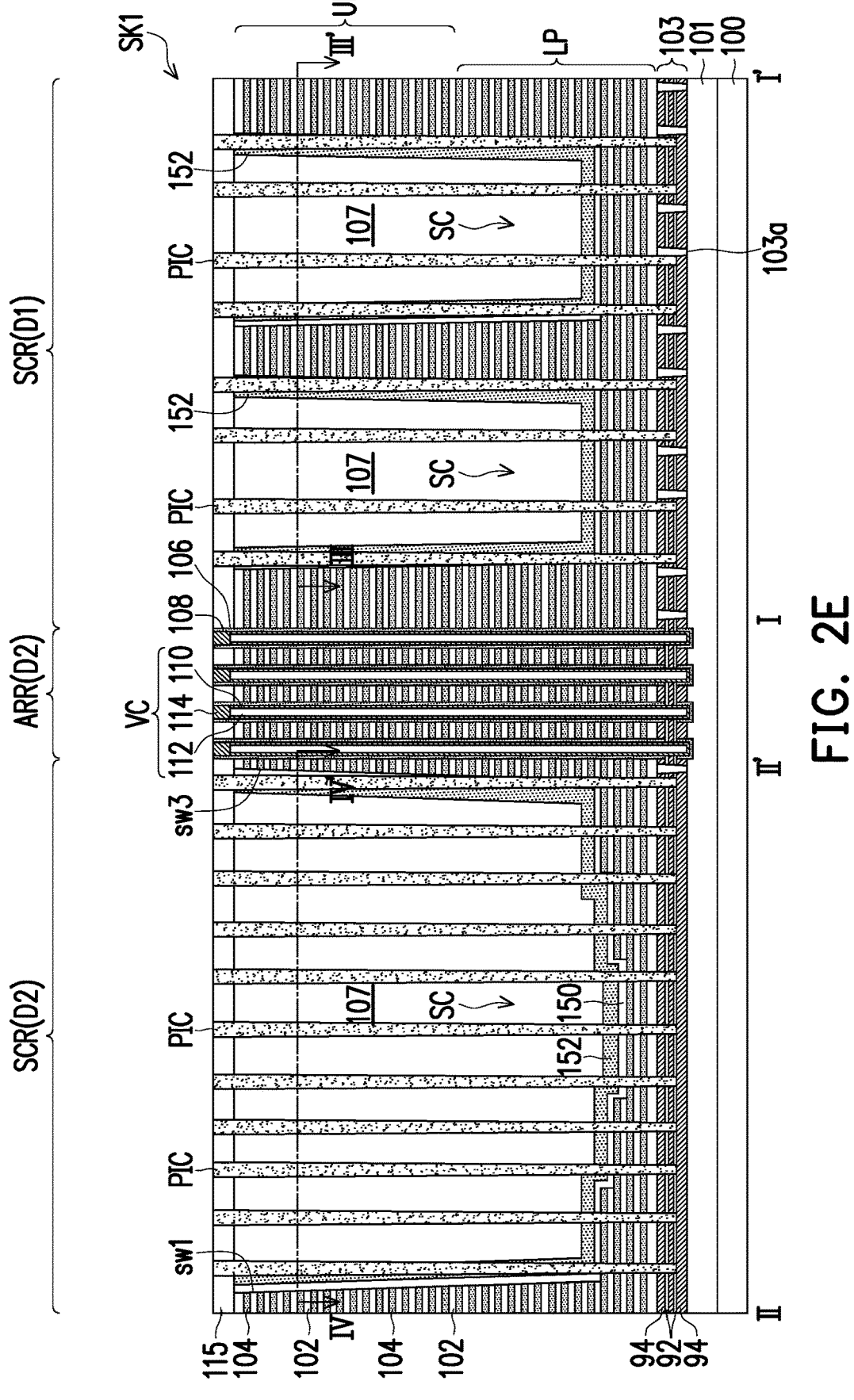

Referring to FIG. 2D and FIG. 2E, afterwards, a patterning process is performed to remove portions of the stacked structure SK1 to form openings (not shown), and the openings expose the dummy pillars DVC. Next, the dummy pillars DVC exposed by the openings are removed to form one or more openings 106 extending through the stacked structure SK1. In an embodiment, the openings 106 may have slightly sloped sidewalls. In another embodiment, the openings 106 may have substantially vertical sidewalls (not shown). In an embodiment, the openings 106 are also called "vertical channel holes". In an embodiment, the openings 106 may be formed by single-stage lithography and etching processes. In another embodiment, the openings 106 may be formed by multi-stage lithography and etching processes. The sidewall profiles of the openings 106 formed by multi-stage lithography and etching processes may be bamboo-shaped.

Referring to FIG. 2E, charge storage structures 108 are then formed in the openings 106. The charge storage structures 108 are in contact with the insulating layers 102 and the intermediate layers 104. In an embodiment, each of the charge storage structures 108 is an oxide/nitride/oxide (ONO) composite layer. The charge storage structure 108 may be a conformal layer formed on the sidewall and the bottom of each of the openings 106. Afterwards, a channel pillar VC is formed in the remaining space of each of the openings 106. Each channel pillar VC may be formed by the following method.

Still referring to FIG. 2E, a channel layer 110 is formed on the inner sidewall and the bottom surface of the charge storage structure 108. In an embodiment, the material of the channel layer 110 includes undoped polysilicon. Next, an insulating pillar (or called "core insulating pillar" in some examples) 112 is formed on the inner surface of the channel layer 110. In an embodiment, the insulating pillar 112 may include silicon oxide. Afterwards, a channel plug 114 is formed in the opening 106, and the channel plug 114 is in contact with the channel layer 110. The channel plug 114 extends from a top surface of the topmost insulating layers 102 to a certain depth of the opening 106. In an embodiment, the material of the channel plug 114 includes a doped semiconductor material, such as doped polysilicon. The channel layer 110, the insulating pillar 112, and the channel plug 114 may be collectively referred to as a channel pillar VC. The channel pillar VC penetrates through the stacked structure SK1 and extends to the stop structure 103, and even extends to the insulating layer 101. The charge storage structure 108 surrounds the vertical outer surface of the channel pillar VC.

Still referring to FIG. 2E, afterwards, a dielectric layer 115 is formed on the stacked structure SK1. Next, multiple support structures PIC are formed. The support structures PIC may extend from the top surface of the dielectric layer 115 through the stacked structure SK1 and the stop layer 103 to prevent the stepped structure SC from collapsing in a subsequent process of removing the intermediate layers 104. The support structure PIC may include an insulating material or may include an insulating material and a conductive material. In other embodiments, the support structure PIC may be formed at the same time as the charge storage structure 108 and the channel pillar VC. The support structures PIC each have the same structure as the combination of the charge storage structure 108 and the channel pillar VC, but the disclosure is not limited thereto. For simplicity, the support structures PIC will not be shown hereinafter.

Figure 2F:
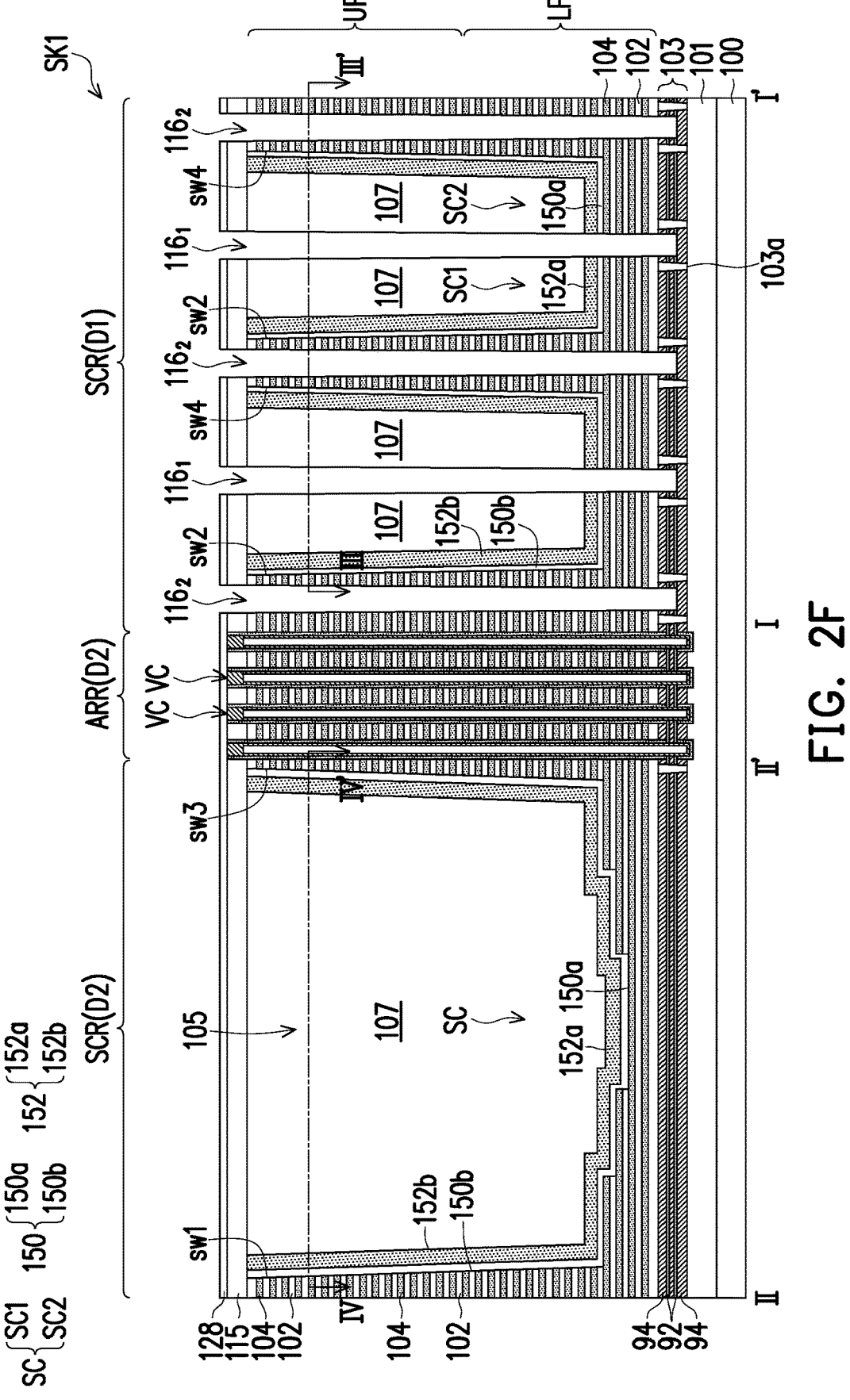

Referring to FIG. 2F, a dielectric layer 128 is formed on the stacked structure SK1. The dielectric layer 128 includes, for example, silicon oxide. Thereafter, a patterning process is performed to form one or more slit trenches 116. The slit trench 116 may have wavy sidewalls, vertical sidewalls (not shown) or slightly inclined sidewalls (not shown). The slit trenches 116 may include slit trenches 1161 and 1162.

Referring to FIG. 2F, the slit trench 1161 extends through the dielectric layers 128, 115, and 107, the portion 152a of the stop layer 152, the portion 150a of the liner layer 150, and the topmost conductive layer 94 of the stop layer 103. The slit trench 1162 extends through the dielectric layers 128 and 115, the stack structure SK1, and the stop layer 103, and divides the stacked structure SK1 into multiple blocks (not shown).

FIG. 1B is a top view along lines III-III' and IV-IV' of FIG. 2F.

Referring to FIG. 1B, the slit trenches 1161 and 1162 extend along a direction D2 and are arranged along a direction D1. The slit trenches 1161 and 1162 are substantially parallel to each other. The slit trench 1161 is located between the slit trenches 1162. The slit trench 1161 extends through the stepped structure SC and divides the stepped structure SC into two portions SC1 and SC2. The slit trench 1162 is located between two stepped structures SC, or between two openings 105.

Referring to FIG. 1B, the slit trench 1161 extends through the sidewalls sw1 and sw3 of the opening 105. That is, the slit trench 1161 intersects with the sidewalls sw1 and sw3. The slit trench 1161 is located between the sidewalls sw2 and sw4 in a same opening 105 and are separated from the stop layer 152b on the sidewalls sw2 and sw4 by distances d3 and d4. In an embodiment of the disclosure, the sidewalls sw1 and sw3 intersecting with the slit trench 1161 may also be referred to as intersecting sidewalls. The sidewalls sw2 and sw4 not intersecting with the slit trench 1161 may also be referred to as non-intersecting sidewalls or parallel sidewalls. It is possible that the parallel sidewalls described herein are actually not completely parallel, but only refer to the sidewalls that do not intersect with the slit trench 1161. In an embodiment of the disclosure, the stop layer 152b and the liner layer 150b on the sidewalls sw1 and sw3 intersecting with the slit trench 1161 and the stop layer 152a and the liner layer 150a on the bottom surface are exposed by the slit trench 1161. The stop layer 152b and the liner layer 150b on the sidewalls sw2 and sw4 not intersecting with the slit trench 1161 are not exposed by the slit trench 1161. The slit trench 1162 is located between the sidewalls sw2 and sw4 of two adjacent openings 105, and does not intersect with any sidewall of the opening 105 and are separated from the stop layer 152b on the sidewalls sw2 and sw4 by distances d5 and d6. The distances d5 and d6 are less than the distances d3 and d4.

Figure 2G:
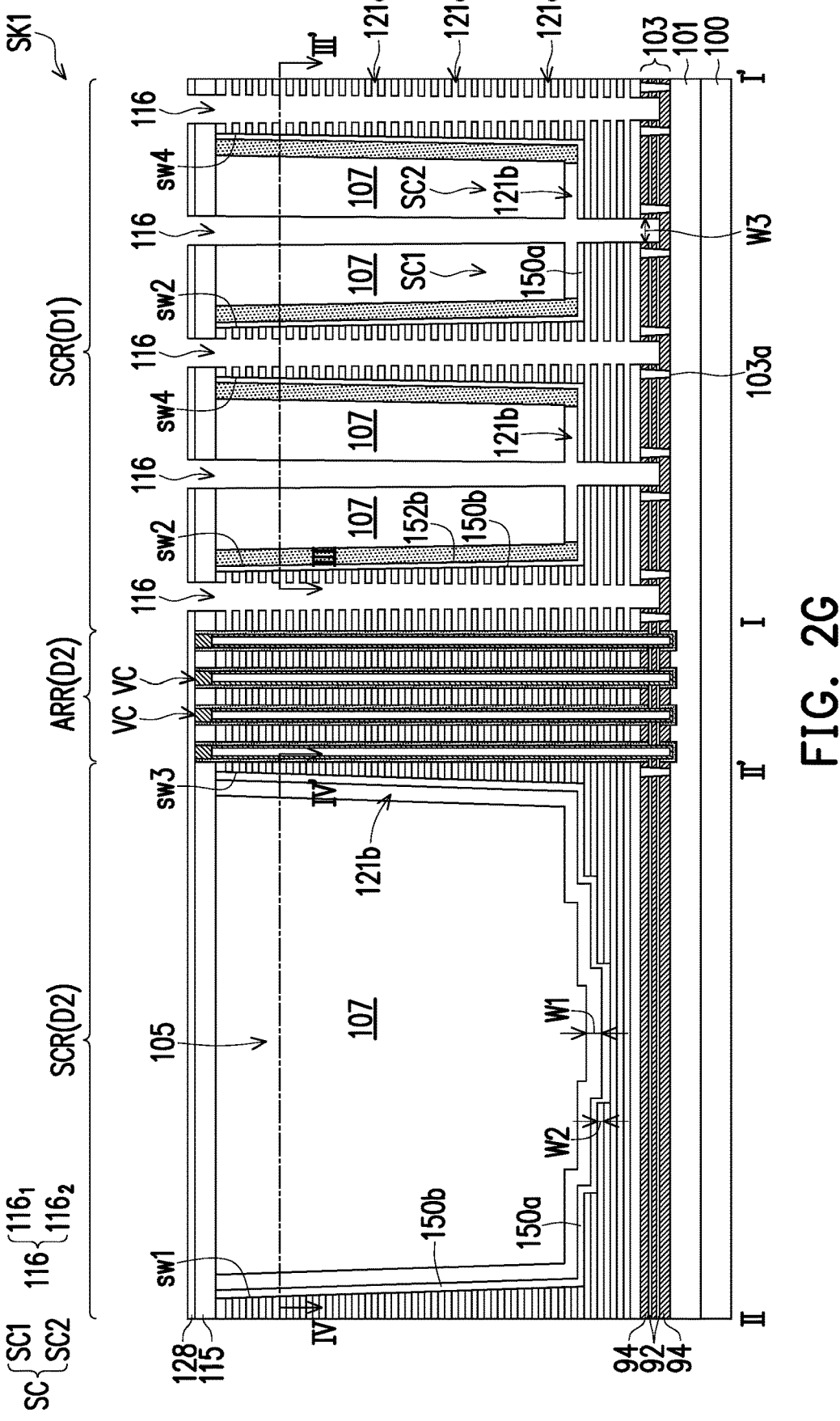
Figure 2H:
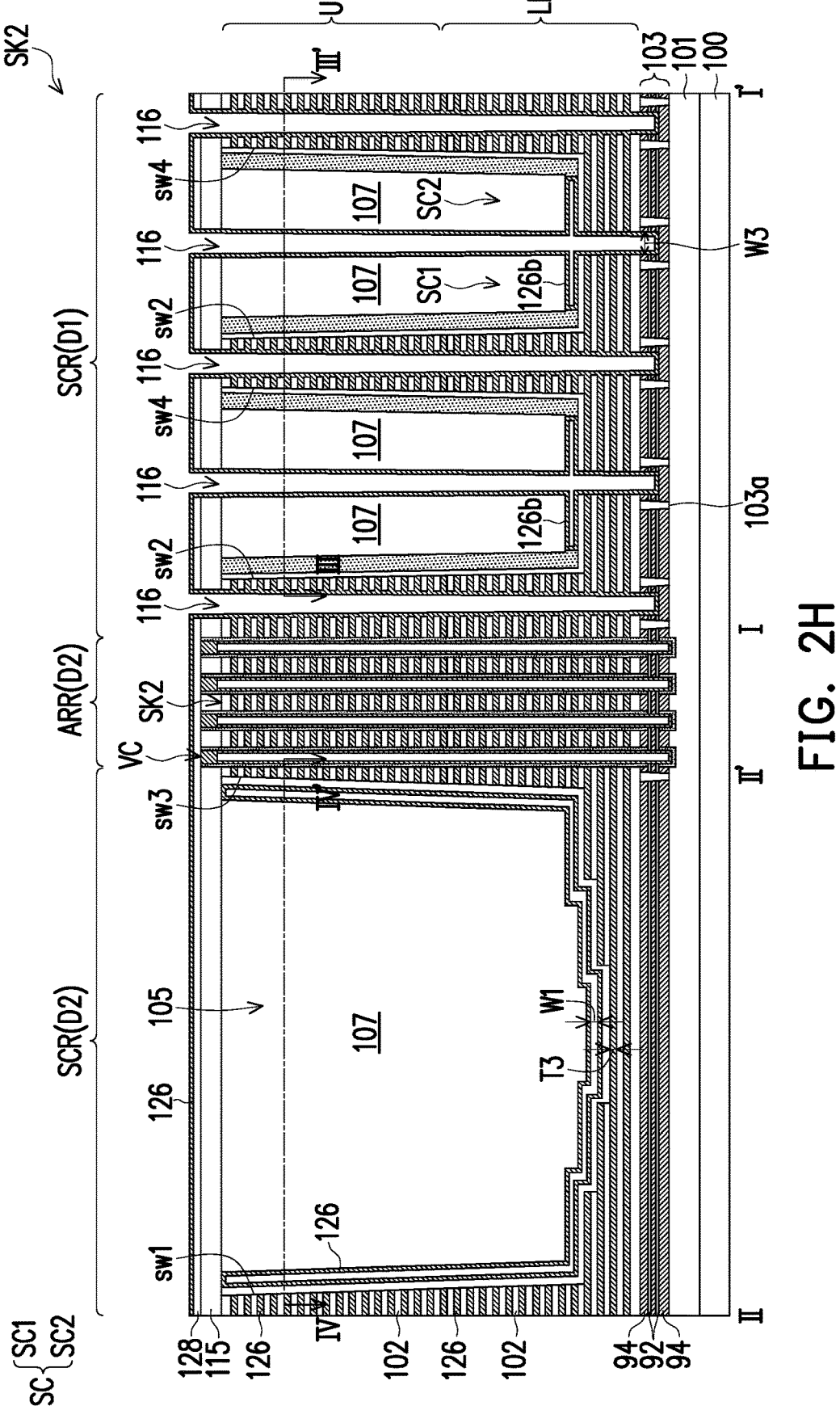

Next, referring to FIG. 2F to FIG. 2H, a gate replacement process is performed to replace part of the intermediate layers 104 with conductive layers 126, and replace part of the stop layers 152 with conductive layers 126. First, referring to FIGS. 2F and 2G, a selective etching process is performed to bring an etchant into contact with the intermediate layers 104 of the stacked structure SK1 on two sides through the slit trench 116. Accordingly, part of the intermediate layers 104 is removed to form multiple horizontal openings 121a, leaving the intermediate layers 104 in the peripheral region (shown in FIG. 2R). The selective etching process may be an isotropic etching process, such as a wet etching process. The etchant used in the wet etching process is, for example, hot phosphoric acid.

FIG. 1C is a top view along lines III-III' and IV-IV' of FIG. 2G.

Referring to FIG. 1B, FIG. 1C and FIG. 2G, in the selective etching process, part of the stop layer 152 exposed in the slit trench 1161 is also in contact with the etchant and is partially removed. In the example of the disclosure, the stop layer 152b on the sidewalls sw1 and sw3 of the opening 105 and the stop layer 152a on the bottom surface of the opening 105 are in contact with the etchant and are partially removed to form a U-shaped cavity 121b (shown in FIG. 2G). The stop layer 152b on the sidewalls sw2 and sw4 of the opening 105 is not exposed by the slit trenches 1161 and 1162 and is farther away from the slit trench 1161 by distances d3 and d4 and thus does not come into contact with the etchant flowing out from the slit trench 1161 due to the restricted flow path of the etchant. On the other hand, although the stop layer 152b on the sidewalls sw2 and sw4 of the opening 105 is closer to the slit trench 1162 by distances d5 and d6, it does not come into contact with the etchant flowing out from the slit trench 1162 due to the obstruction of the liner layer 150b. Therefore, the stop layer 152b on the sidewalls sw2 and sw4 of the opening 105 remain. In addition, as shown in FIG. 2R, the stop layer 152 in the peripheral region PRR is even farther away from the slit trench 116 and remains as it does not come into contact with the etchant. The stop layer 152 will serve as an etching stop layer in a subsequent process of forming the through via opening OP2, which will be described in detail later.

Referring to FIG. 2G, in the embodiment of the disclosure, since the thickness T1 of the stop layer 152 is greater than the thickness T2 of the intermediate layer 104, after the stop layer 152 and the intermediate layer 104 are partially removed, a width W1 of the U-shaped cavity 121b at the bottom of the opening 105 will be greater than a width W2 of the horizontal opening 121a. In some embodiments, the width W1 of the U-shaped cavity 121b is, for example, two times or more of the width of the horizontal opening 121a. The width W1 of the U-shaped cavity 121b is smaller than a minimum width (e.g., bottom width) W3 of the slit trench 116.

Referring to FIG. 2G and FIG. 2H again, a conductive layer 126 is formed on the dielectric layer 128. The conductive layer 126 is also filled into the slit trench 116, the horizontal opening 121a, and the U-shaped cavity 121b. Each of the conductive layers 126 includes, for example, a barrier layer and a metal layer. In an embodiment, the material of the barrier layer includes titanium (Ti), titanium nitride (TiN), tantalum (Ta), tantalum nitride (TaN), or a combination thereof. The material of the metal layer includes tungsten (W). The portions of the intermediate layers 104 are replaced by the conductive layers 126, thus forming a stacked structure SK2 (or called "second stacked structure" in some examples). The other portions of the intermediate layers 104 remain in the peripheral region PRR as shown in FIG. 2R.

In the embodiment of the disclosure, a thickness T3 of the conductive layer 126 is smaller than the width W1 of the U-shaped cavity 121b at the bottom of the opening 105 (under the dielectric layer 107) and the bottom width W3 of the slit trench 116. The conductive layer 126 can fill up the horizontal opening 121a, but cannot fill up the U-shaped cavity 121b and the slit trench 116.

Figure 2I:
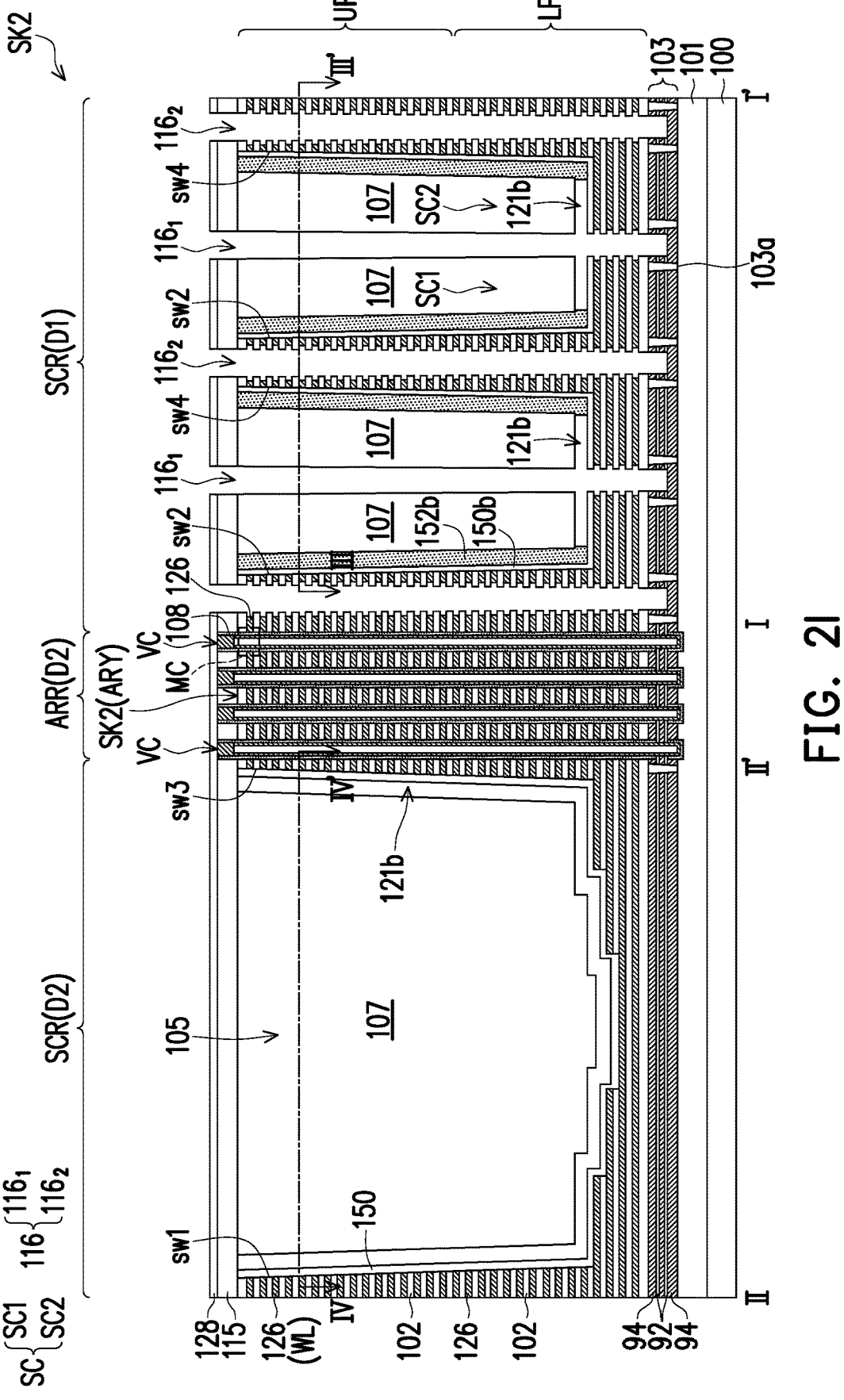

Referring to FIG. 2I, an etching process is performed to remove the conductive layer 126 in the U-shaped cavity 121b and the slit trench 116. In the etching process, the etchant can come into contact with the conductive layer 126 through the remaining space in the slit trench 116 and the U-shaped cavity 121b. Therefore, the conductive layer 126 in the U-shaped cavity 121b and the slit trench 116 can be completely removed. The conductive layer 126 in the horizontal opening 121a remains to serve as a gate layer or a word line WL. Multiple conductive layers 126 and multiple insulating layers 102 are alternately stacked to form a stacked structure SK2.

Figure 2J:
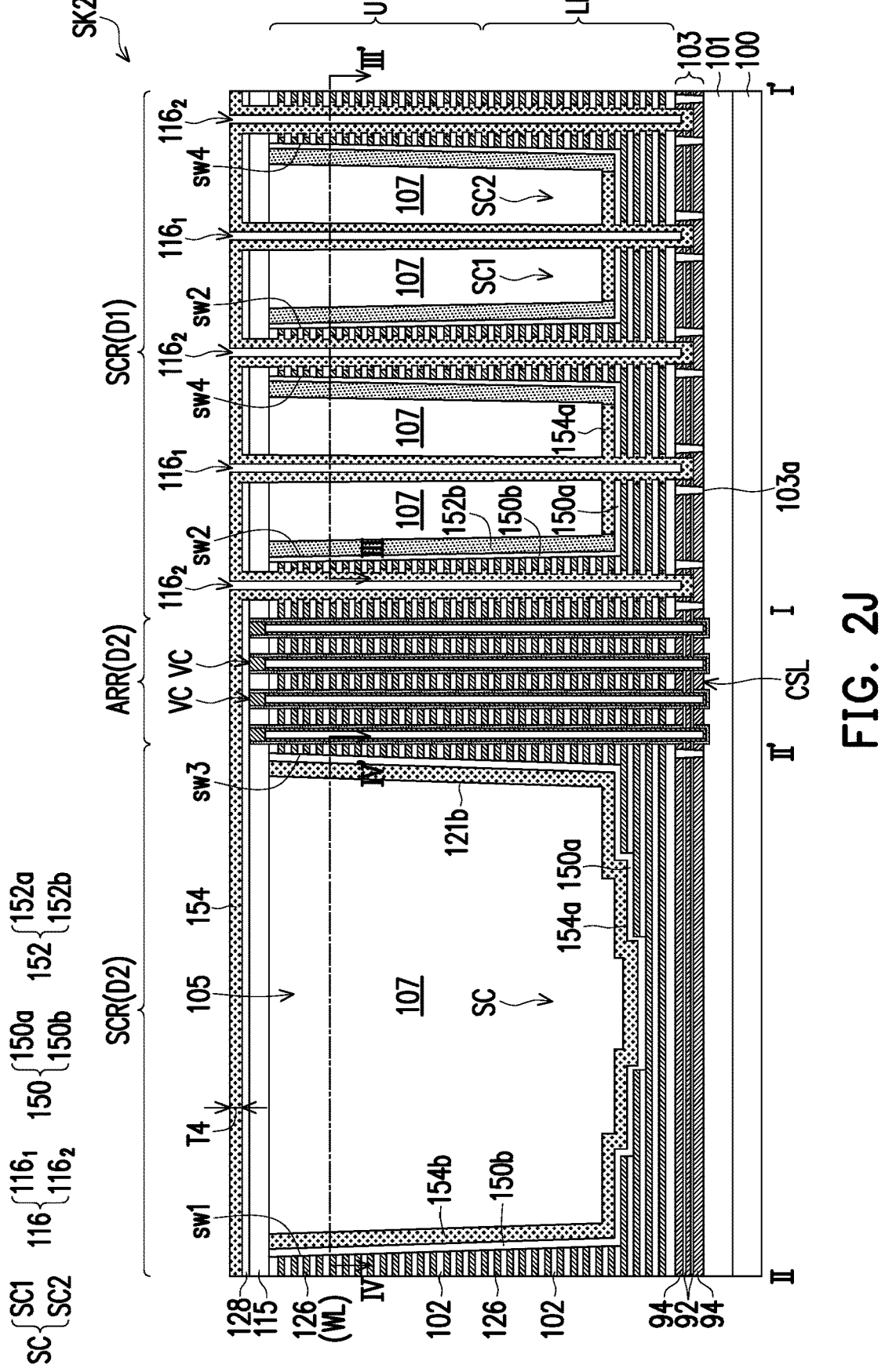

Referring to FIG. 2J, a stop layer 154 is formed on the dielectric layer 128. The stop layer 154 also fills into the U-shaped cavity 121b and the slit trench 116. The stop layer 154 can fill up the U-shaped cavity 121b but does not fill up the slit trench 116. The stop layer 154 includes a different material from the dielectric layer 107. The stop layer 154 may be one layer or multiple layers. The stop layer 154 may include an insulating material, a conductive material, or a combination thereof, which will be described in detail later.

Figure 2K:
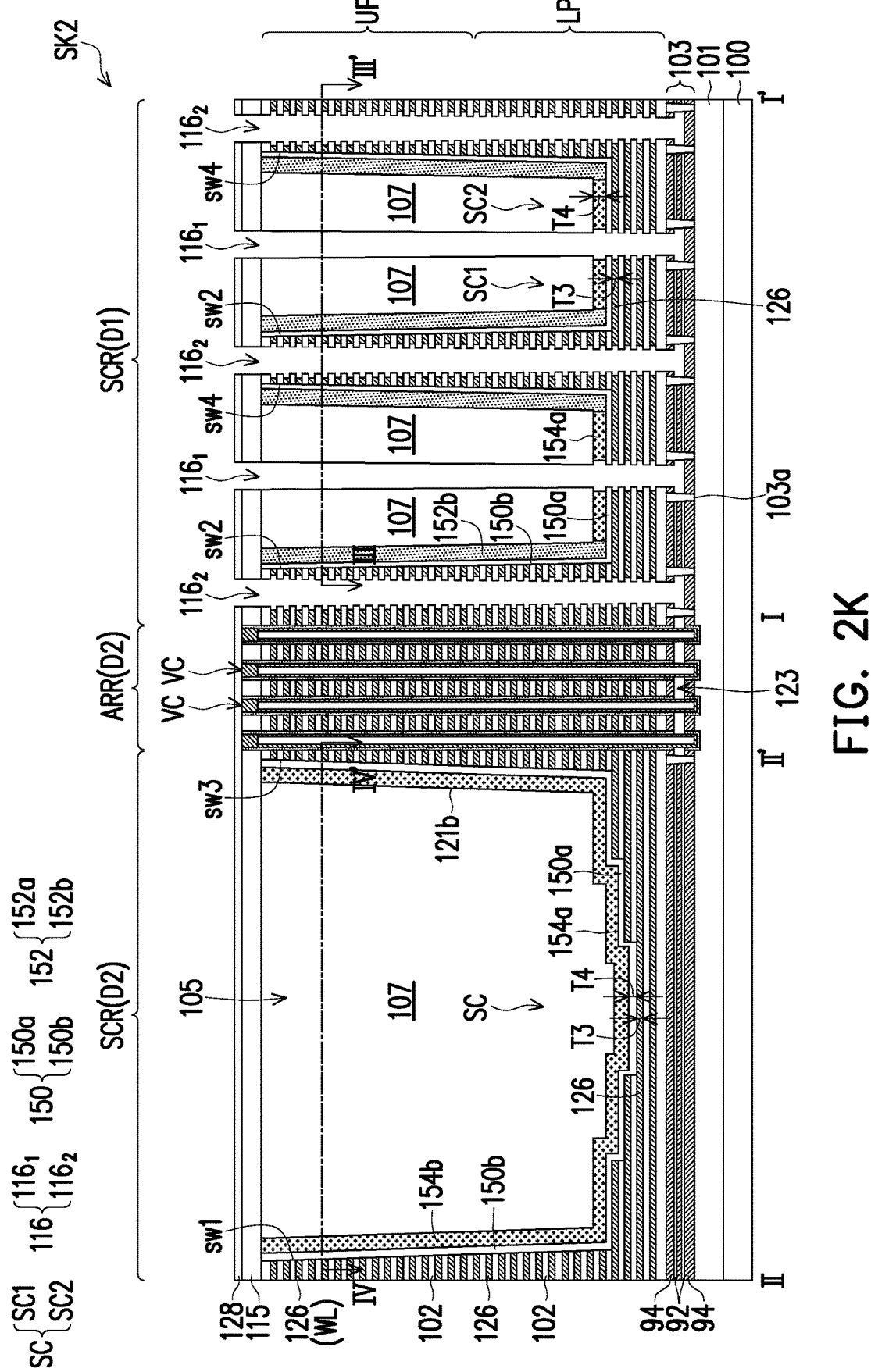

Referring to FIG. 2K, an etching process is performed to remove all the stop layer 154 on the dielectric layer 128 and in the slit trench 116 and expose the top surface of the dielectric layer 128 and the sidewall and the bottom surface of the slit trench 116. The stop layer 154 in the U-shaped cavity 121b remains. The stop layer 154 is located between the dielectric layer 107 and the liner layer 150.

The stop layer 154 remaining in the U-shaped cavity 121b includes multiple portions 154a and 154b. For simplicity, the portions 154a of the stop layer 154 are also referred to as a stop layer 154a. The portions 154b of the stop layer 154 are also referred to as a stop layer 154b. The stop layers 154a cover the surface of the stepped structure SC. The stop layers 154b cover the sidewalls of the dielectric layer 107. The sidewall of the stop layer 154 below the dielectric layer 107 is connected to the stop layer 152b. The liner layer 150a and the stop layer 154a extend continuously to cover multiple steps of the stepped structure SC.

FIG. 1D is a top view along lines III-III' and IV-IV' of FIG. 2I, FIG. 2K, and FIG. 2L to FIG. 2O.

Referring to FIG. 1D and FIG. 2K, the opening 105 includes therein the dielectric layer 107, the liner layer 150, the stop layer 152b, and the stop layer 154. The stop layer 152b is located between the sidewall sw2 of the opening 105 and the sidewall of the dielectric layer 107. The stop layer 154b is located between the sidewall sw1 of the opening 105 and the sidewall of the dielectric layer 107. The stop layer 154b is further located between the sidewall sw3 of the opening 105 and the sidewall of the dielectric layer 107. The stop layer 154a is located between the bottom of the opening 105 and the stepped structure SC. The liner layer 150b is on the sidewalls sw1 to sw4 of the opening 105 and surrounds the stop layer 152b and the sidewall of the stop layer 154b. The liner layer 150a is located at the bottom of the opening 105 and between the stop layer 154a and the stepped structure SC.

Referring to FIG. 2K, an etching process is then performed to increase the depth of the slit trench 116 and partially remove the middle conductive layer 94 and the insulating layer 92 above and below the conductive layer 94 in the stop structure 103 to form a horizontal opening 123.

Figure 2L:
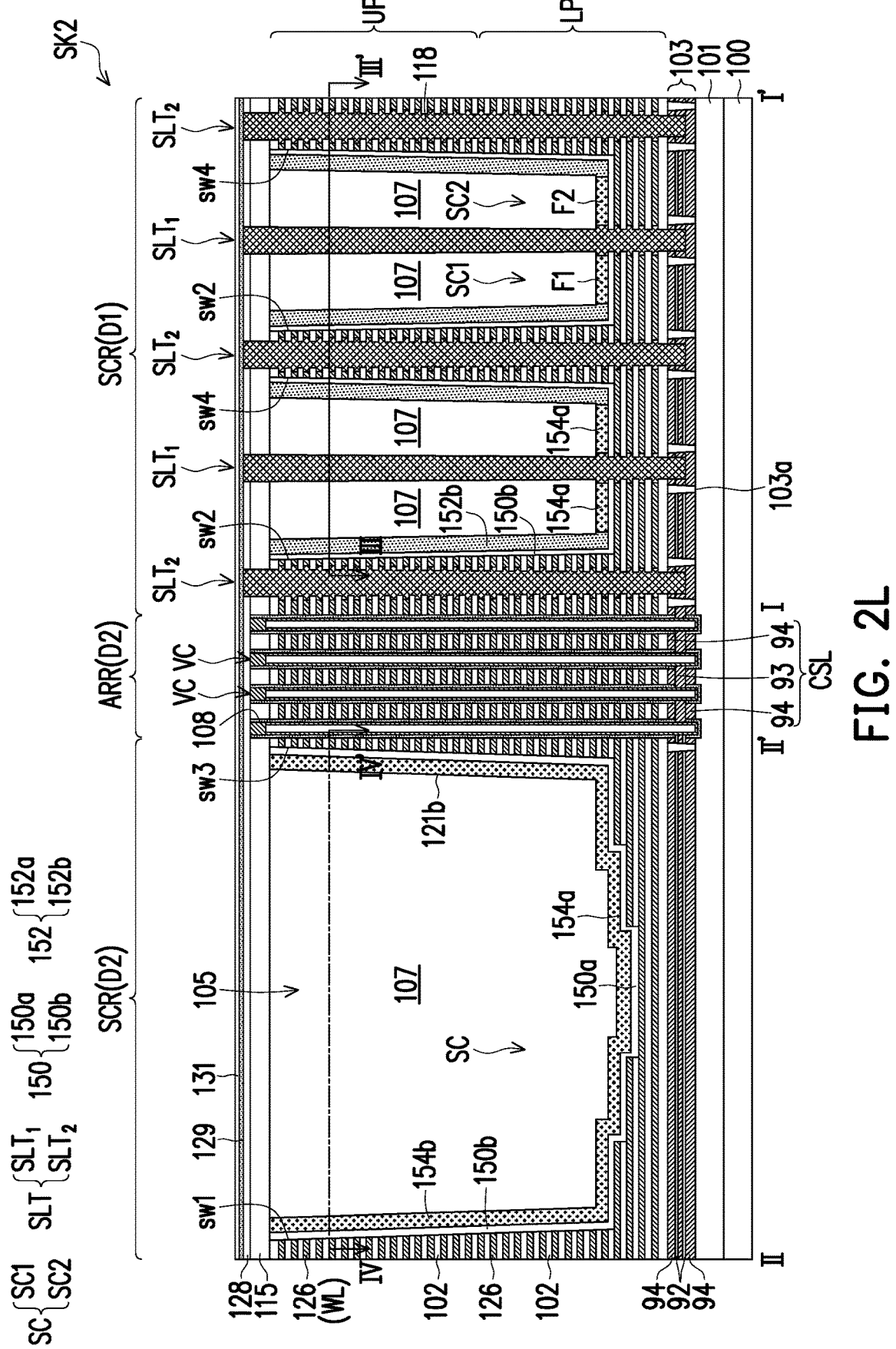

Referring to FIG. 2L, the conductive layer 93 is formed in the horizontal opening 123. The conductive layer 93 in the horizontal opening 123 may form a common source line CSL with the conductive layers 94. The common source line CSL is electrically connected to multiple channel pillars VC. The conductive layer 93 includes, for example, doped polysilicon. Next, a filling layer 118 is formed in the space of the slit trench 116 to form a separation wall SLT. The filling layer 118 may include a different material than the stop layers 152 and 154. The filling layer 118 includes an insulating material, such as silicon oxide. The separation wall SLT may include separation walls $SLT_1$ and $SLT_2$. The separation walls $SLT_1$ and $SLT_2$ are electrically insulated from each other.

Referring to FIG. 1D and FIG. 2L, the separation wall $SLT_1$ extends through the stepped structure SC in the opening 105. The separation wall $SLT_1$ is located between two columns (C1 and C2) of conductive plugs COA to be formed later, extends through the dielectric layer 107, the portion 154a of the stop layer 154, the liner layer 150, and the stepped structure SC, and divides the portion 154a of the stop layer 154 into multiple sub-portions F1 and F2.

Referring to FIG. 1D, the separation wall $SLT_2$ is located between two stepped structures SC, or between two openings 105. The separation wall $SLT_2$ extends through the stacked structure SK2. Two portions 152b of the stop layer 152, the stop layer 154, two columns (C1 and C2) of conductive plugs COA to be formed later, and the separation wall $SLT_1$ are located between two separation walls $SLT_2$.

Referring to FIG. 2L, thereafter, a stop layer 129 and a dielectric layer 131 are formed on the dielectric layer 128. The stop layer 129 includes, for example, silicon nitride. The dielectric layer 131 includes, for example, silicon oxide.

Figure 2M:
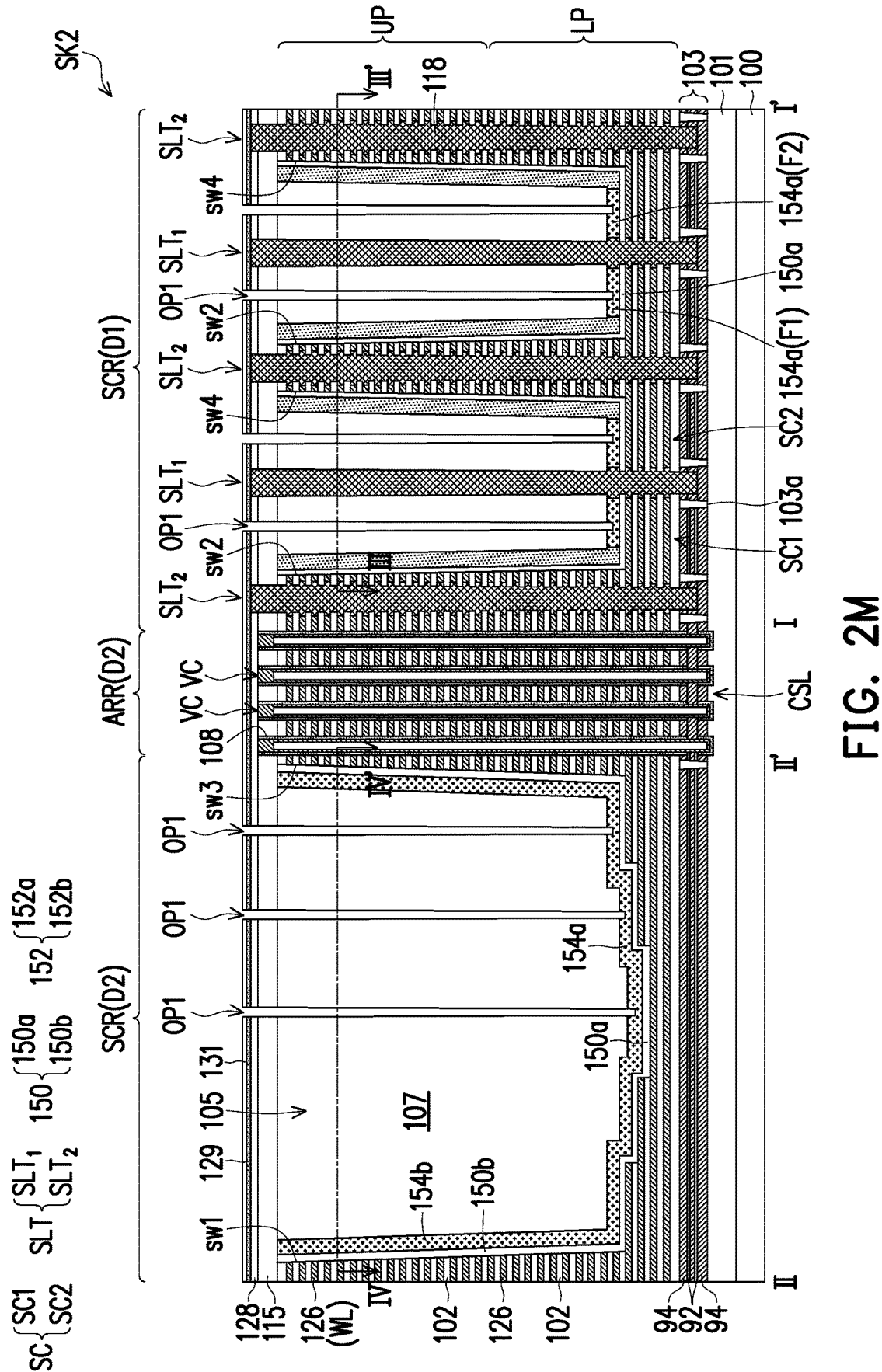
Figure 2N:
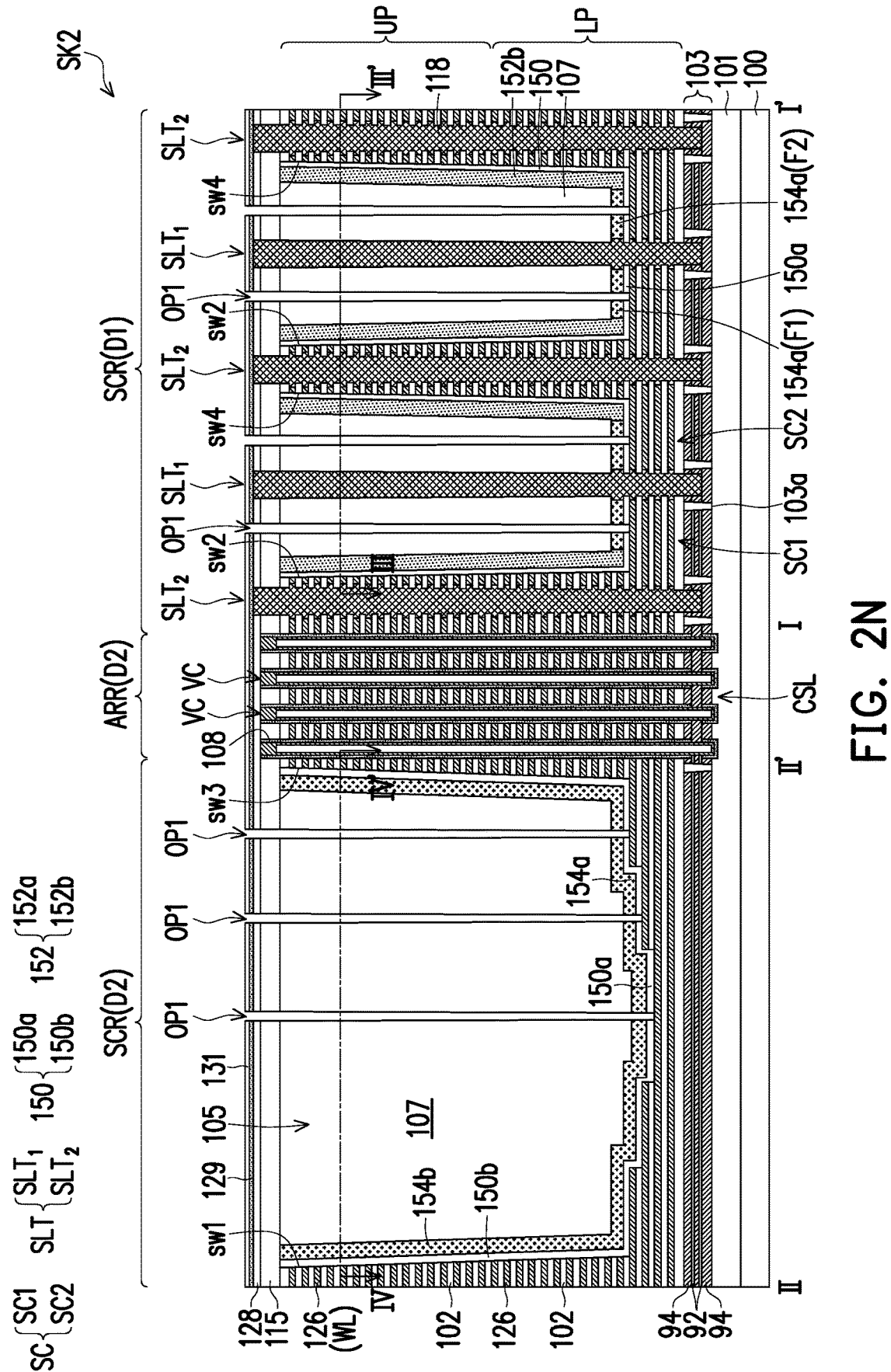
Figure 20:
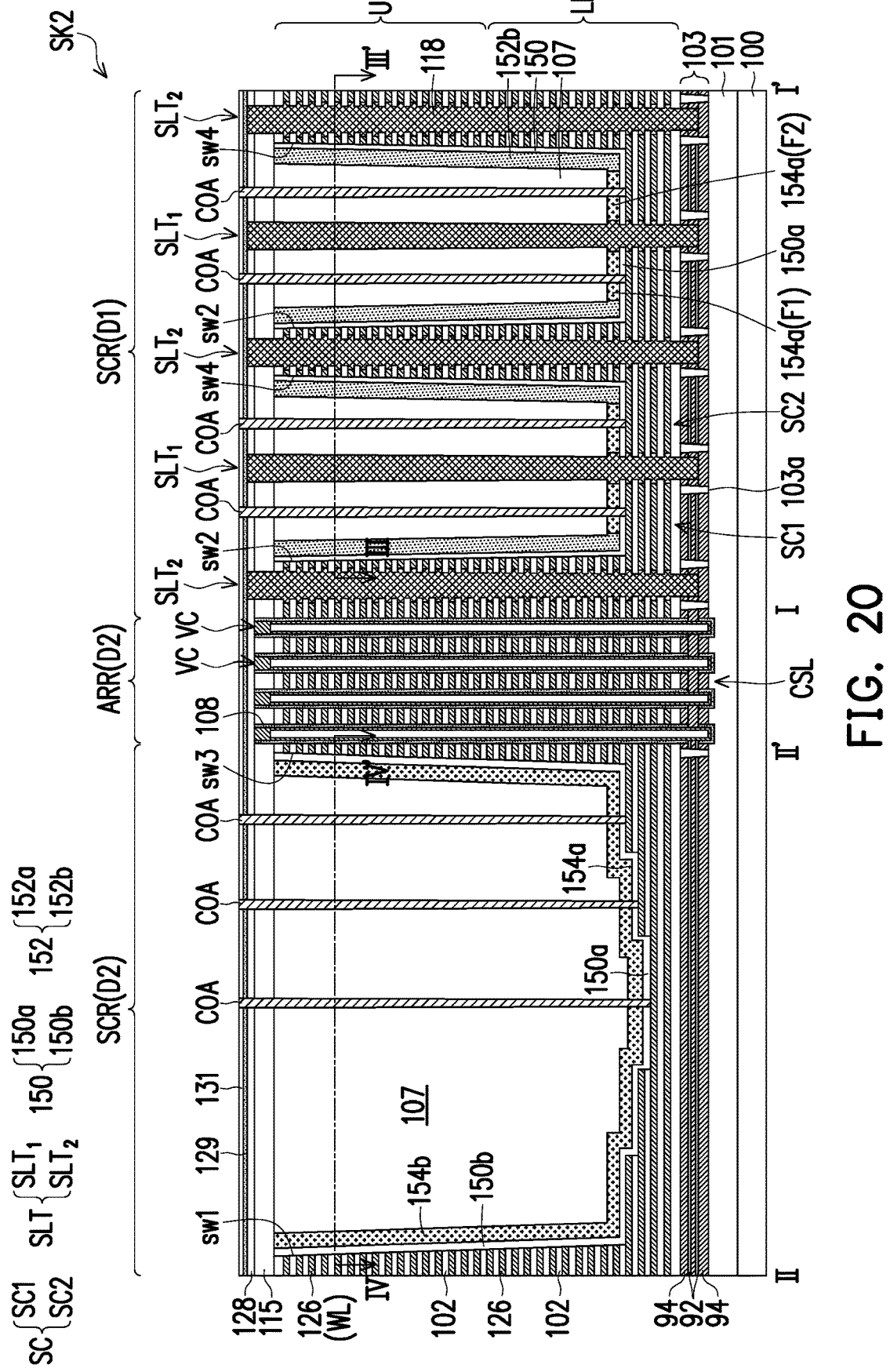

Referring to FIG. 2M to FIG. 2O, then, multiple conductive plugs COA are formed in the staircase region SCR to respectively electrically connect the conductive layer 126 and the channel pillar VC. Also, referring to FIG. 2R, multiple through vias TV are formed in the peripheral region PRR. In this embodiment, referring to FIG. 2M, the formation method of the conductive plug COA and the through via TV may include firstly performing lithography and etching processes to form multiple conductive plug holes OP1 and multiple through via openings OP2. In an embodiment of the disclosure, the etching process is a multi-stage etching process. Firstly, a first-stage etching process is performed by taking the stop layer 154a in the staircase region SCR and the stop layer 152a in the peripheral region PRR as etching stop layers to form multiple conductive plug holes OP1 exposing the stop layer 154a in the dielectric layer 131 to the dielectric layer 107, and to form multiple through via openings OP2 exposing the stop layer 152a. Since the stop layers 154a and 152a have sufficient thickness and have a sufficient etching selectivity ratio with respect to the dielectric layer 107, even though the dielectric layers 107 in each region of the substrate 100 (staircase region SCR and peripheral region PRR) or at each step of the stepped structure SC have thicknesses that differ significantly, it is still possible to effectively control the multiple conductive plug holes OP1 and through via openings OP2 with considerable depth differences to stop on the stop layer 154a and the stop layer 152a, respectively.

Referring to FIG. 2N and FIG. 2R, a second-stage etching process is performed. The stop layers 152a and 154a may be removed with the liner layer 150a serving as an etching stop layer. Then, a third-stage etching process is performed to remove the liner layer 150 to increase the depths of the conductive plug hole OP1 and the through via opening OP2 until the conductive layer 126 and the conductive layer 93 of the stop structure 103 are exposed. In the second-stage and third-stage etching processes, the stop layers 154 and 152a are removed first, and then the liner layer 150a is removed. Compared to the relatively thick dielectric layer 107 removed in the first-stage etching process, the thickness of the stop layers 154a and 152a and the liner layer 150a in each region of the substrate 100 (staircase region SCR and peripheral region PRR) or at each step of the stepped structure SC is quite small. Therefore, in the second-stage and third-stage etching processes, it is easier to control the depth of the conductive plug hole OP1 and the through via opening OP2 to respectively expose the conductive layer 126 and the conductive layer 93 without etching through the conductive layer 126 or 93.

Referring to FIG. 2O and FIG. 2R, a conductive material is formed on the dielectric layer 131, and the conductive material is further filled into the conductive plug hole OP1 and the through via opening OP2. Afterwards, an etch back or chemical-mechanical polishing process is performed to remove the conductive material on the dielectric layer 131 and form multiple conductive plugs COA and multiple through vias TV in the conductive plug holes OP1 and the through via openings OP2. The conductive material includes, for example, a barrier layer and a metal layer. In an embodiment, the material of the barrier layer includes titanium (Ti), titanium nitride (TiN), tantalum (Ta), tantalum nitride (TaN), or a combination thereof. The material of the metal layer includes tungsten (W). Referring to FIG. 3A, FIG. 3B, and FIG. 2R, according to the method of the embodiment of the disclosure, multiple conductive plugs COA and multiple through vias TV of different depths can be formed.

Figure 2P:
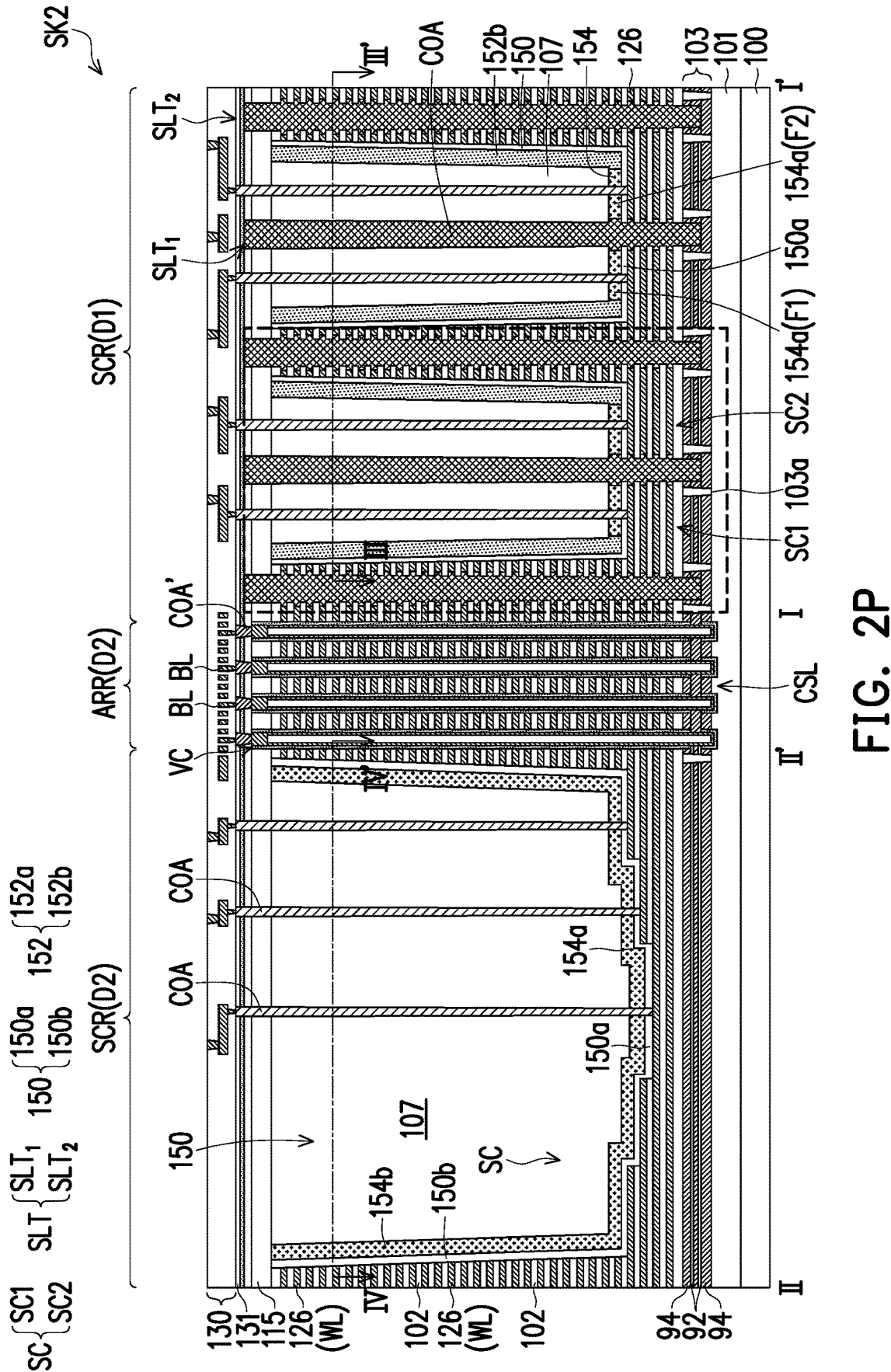
Figure 2Q:
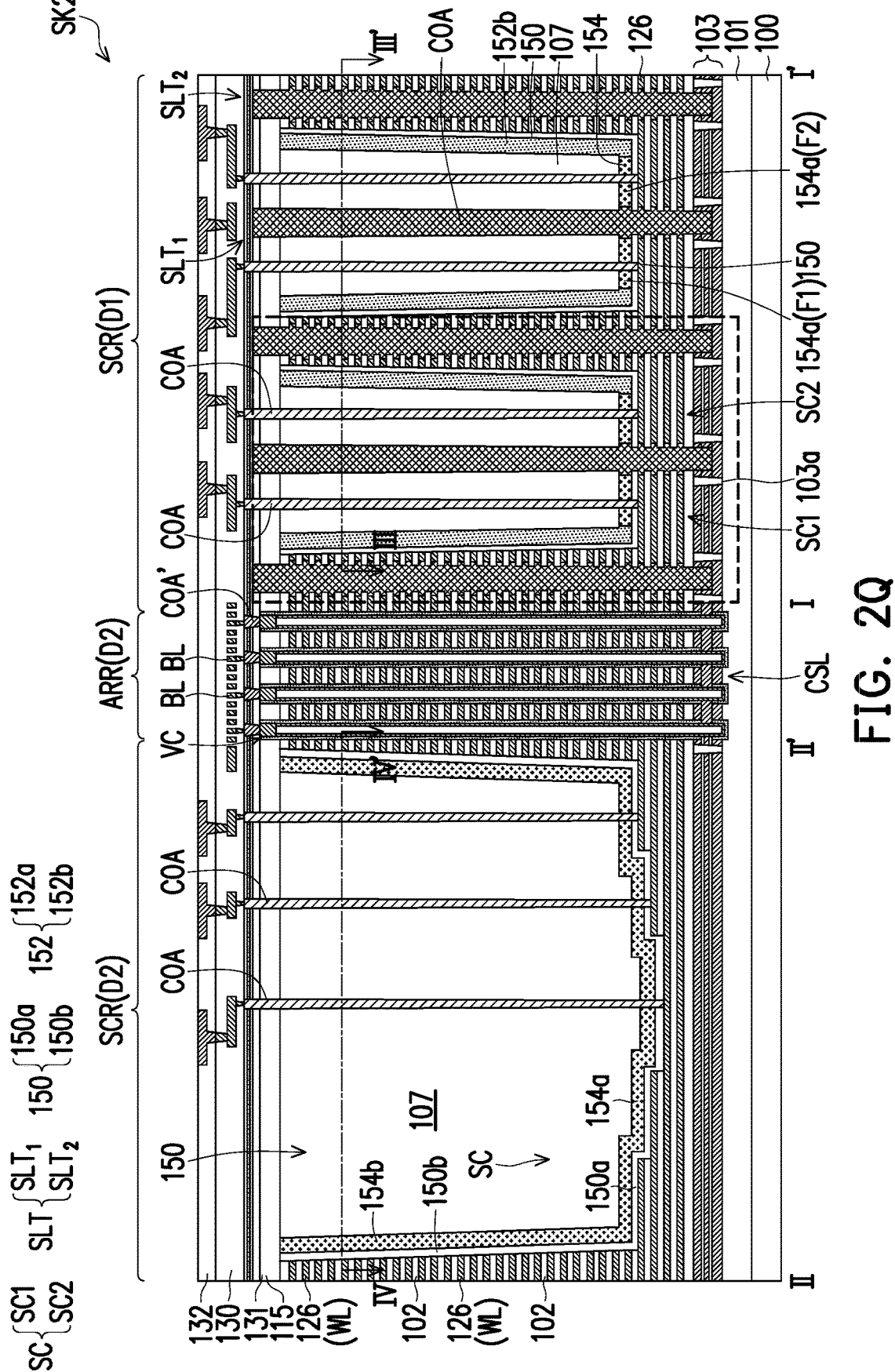
Figure 2R:
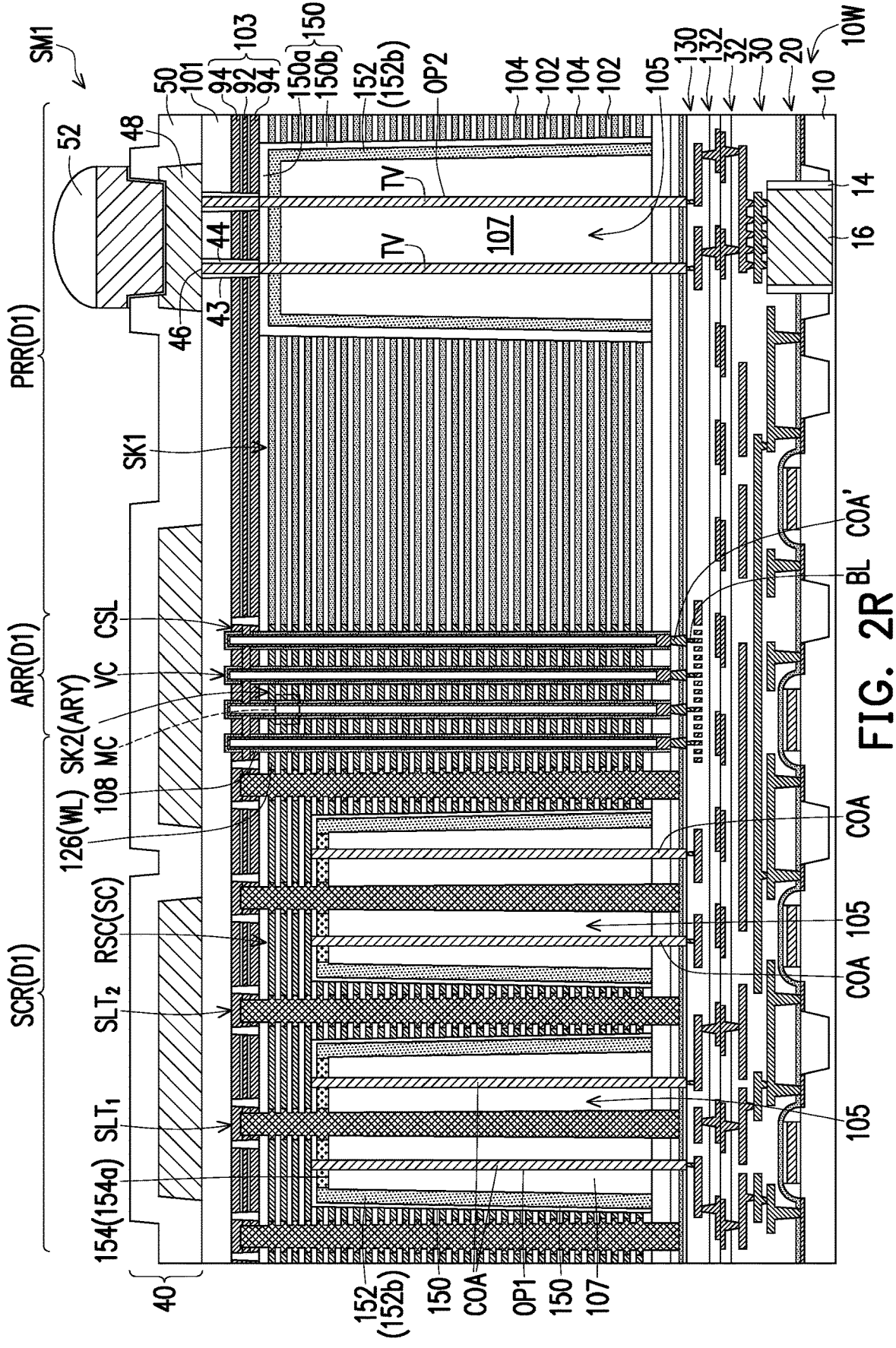
Figures 3A, 3B:
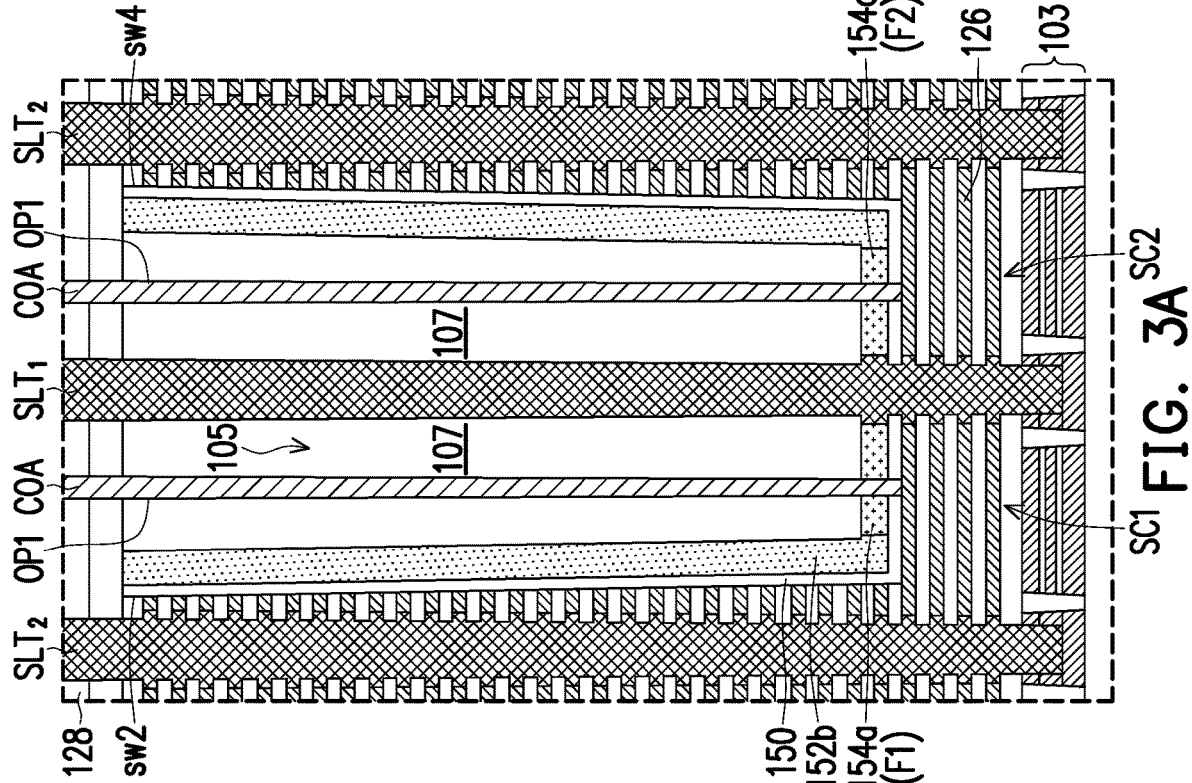
FIG. 3A and FIG. 3B show conductive plugs of different depths.

Referring to FIG. 2P and FIG. 2R, an interconnect structure 130 is formed over the substrate 100. The interconnect structure 130 may include multiple dielectric layers (not shown) and an interconnect (not shown) formed in the multiple dielectric layers. The interconnect includes multiple plugs (not shown), multiple conductive lines (not shown), etc. The dielectric layer separates adjacent conductive lines. The conductive lines may be connected to each other through plugs, and the conductive lines may be connected to the multiple conductive plugs COA and the multiple through vias TV through the multiple plugs. The interconnect structure 130 may be formed according to a single damascene process, a dual damascene process, or any known method. The interconnect structure 130 may include multiple bit lines BL. The multiple bit lines BL may be electrically connected to the channel pillar VC via multiple conductive plugs COA'. The conductive plugs COA' may be formed at the same time as or at different times from when the multiple conductive plugs COA and the multiple through vias TV are formed.

Referring to FIG. 2Q, a bonding structure 132 is formed on the interconnect structure 130. The bonding structure 132 includes a bonding dielectric layer (not shown) and a bonding plug (not shown) and a bonding pad (not shown) embedded in the bonding dielectric layer. The bonding pad may be connected to the conductive wire of the interconnect structure 130 via the bonding plugs. The bonding dielectric layer, the bonding plug, and the bonding pad may be formed according to any known method. As a result, the fabrication of a chip 100W is completed.

Referring to FIG. 2R, the chip 100W is turned over. After the chip 100W is turned over, the stepped structure SC on the substrate 100 becomes a reverse stepped structure RSC. The conductive plug COA is located below the reverse stepped structure RSC.

Next, a bonding process such as a hybrid bonding process is performed. The bonding structure 132 is bonded to the bonding structure 32 of another chip 10W. The chip 10W may include a substrate 10, a device layer 20, an interconnect structure 30, and a bonding structure 32. The substrate 10 may be a semiconductor substrate, such as a silicon-containing substrate. The device layer 20 is formed on the substrate 10. The device layer 20 may include an active device or a passive device. The active device includes, for example, a transistor, a diode, etc. The passive device includes, for example, a capacitor, an inductor, etc. The transistor may be an NMOS transistor, a PMOS transistor, or a CMOS device. The device layer 20 may include a page buffer, a peripheral circuit, a row decoder, and a column decoder. The interconnect structure 30 and the bonding structure 32 may have the same or similar components as the interconnect structure 130 and the bonding structure 132, respectively. In the embodiment of the disclosure, the device layer 20 with a CMOS device and the memory array ARY originally belong to different chips 10W and 100W respectively, and the device layer 20 is bonded to the memory array ARY in a bonding process. This architecture may also be referred to as a CMOS-Bonded-Array (CbA) structure.

In some embodiments, semiconductor through vias (or referred to as silicon through vias) 16 are further formed in the substrate 100 of the chip 10W. The semiconductor through via (silicon through via) 16 is electrically isolated from the substrate 10 by a liner layer 14. The semiconductor through via 16 is electrically connected to the through via TV via the interconnect structure 30, the bonding structures 32 and 132 and the interconnect structure 130. The liner layer 14 includes, for example, silicon oxide. The material of the semiconductor through via (or silicon through via) 16 includes, for example, copper or tungsten.

Referring to FIG. 2R, after the bonding process is performed, the substrate 100 is removed to expose the insulating layer 101. The substrate 100 may be removed by grinding, polishing, or etching. In other embodiments, the substrate 100 is thinned, but a portion of the substrate 100 remains (not shown) to connect to the interconnect structure 130 through the semiconductor through vias (or silicon through vias) formed in the substrate 100.

Referring to FIG. 2R, a back-end process is performed. A liner layer 44, a conductive plug 46, a conductive line 48, and a dielectric layer 50 of the interconnect structure 40 are formed on the insulating layer 101. The conductive plug 46 electrically connects the through via TV and the conductive line 48. The conductive plug 46 is electrically isolated from the conductive layer 94 of the stop structure 103 by the liner layer 44. The interconnect structure 40 may be formed as follows. First, photolithography and etching processes are performed to form a conductive plug opening 43 in the insulating layer 101 and the stop structure 103. Next, a liner layer 44 and a conductive plug 46 are formed in the conductive plug opening 43. The liner layer 44 is formed by, for example, forming a dielectric material on the insulating layer 101 and in the conductive plug opening 43, and then performing anisotropic etching. The conductive plug 46 is formed by, for example, forming a conductive material on the insulating layer 101 and in the conductive plug opening 43, and then performing a chemical-mechanical polishing process or an etch back. The dielectric material includes, for example, silicon nitride or a silicon oxide/silicon nitride/silicon oxide composite layer. The conductive material includes, for example, doped polysilicon. Afterwards, a conductive line 48 and a dielectric layer 50 are formed on the insulating layer 101. The material of the conductive line 48 includes, for example, copper or tungsten. The dielectric layer 50 may be one layer or multiple layers. The material of the dielectric layer 50 may include silicon oxide, silicon oxynitride, silicon nitride, or a combination thereof. The interconnect structure 40 may be electrically connected to the interconnect structures 130 and 30 via the through via TV. In addition to connecting to the through via TV, the interconnect structure 130 may also be electrically connected to the channel pillar VC or the conductive layer 126 (e.g., word line WL) via the conductive plug COA'.

Afterwards, the connector 52 is formed on the conductive line 48. The connector 52 may be a ball grid array (BGA) connector, a solder ball, a metal pillar, a controlled collapse chip connection (C4) bump, a C2 bump, a micro-bump, a bump formed by electroless nickel-electroless palladium-immersion gold technique (ENEPIG), or a similar component. At this time, the fabrication of the memory chip SM1 is completed.

Referring to FIG. 1D and FIG. 2R, in the present embodiment, the alternately stacked multiple conductive layers 126 and multiple insulating layers 102 remain between two adjacent openings 105 in the staircase region SCR. The liner layer 150 and the stop layer 154 not only remain at the bottom of the opening 105 as the etching stop layers, but also remain on the sidewalls sw1 and sw3 of the opening 105 in the staircase region SCR (shown in FIG. 1D). The liner layer 150 and the stop layer 152 remain on the sidewalls sw2 and sw4 of the opening 105 in the staircase region SCR (shown in FIG. 1D). The liner layer 150 and the stop layer 152 remain at the bottom of the opening 105 in the peripheral region PRR to serve as the etching stop layers, but also remain on sidewalls of the opening 105 in the peripheral region PRR (shown in FIG. 2R).

Figure 4A:
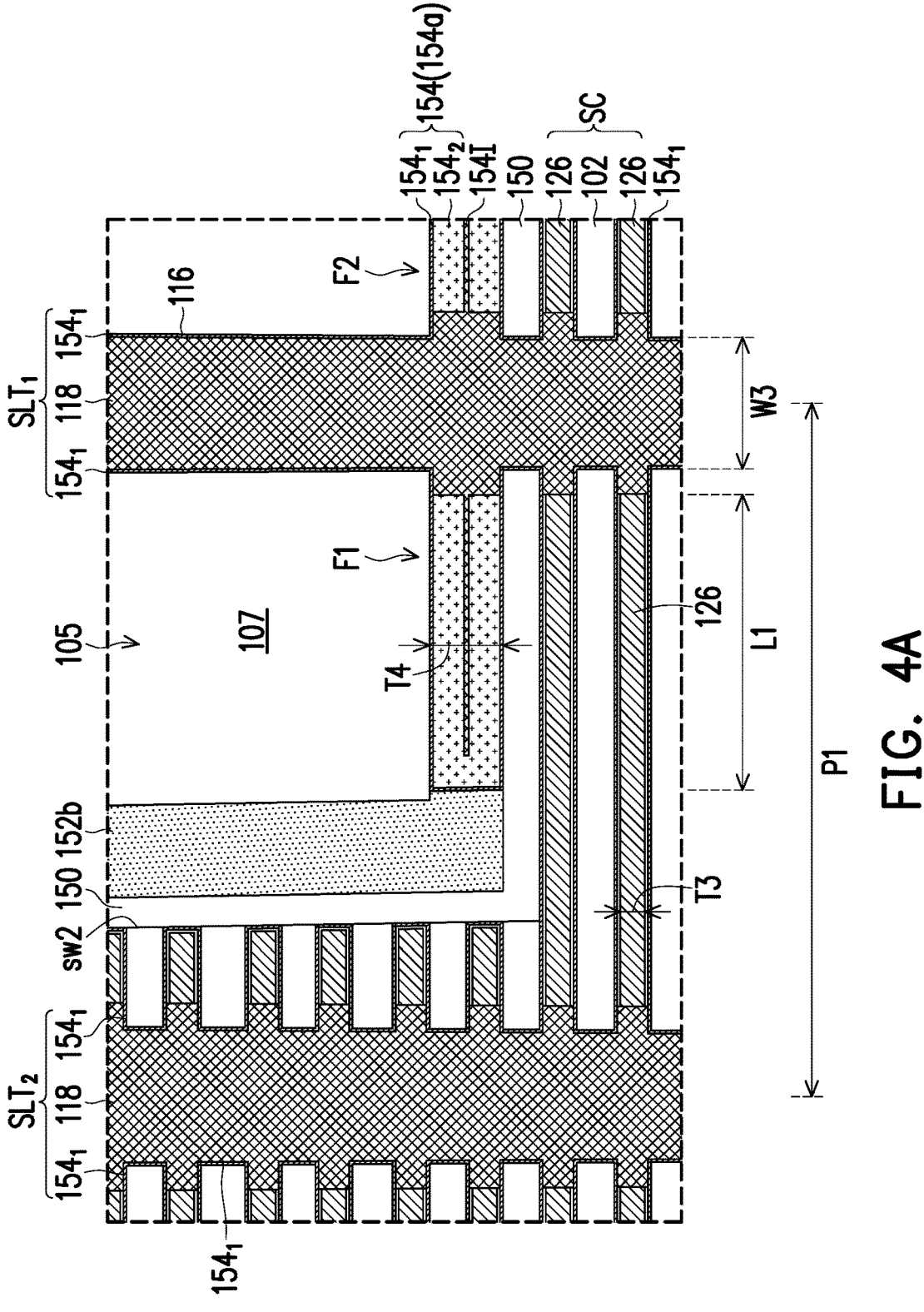
FIG. 4A and FIG. 4B are schematic partial cross-sectional views of multiple stop layers and a liner layer according to an embodiment of the disclosure.
Figure 4B:
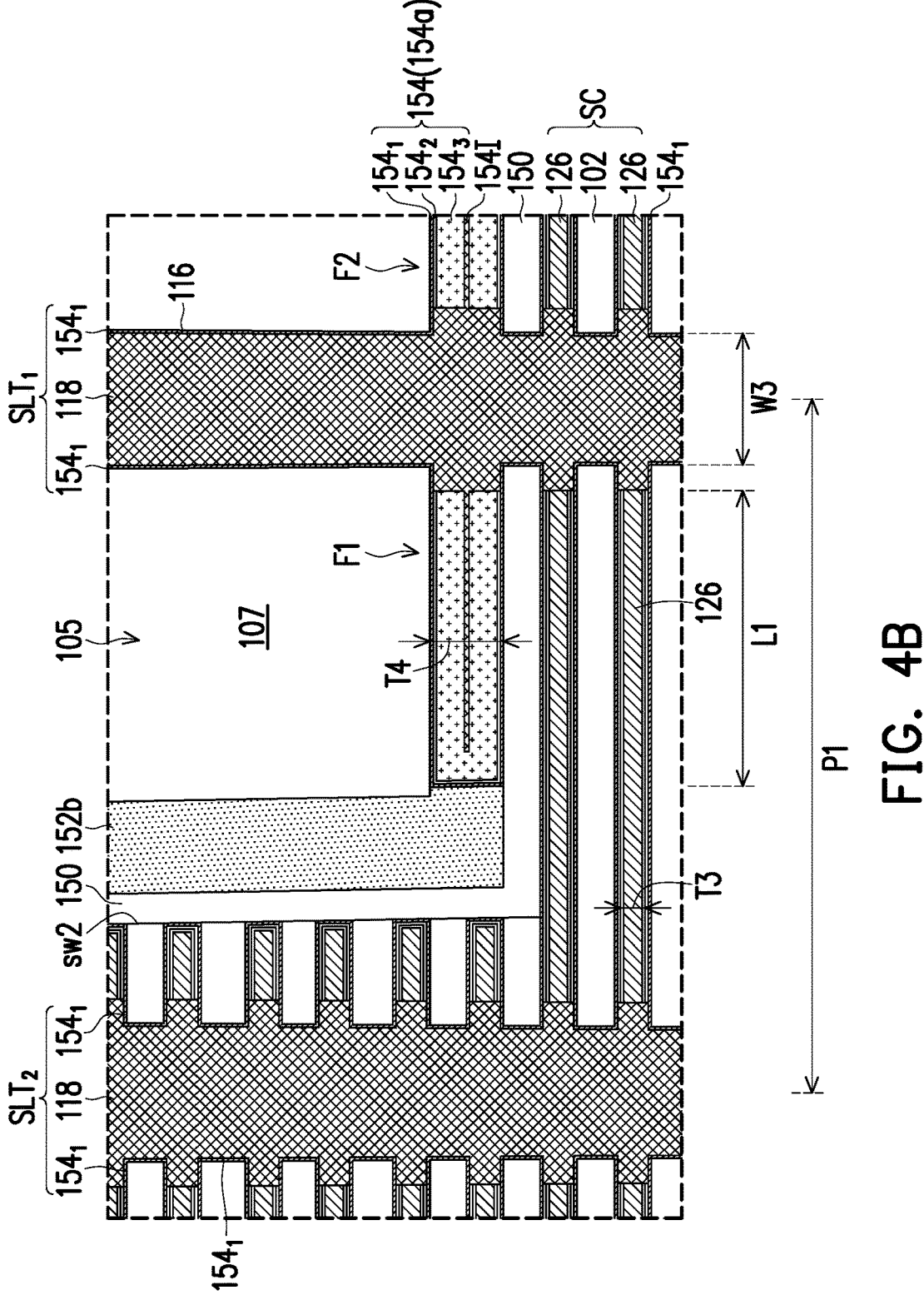

FIG. 4A and FIG. 4B show schematic partial cross-sectional views of multiple stop layers and a liner layer according to an embodiment of the disclosure.

Referring to FIG. 4A and FIG. 4B, the stop layers 154 and 152b, the liner layer 150, and the dielectric layer 107 according to the embodiment of the disclosure are located in the opening 105. The stop layers 154 and 152b are located between the liner layer 150 and the dielectric layer 107. The stop layer 152b is located between the sidewall of the opening 105 and the sidewall of the dielectric layer 107. The stop layer 154b located at the bottom of the opening 105 is buried under the dielectric layer 107, covers the conductive layer 126 of the stepped structure SC, and is laterally adjacent to and connected to the stop layer 152b. The separation wall $SLT_1$ extends through the dielectric layer 107, the stop layer 154, and the liner layer 150 in the opening 105 and the stepped structure SC. The stop layer 154 located at the bottom of the opening 105 is passed through by the separation wall $SLT_1$ and is divided into two sub-portions F1 and F2.

Referring to FIG. 4A and FIG. 4B, a width T4 of the stop layer 154a at the bottom of the opening 105 (under the dielectric layer 107) is greater than the width T3 of the conductive layer 126. In some embodiments, the thickness T4 of the stop layer 154a at the bottom of the opening 105 (under the dielectric layer 107) is two times or more of the thickness T3 of the conductive layer 126. The thickness T4 of the stop layer 154a is smaller than the bottom width W3 of the separation wall SLT. Therefore, in the process of forming the stop layer 154, the stop layer 154 cannot fill up the slit trench 116 (shown in FIG. 2J), which facilitates a subsequent removal process. A length L1 of the sub-portion F1 (or F2) of the stop layer 154a at the bottom of the opening 105 (under the dielectric layer 107) is less than a distance P1 between the separation walls $SLT_1$ and $SLT_2$, and is greater than half of the distance P1.

Referring to FIG. 4A and FIG. 4B, the stop layer 154 may be one layer or multiple layers. The material of the stop layer 154 may include an insulating layer, a conductive layer, or a combination thereof. The insulating layer may include SIN, SiCN, SiCON, a high-k material (e.g., $Al_2O_3$, $Hf_2O_5$), or a combination thereof. The conductive layer may include polysilicon, tungsten, cobalt, copper, tantalum, titanium, tantalum nitride, titanium nitride, metal silicide, or a combination thereof.

Referring to FIG. 4A, for example, the stop layer 154 may include material layers $154_1$ and $154_2$. The material layer $154_1$ covers the upper and lower surfaces of the material layer $154_2$ and a sidewall of the material layer $154_2$ adjacent to the stop layer 152b. The material layer $154_1$ is, for example, a high-k material layer. The high-k material layer may be formed before forming the conductive layer 126, so it also extends to cover the upper and lower surfaces of the conductive layer 126 and the sidewall of the slit trench 116. The material layer $154_2$ may be an insulating filling layer, such as silicon nitride, or a conductive filling layer, such as polysilicon. The material layer $154_2$ may be formed by a deposition method, and an interface 154I is formed in the material layer $154_2$.

Referring to FIG. 4B, for example, the stop layer 154 may include material layers $154_1$, $154_2$, and $154_3$. The material layer $154_1$ covers the outer sidewall of the material layer $154_2$. The material layer $154_2$ is located between material layers $154_1$ and $154_3$. The material layer $154_1$ is, for example, a high-k material layer. The high-k material layer may be formed before forming the conductive layer 126, so it also extends to cover the upper and lower surfaces of the conductive layer 126 and the sidewall of the slit trench 116. The material layer $154_1$ may remain in the slit trench 116 and form the separation wall SLT together with the filling layer 118.

The material layer $154_2$ may be a barrier layer, such as tantalum, titanium, tantalum nitride, titanium nitride, or a combination thereof. The barrier layer may be formed before forming the conductive layer 126, so it also extends to cover the upper and lower surfaces of the conductive layer 126 and the sidewall of the separation wall SLT. The barrier layer covering the upper and lower surfaces of the conductive layer 126 may remain, while the barrier layer on the sidewall of the slit trench 116 is removed. The material layer $154_3$ may be a conducive filling layer. The conductive filling layer includes a metal layer, such as tungsten. The material layer $154_3$ may be formed by a deposition method, and the interface 154I is formed in the material layer $154_3$.

Figure 4C:
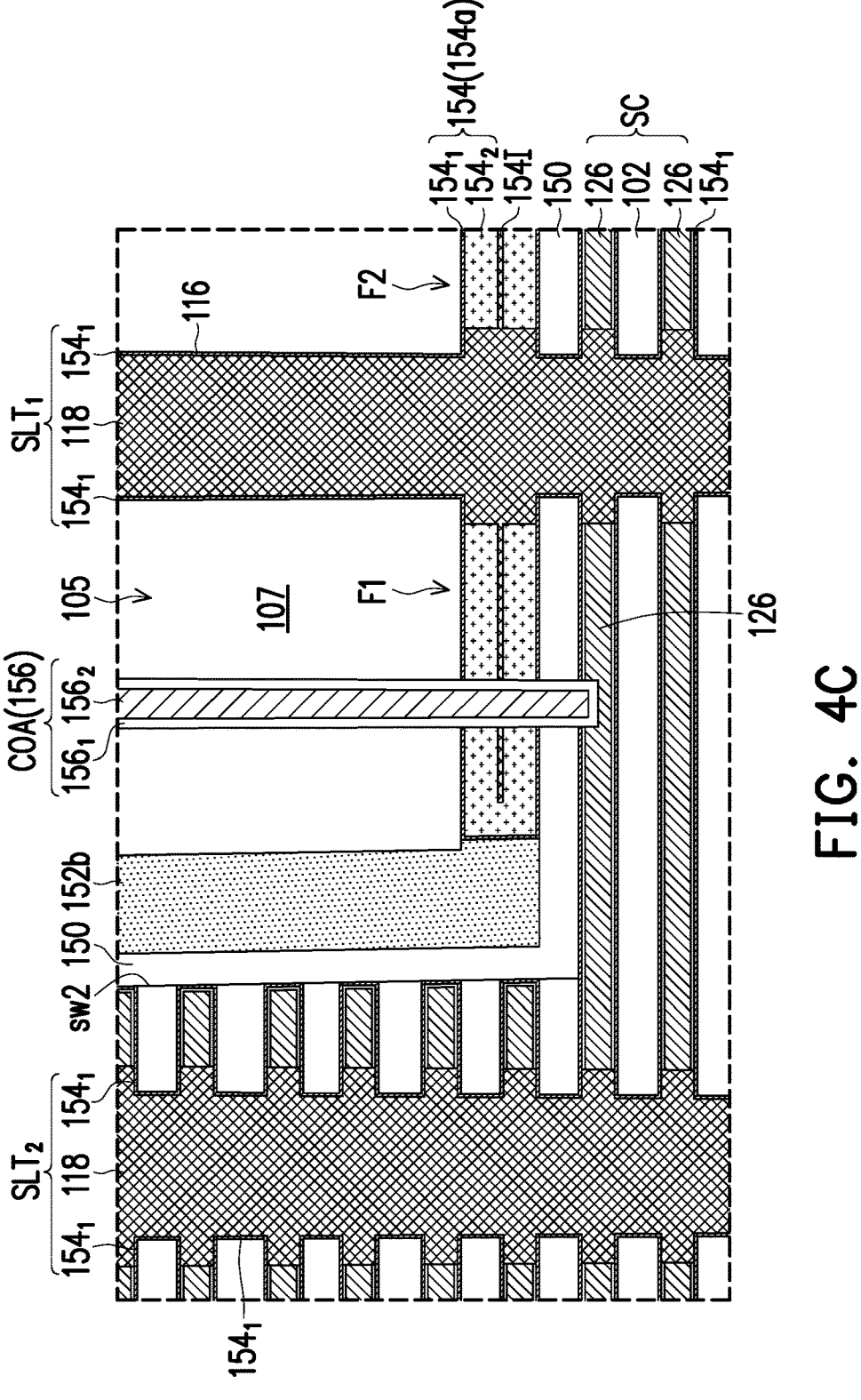
FIG. 4C and FIG. 4D show schematic partial cross-sectional views of a conductive plug extending through the stop layers and the liner layer according to an embodiment of the disclosure.
Figure 4D:
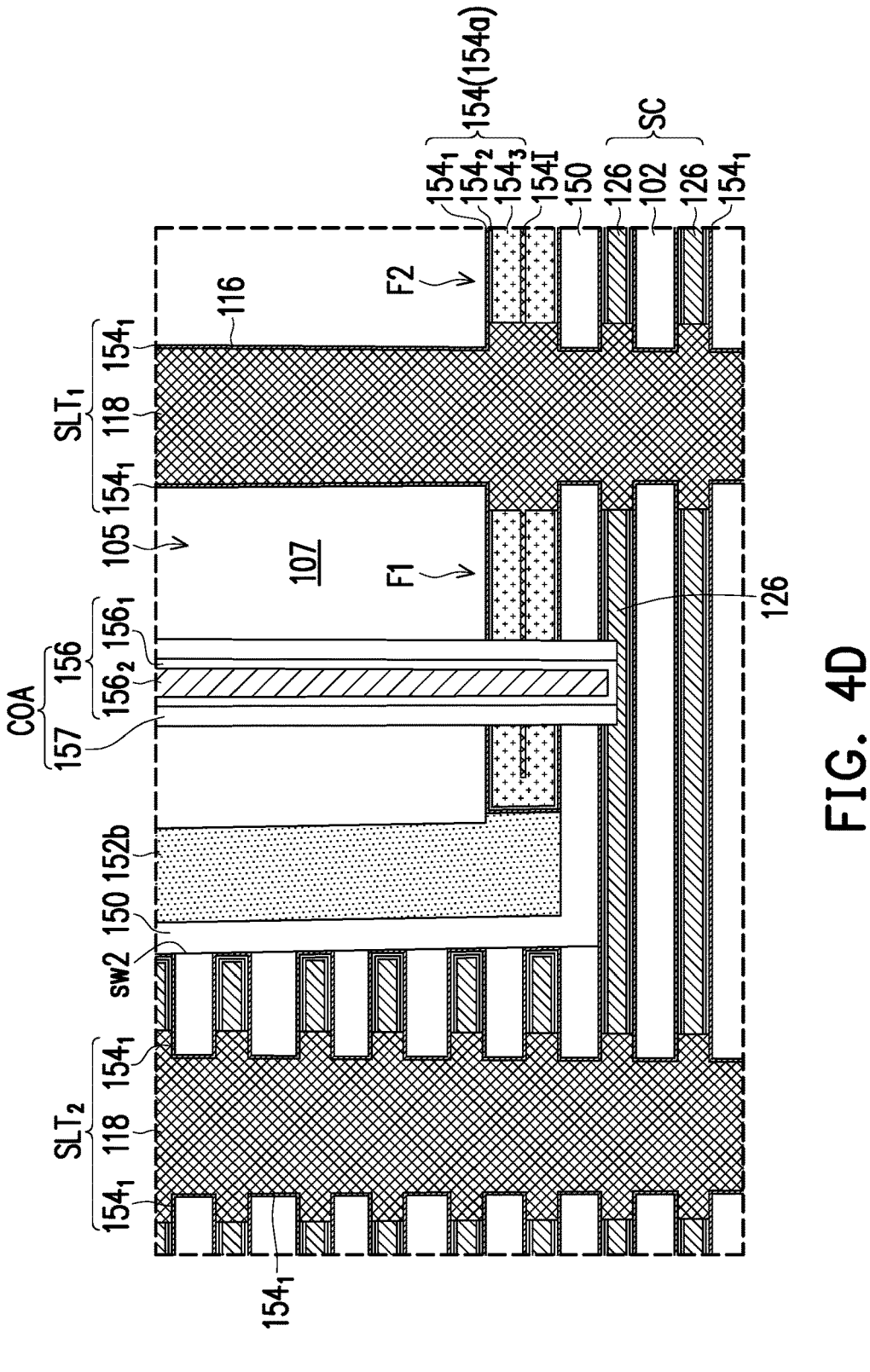

FIG. 4C and FIG. 4D show schematic partial cross-sectional views of a conductive plug extending through multiple stop layers and a liner layer according to an embodiment of the disclosure.

Referring to FIG. 4C and FIG. 4D, the conductive plug COA according to the embodiment of the disclosure is located between the separation walls $SLT_1$ and $SLT_2$. The conductive plug COA extends through the dielectric layer 107, the stop layer 154, and the liner layer 150, lands on the conductive layer 126 of the stepped structure SC, and is electrically connected to the conductive layer 126. The conductive plug COA may include one layer or multiple layers. The conductive plug COA may include an insulating material, a conductive material, or a combination thereof.

The insulating material is, for example, silicon oxide, and the conductive material is, for example, polysilicon, tungsten, tantalum, titanium, tantalum nitride, titanium nitride, or a combination thereof.

Referring to FIG. 4C, when the stop layer 154 includes an insulating material, the conductive plug COA may include a conductive material 156, for example, including a barrier layer $156_1$ and a conductive filling layer $156_2$. The barrier layer $156_1$ is formed on the sidewall and the bottom surface of the conductive filling layer $156_2$ and includes, for example, tantalum, titanium, tantalum nitride, titanium nitride, or a combination thereof. The conductive filling layer $156_2$ includes a metal layer, such as tungsten.

Referring to FIG. 4D, when the stop layer 154 includes a conductive material (i.e., the material layer $154_2$ is a barrier layer and the material layer $154_3$ is a conductive filling layer), the conductive plug COA may include a liner material 157 and a conductive material 156. The conductive material 156 may include a barrier layer $156_1$ and a conductive filling layer $156_2$. The liner material 157 surrounds the sidewall of the barrier layer $156_1$ to electrically isolate the barrier layer $156_1$ and the material layer $154_2$ (barrier layer), and electrically isolate the barrier layer $156_1$ and the material layer $154_3$ (conductive filling layer). The liner material 157 includes silicon oxide, silicon nitride, or a combination thereof. The barrier layer $156_1$ is formed on the sidewall and the bottom surface of the conductive filling layer $156_2$ and includes, for example, tantalum, titanium, tantalum nitride, titanium nitride, or a combination thereof. The conductive filling layer $156_2$ includes a metal layer, such as tungsten.

In the above embodiments, referring to FIG. 2J and FIG. 2K, the stop layer 154 on the dielectric layer 128 and in the slit trench 116 is completely removed. However, the embodiment of the disclosure is not limited thereto. The stop layer 154 may be thinned or may remain without thinning on the sidewall and the bottom of the slit trench 116, or the stop layer 154 at the bottom of the slit trench 116 may be partially removed, as shown in FIG. 5A to FIG. 5C, FIG. 6A to FIG. 6B, and FIG. 7A to FIG. 7C, respectively.

Figure 5A:
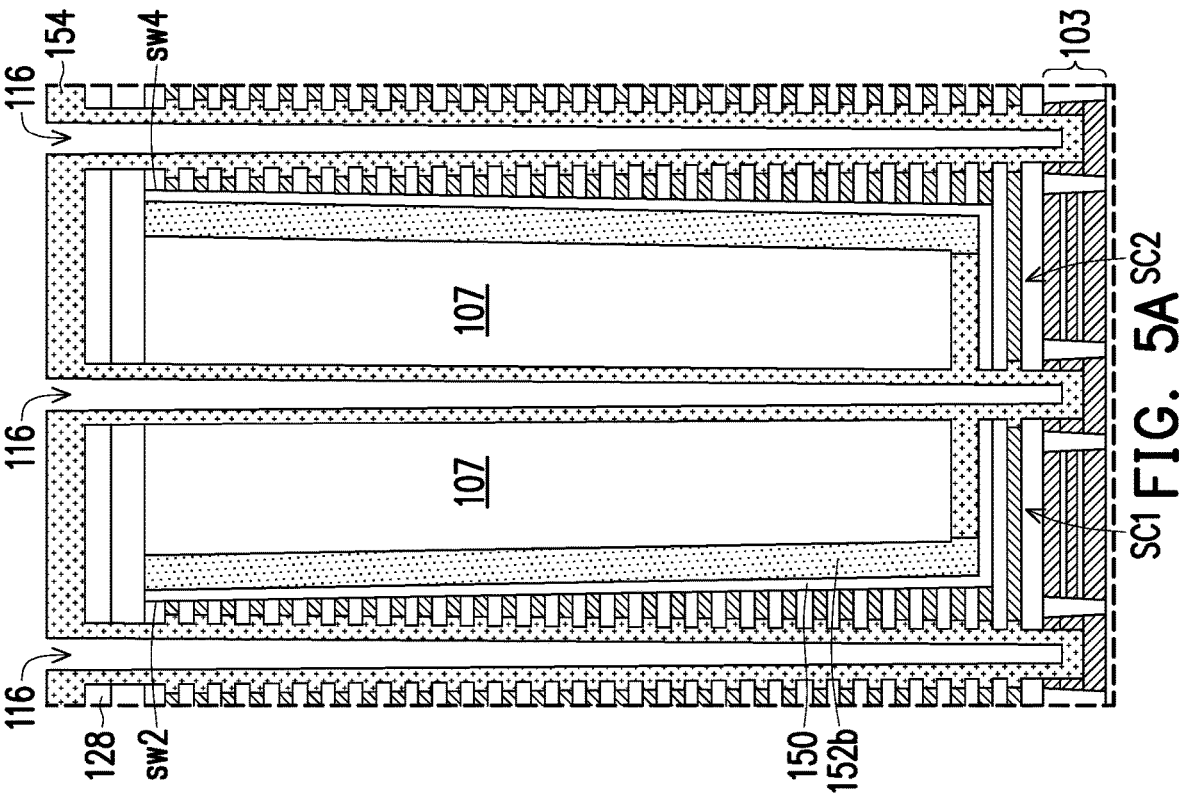
FIG. 5A to FIG. 5C, FIG. 6A to FIG. 6B, and FIG. 7A to FIG. 7C are schematic cross-sectional views of intermediate stages of memory devices according to embodiments of the disclosure.
Figure 5C:
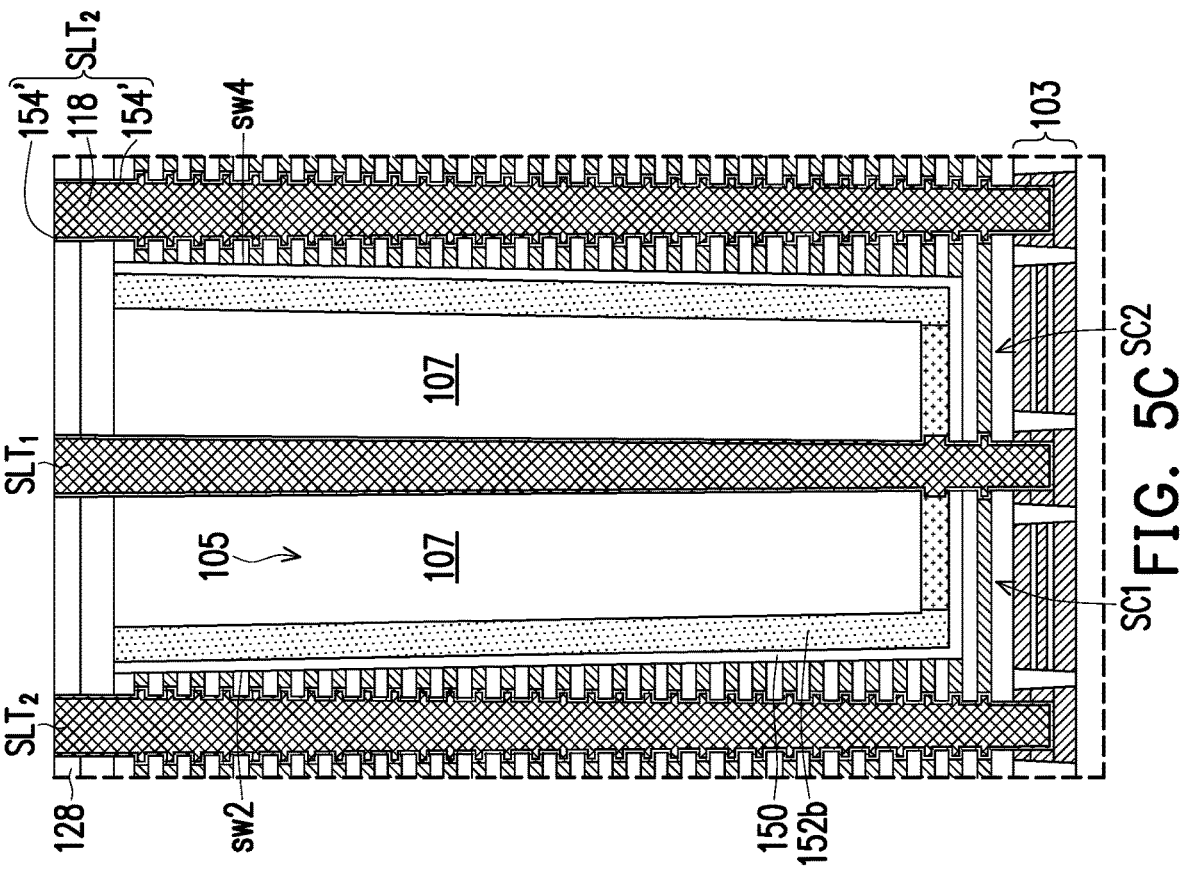
Figure 5B:
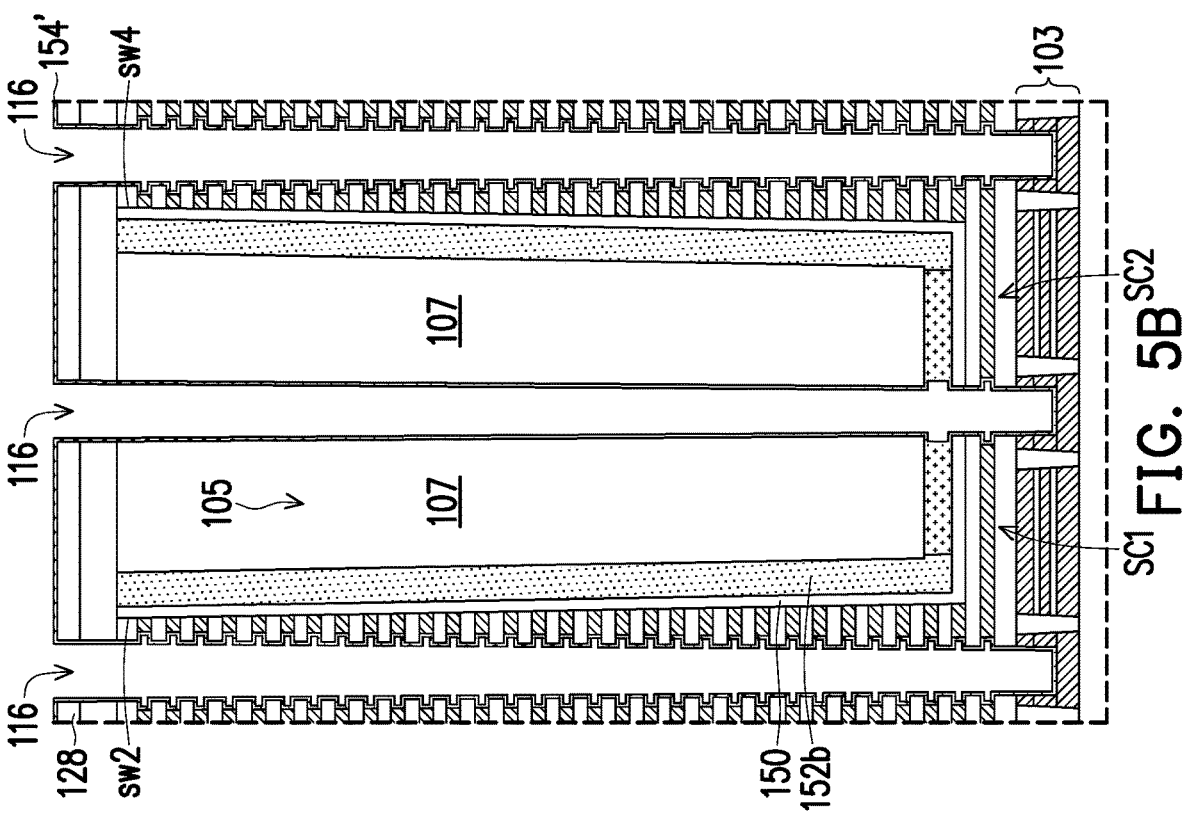

In the fabrication process of FIG. 5A to FIG. 5C, the stop layer 154 (shown in FIG. 5A) on the dielectric layer 128 and in the slit trench 116 is thinned to form a stop layer 154' (shown in FIG. 5B). Afterwards, the stop layer 154' on the dielectric layer 128 is removed through an anisotropic etching process, and the stop layer 154' on the sidewall and the bottom surface of the slit trench 116 remains. The stop layer 154' and the subsequently formed filling layer 118 together form the separation walls $SLT_1$ and $SLT_2$ (shown in FIG. 5C).

Figure 6B:
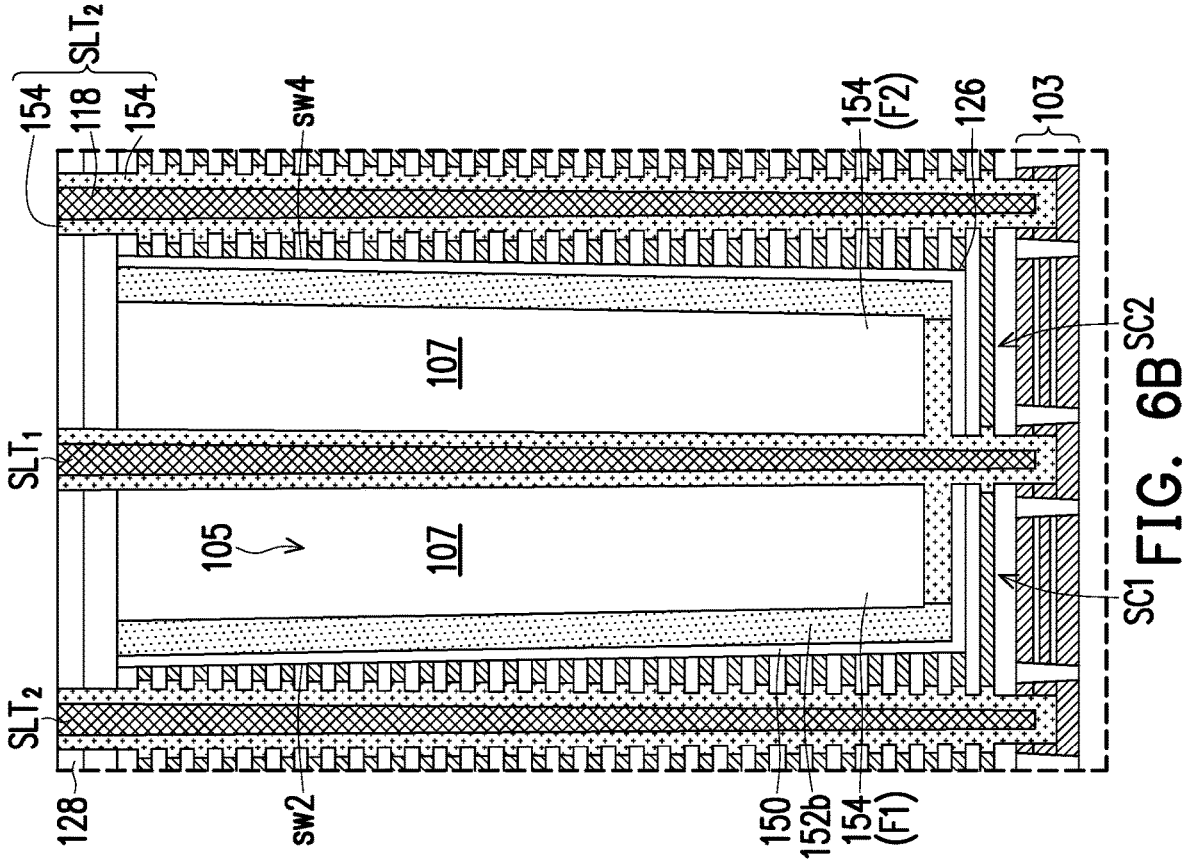
Figure 6A:
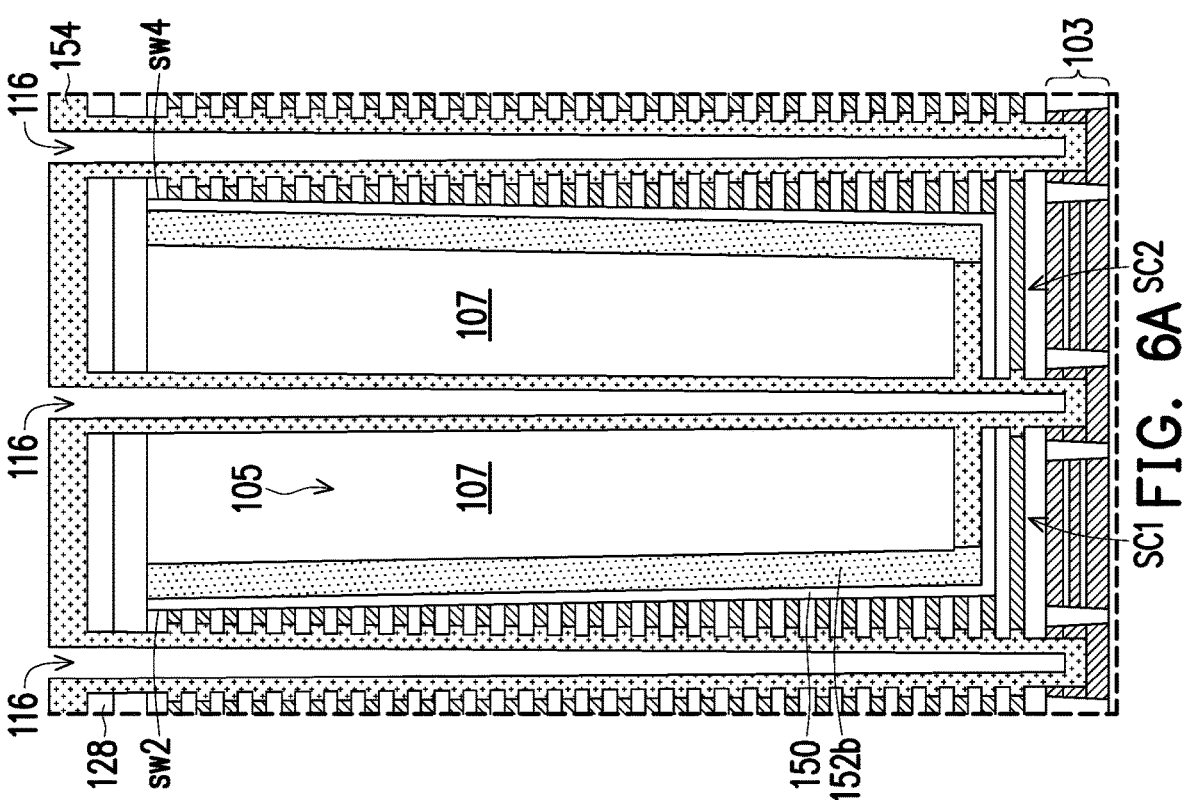

In the fabrication process of FIG. 6A to FIG. 6B, after the stop layer 154 is formed (shown in FIG. 6A), the stop layer 154 is not thinned, but an anisotropic etching process is directly performed to remove the stop layer 154 on the dielectric layer 128, and the stop layer 154b on the sidewall and the bottom surface of the slit trench 116 remains. The stop layer 154 and the subsequently formed filling layer 118 together form the separation walls $SLT_1$ and $SLT_2$ (shown in FIG. 6B).

Figure 7A:
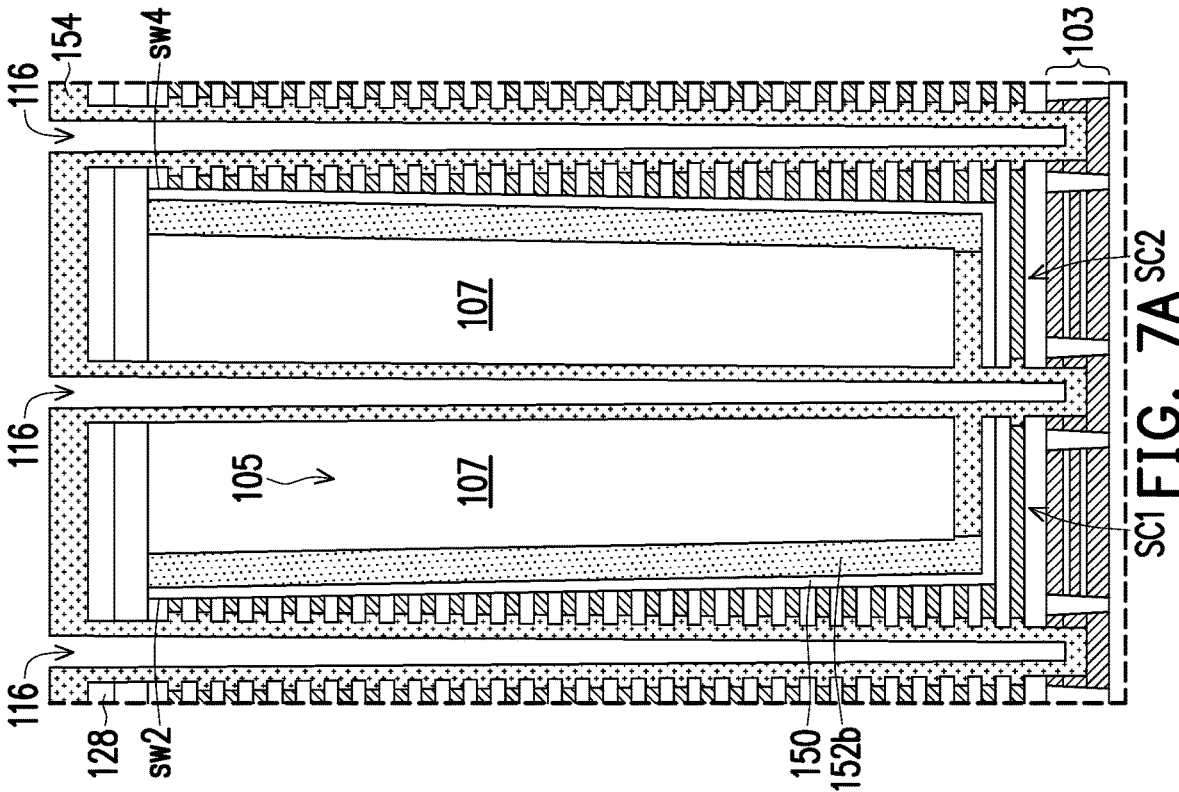
Figure 7C:
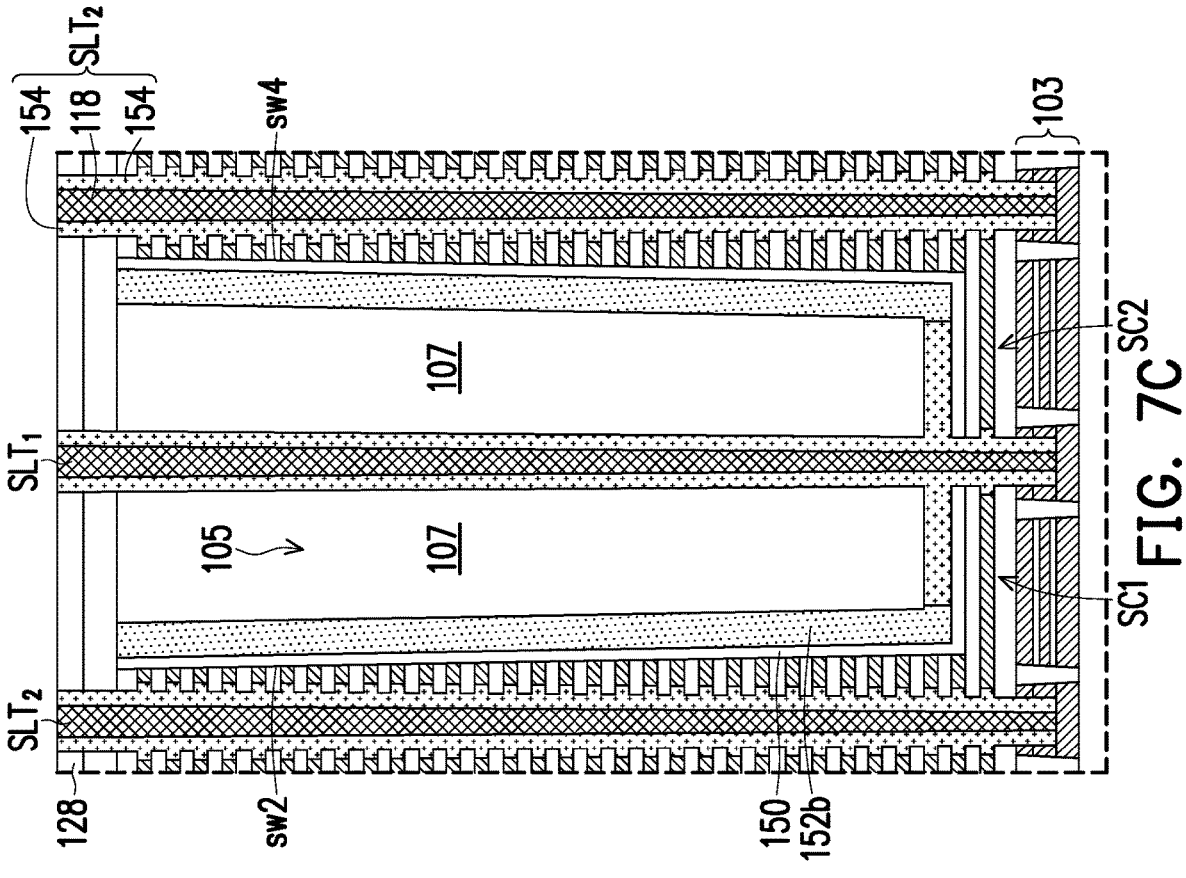
Figure 7B:
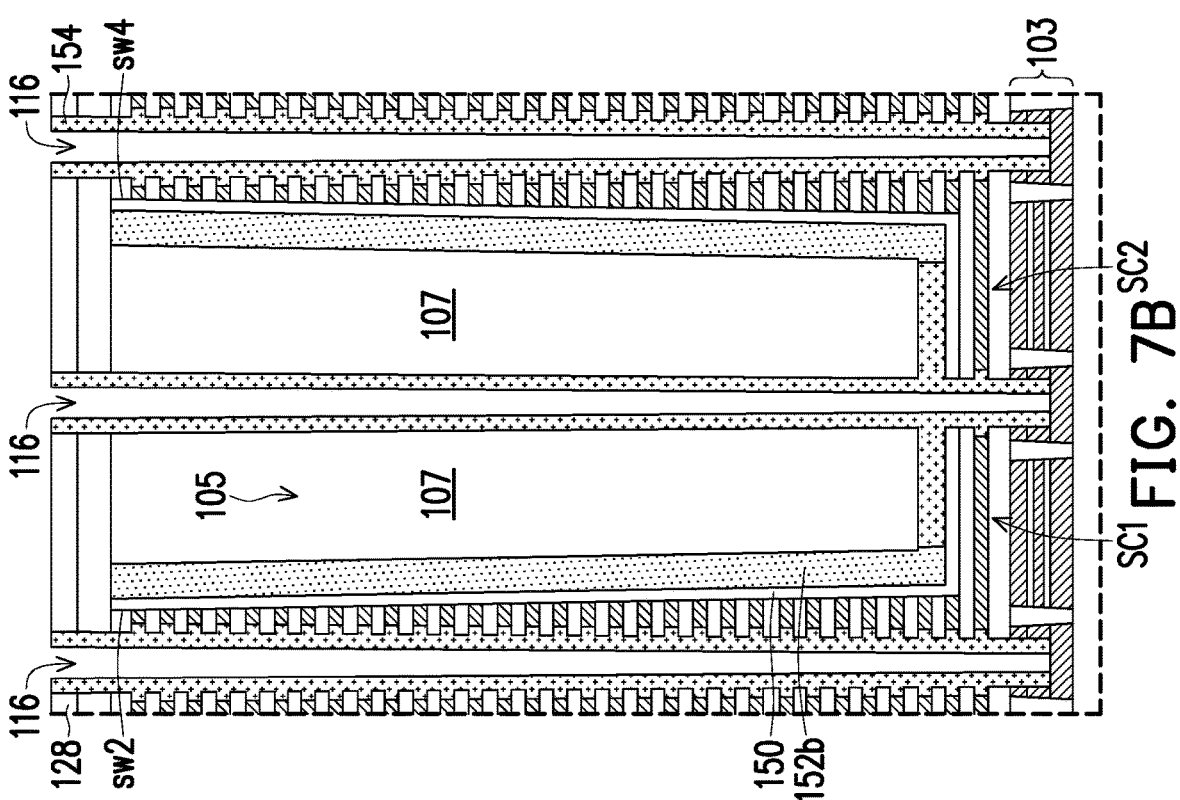

In the fabrication process of FIG. 7A to FIG. 7C, after the stop layer 154 is formed (shown in FIG. 7A), the stop layer 154 is not thinned, but an anisotropic etching process is directly performed to remove the stop layer 154 on the dielectric layer 128 and at the bottom of the slit trench 116, and the stop layer 154 on the sidewall of the slit trench 116 remains (shown in FIG. 7B). The stop layer 154 and the subsequently formed filling layer 118 together form the separation walls $SLT_1$ and $SLT_2$ (shown in FIG. 7C).

FIG. 8A to FIG. 8D are top views of intermediate stages of a method for fabricating a memory device according to another embodiment of the disclosure. FIG. 9A to FIG. 9E are schematic cross-sectional views of a method for fabricating a memory device according to another embodiment of the disclosure. For clarity, FIG. 8A and FIG. 8D show top views of lines VIII-VIII' and IX-IX' of the staircase region in FIG. 9A and FIG. 9D. FIG. 9A and FIG. 9D show schematic cross-sectional views of the staircase region SCR (including cross-sections of lines VI-VI' and VII-VII' in two different directions D1 and D2 in FIG. 8A to FIG. 8D) and the memory array region ARR. The direction D1 is, for example, parallel to a direction of the bit lines. The direction D2 is, for example, parallel to a direction of the word lines. FIG. 9E is a schematic cross-sectional view of the staircase region SCR, the memory array region ARR, and the peripheral region PRR.

Referring to FIG. 9A, according to the above method, the insulating layer 101, the stop structure 103, and the lower part LP of the stacked structure (or referred to as first stacked structure) SK1 are formed over the substrate 100. Next, multiple dummy pillars DVC are formed in the lower part LP of the stacked structure SK1. Afterwards, the upper part UP of the stacked structure SK1 and the hard mask layer HM are formed over the substrate 100. Next, the hard mask layer HM is patterned. Then, taking the hard mask layer HM as a mask, the intermediate layer 104 and the insulating layer 102 of the stacked structure SK1 are patterned to form the opening 105A and the stepped structure SC.

FIG. 8A is a top view along lines VIII-VIII' and IX-IX' of FIG. 9A to FIG. 9B.

Referring to FIG. 8A and FIG. 9A, the opening 105A has, for example, a rectangular shape. The range of the opening 105A is quite large, covering two adjacent openings 105 in FIG. 1A, the region therebetween, and the surrounding region. In FIG. 1A, the stepped structures SC exposed by the two openings 105 are independent and separated from each other. In FIG. 8A, the stepped structure SC exposed by the opening 105A is continuously extended. The opening 105A extends in the direction D1, so only the sidewalls sw1 and sw3 are shown.

Referring to FIG. 8A and FIG. 9B, the liner layer 150, the stop layer 152, and the dielectric layer 107 are formed in the opening 105A according to the above method, and after the liner layer 150 and the stop layer 152 on the hard mask layer HM and the dielectric layer 107 are removed, the hard mask layer HM is removed.

Referring to FIG. 8A and FIG. 9B, the liner layer 150 remaining in the opening 105A includes multiple portions 150a and 150b. The stop layer 152 remaining in the opening 105A includes multiple portions 152a and 152b. The portions 150a and 152a cover the surface of the stepped structure SC. The portions 150b and 152b cover the sidewalls sw1 and sw3 of the stacked structure SK1 exposed in the opening 105A.

Referring to FIG. 9C, the charge storage structure 108, the channel pillar VC, the dielectric layer 115, multiple support pillars (not shown), the dielectric layer 128, and the slit trench 116 are formed according to the above method. Referring to FIG. 8B and FIG. 9C, the slit trench 116 may include slit trenches 1161 and 1162.

Next, referring to FIG. 8C and FIG. 9C, a selective etching process is performed to remove the intermediate layer 104 on two sides of the slit trenches 1161 and 1162 and part of the stop layer 152 to form the horizontal opening 121a as described above. Afterwards, the conductive layer 126 (shown in FIG. 8D and FIG. 9C) is filled back in the horizontal opening 121a. In this embodiment, in the selective etching process, the etchant can come into contact with the stop layer 152 through the slit trenches 1161 and 1162 on two sides. Therefore, the stop layer 152b on the sidewalls sw1 and sw3 of the opening 105A and the stop layer 152a on the bottom surface of the opening 105A are removed due to contact with the etchant, thereby forming a U-shaped cavity 121b (shown in FIG. 9C). It is noted that, in the above embodiment, referring to FIG. 1B, the stop layer 152b on the sidewalls sw2 and sw4 remain. The stop layer 152b covers the liner layer 150b on the sidewalls sw2 and sw4. In this embodiment, referring to FIG. 8C, except for the sidewalls sw1 and sw3 of the opening 105A, the stop layer 152b is not present between the two sides of the slit trenches 1161 and 1162, and the stop layer 152a on the bottom surface of the opening 105A remains. Similarly, of the stop layer 152 in the peripheral region PRR, only the stop layer 152a on the bottom surface of the opening 105A remains, as shown in FIG. 9E. As described in the above embodiment, when the conductive layer 126 is formed, the conductive layer 126 is also formed in the U-shaped cavity 121b. Thereafter, an etching process is performed to remove the conductive layer 126 in the U-shaped cavity 121b and the slit trench 116, so that the U-shaped cavity 121b and the slit trench 116 are exposed.

Referring to FIG. 9D and FIG. 9E, according to the method of the above embodiment, the stop layer 154 is formed in the U-shaped cavity 121b. Afterwards, the depth of the slit trench 116 is increased, and the middle conductive layer 94 in the stop structure 103 and the insulating layers 92 above and below the conductive layer 94 are replaced with the conductive layer 93. The conductive layer 93 and the conductive layer 94 may form a common source line CSL. The separation walls $SLT_1$ and $SLT_2$ are formed according to the method of the above embodiment. Next, multiple conductive plugs COA are formed to respectively electrically connect the conductive layer 126 and the channel pillar VC. In addition, referring to FIG. 9E, multiple through vias TV are formed. The stop layers 154a and 152a may serve as etching stop layers in the first-stage etching process of forming multiple conductive plug holes OP1 and multiple through via openings OP2 of the multiple conductive plugs COA and the multiple through vias TV. Since the stop layers 154a and 152a have sufficient thickness and have a sufficient etching selectivity ratio with respect to the dielectric layer 107, even though the dielectric layers 107 in each region of the substrate 100 (staircase region SCR and peripheral region PRR) or at each step of the stepped structure SC have thicknesses that differ significantly, it is still possible to effectively control the multiple conductive plug holes OP1 and the through via openings OP2 with considerable depth differences to stop on the stop layer 154a and the stop layer 152a respectively without etching through the conductive layer 126 or 93. Referring to FIG. 10A, FIG. 10B, and FIG. 9E, according to the method of the embodiment of the disclosure, multiple conductive plugs COA and multiple through vias TV of different depths can be formed.

Referring to FIG. 9E, the interconnect structure 130 and the bonding structure 132 are formed over the substrate 100 according to the method of the above embodiment. Afterwards, the bonding structure 132 is bonded to the bonding structure 32 of another chip 10W until the connector 52 is formed on the conductive line 48. As a result, the memory device SM2 is formed.

Referring to FIG. 8D and FIG. 9E, in the present embodiment, the opening 105A is different from the opening 105 shown in FIG. 1D and FIG. 2R. The alternately stacked multiple conductive layers 126 and multiple insulating layers 102 between two adjacent openings 105 in FIG. 1D and FIG. 2R are removed. Hence, the opening 105A is formed as shown in FIG. 8D and FIG. 9E. In the present embodiment, the liner layer 150 and the stop layer 154 remain at the bottom of the opening 105A as etching stop layers, and the liner layer 150 and the stop layer 154 also remain on the sidewalls sw1 and sw3 of the opening 105A in the staircase region SCR (shown in FIG. 8D). The liner layer 150 and the stop layers 152 remain on the bottom of the opening 105A in the peripheral region PRR (shown in FIG. 9E) to serve as etching stop layers.

Figure 11A:
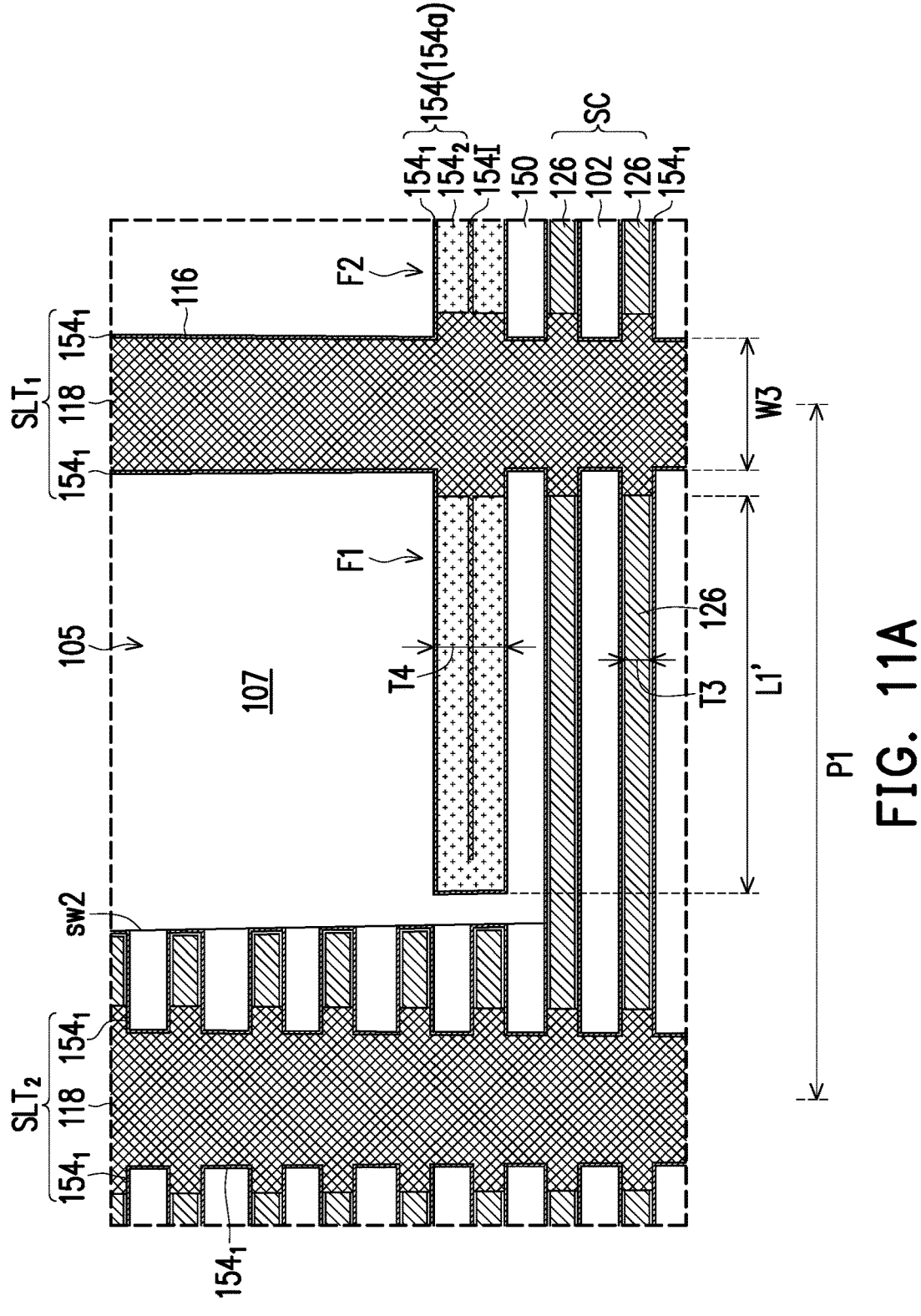
FIG. 11A and FIG. 11B show schematic partial cross-sectional views of multiple stop layers and a liner layer according to an embodiment of the disclosure.
Figure 11B:
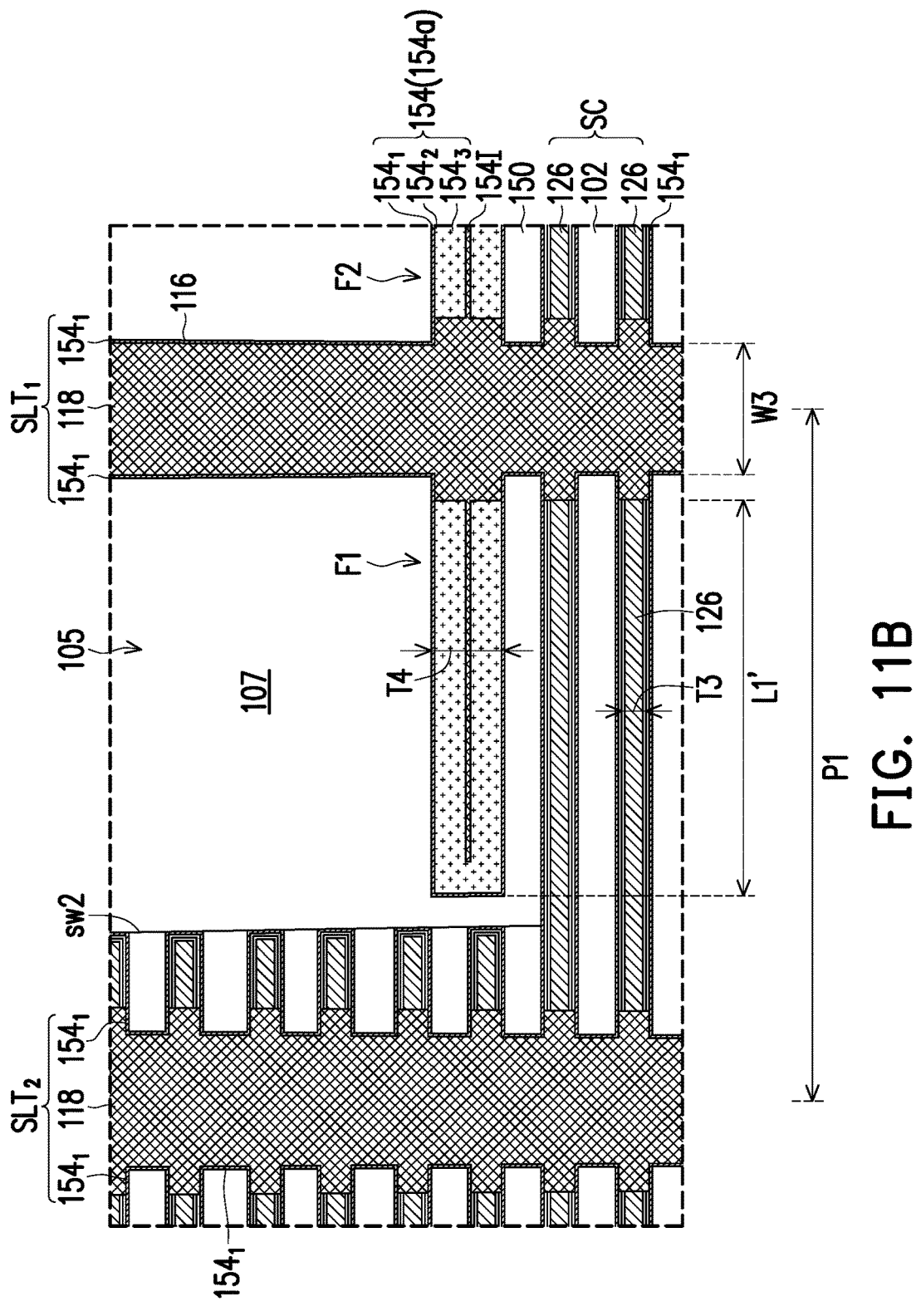

FIG. 11A and FIG. 11B show schematic partial cross-sectional views of multiple stop layers and a liner layer according to an embodiment of the disclosure.

Referring to FIG. 11A and FIG. 11B, in this embodiment, the stop layer 154, the liner layer 150, and the dielectric layer 107 are located in the opening 105A. The stop layer 154 is located between the liner layer 150 and the dielectric layer 107. Different from the above embodiment, this embodiment does not provide the stop layer 152b located between the sidewall of the opening 105A and the sidewall of the dielectric layer 107, so a length L' of the sub-portion F1 (or F2) of the stop layer 154a is greater. Similarly, the stop layer 154 may be one layer or multiple layers. The material of the stop layer 154 may include an insulating layer, a conductive layer, or a combination thereof. The insulating layer may include silicon nitride, a high-k material, or a combination thereof. The conductive layer may include polysilicon, tungsten, tantalum, titanium, tantalum nitride, titanium nitride, or a combination thereof.

Referring to FIG. 11A, for example, the stop layer 154 may include the material layers $154_1$ and $154_2$, and material layer $154_2$ has an interface 154I therein as described in the above embodiment. Referring to FIG. 11B, for example, the stop layer 154 may include the material layers $154_1$, $154_2$, and $154_3$ as described in the above embodiment. The material layer $154_3$ has an interface 154I therein.

Figure 11C:
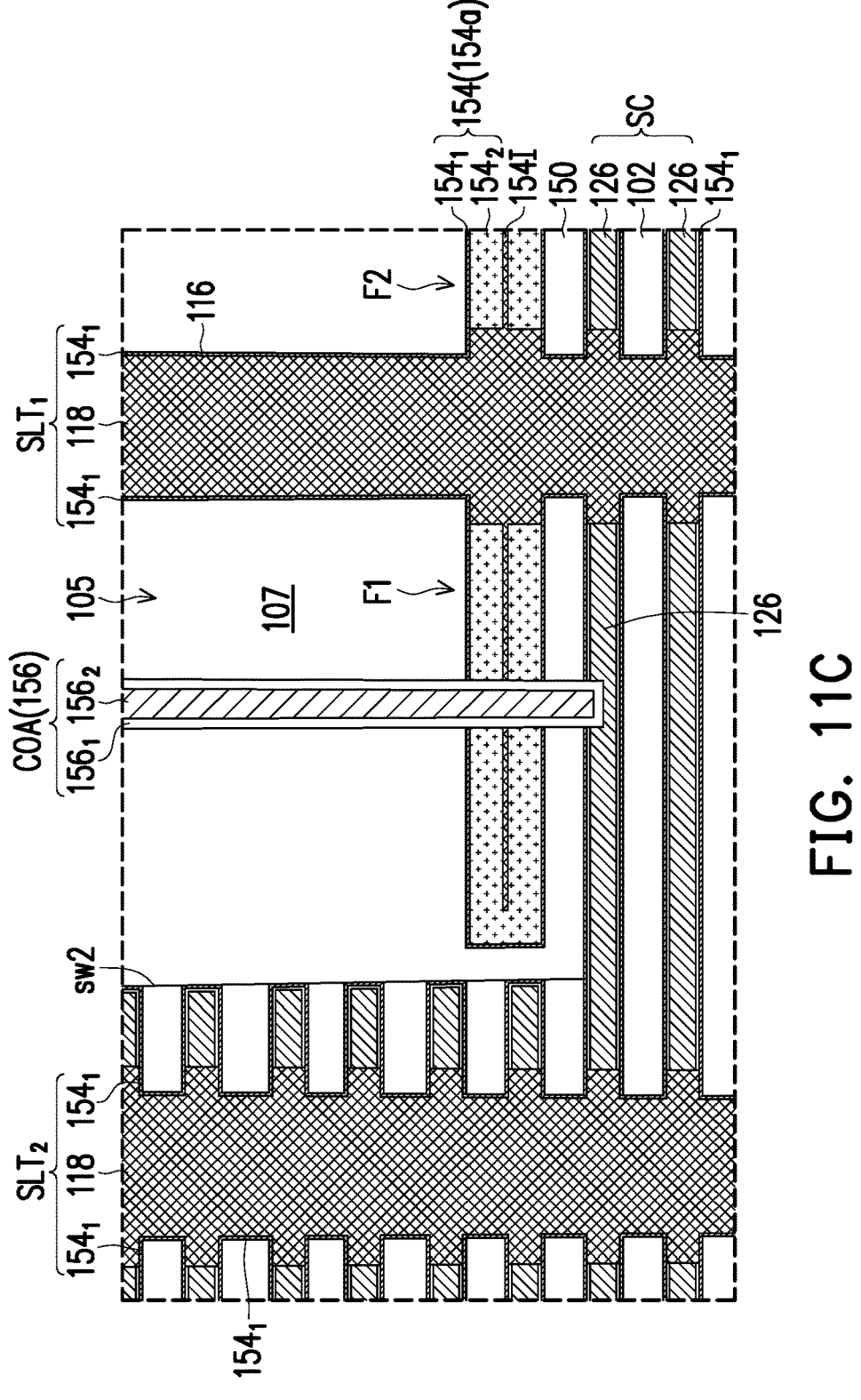
FIG. 11C and FIG. 11D show schematic partial cross-sectional views of a conductive plug extending through the stop layers and the liner layer according to an embodiment of the disclosure.
Figure 11D:
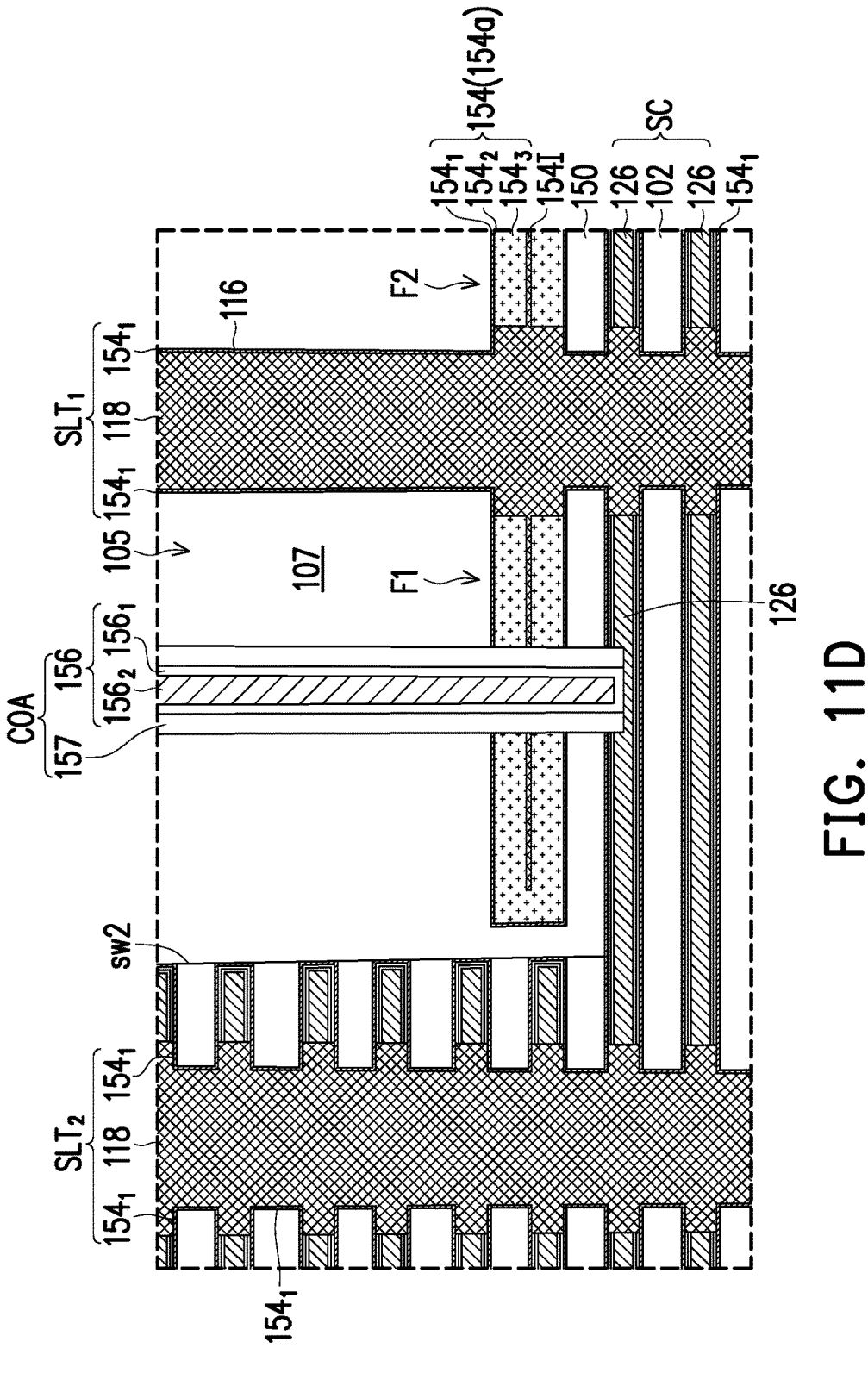

FIG. 11C and FIG. 11D show schematic partial cross-sectional views of a conductive plug extending through multiple stop layers and a liner layer according to an embodiment of the disclosure.

Referring to FIG. 11C and FIG. 11D, the conductive plug COA according to the embodiment of the disclosure is located between the separation walls $SLT_1$ and $SLT_2$. The conductive plug COA extends through the dielectric layer 107, the stop layer 154, and the liner 150, and lands on the conductive layer 126 of the stepped structure SC. The conductive plug COA may include one layer or multiple layers. The conductive plug COA may include an insulating material, a conductive material, or a combination thereof. The insulating material includes, for example, silicon oxide, and the conductive material includes, for example, polysilicon, tungsten, tantalum, titanium, tantalum nitride, titanium nitride, or a combination thereof.

Referring to FIG. 11C, when the stop layer 154 includes an insulating material, the conductive plug COA may include a conductive material 156, for example, including a barrier layer $156_1$ and a conductive filling layer $156_2$. The relative positions and materials of the barrier layer $156_1$ and the conductive filling layer $156_2$ are as described in the above embodiment.

Referring to FIG. 11C, when the stop layer 154 includes a conductive material (i.e., the material layer $154_2$ is a barrier layer and the material layer $154_3$ is a conductive filling layer), the conductive plug COA may include a liner material 157 and a conductive material 156. The conductive material 156 may include a barrier layer $156_1$ and a conductive filling layer $156_2$. The relative positions and materials of the liner material 157 and the conductive material 156 are as described in the above embodiment.

In the above embodiment, the stop layer 154 on the dielectric layer 128 and in the slit trench 116 is completely removed, but the embodiment of the disclosure is not limited thereto. The stop layer 154 may be thinned or may remain without thinning on the sidewall and the bottom of the slit trench 116, or the stop layer 154 at the bottom of the slit trench 116 may be partially removed (not shown).

Figure 12A:
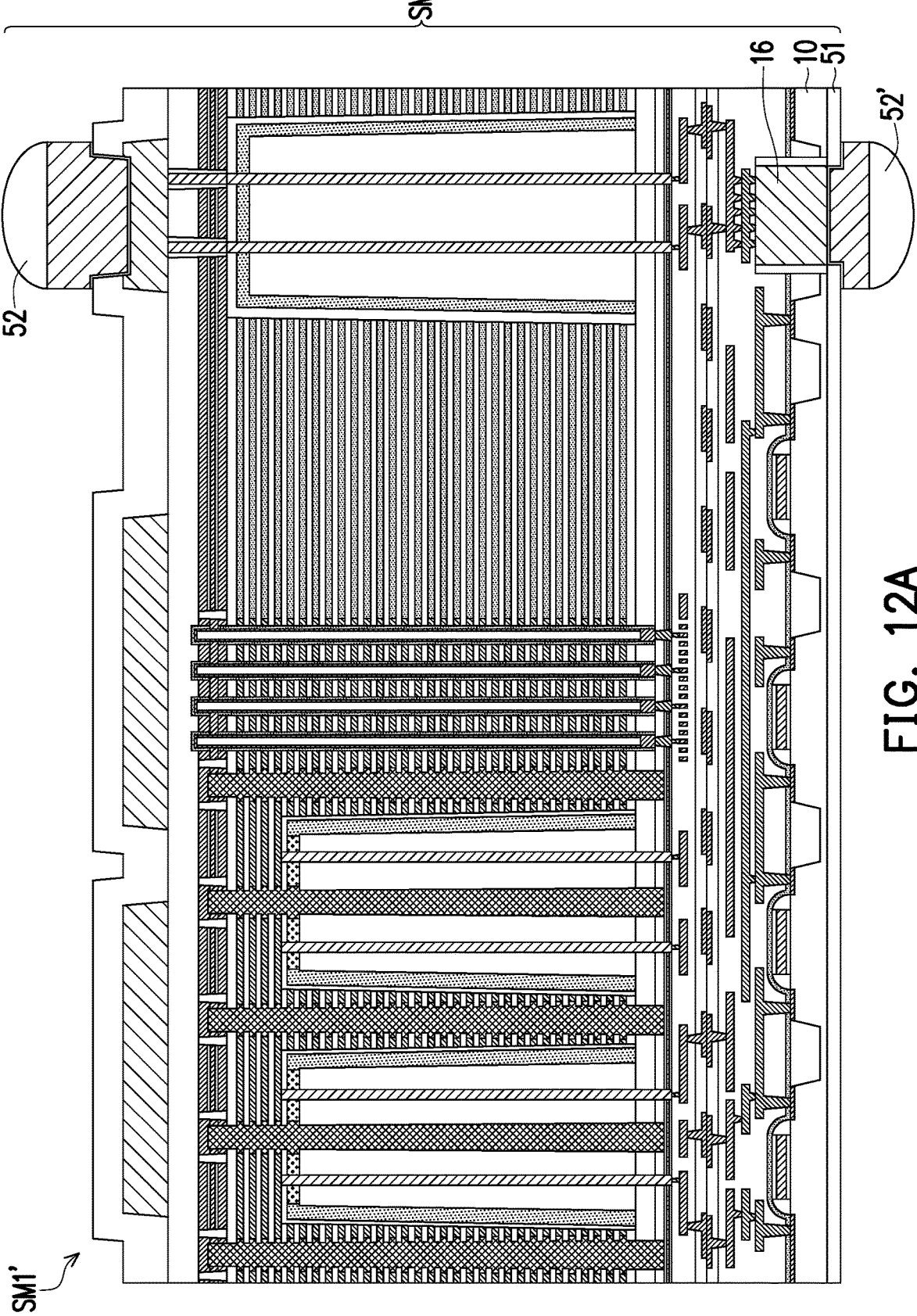
FIG. 12A to FIG. 12D are schematic cross-sectional views of a fabricating process of a stacked chip according to an embodiment of the disclosure.
Figure 12B:
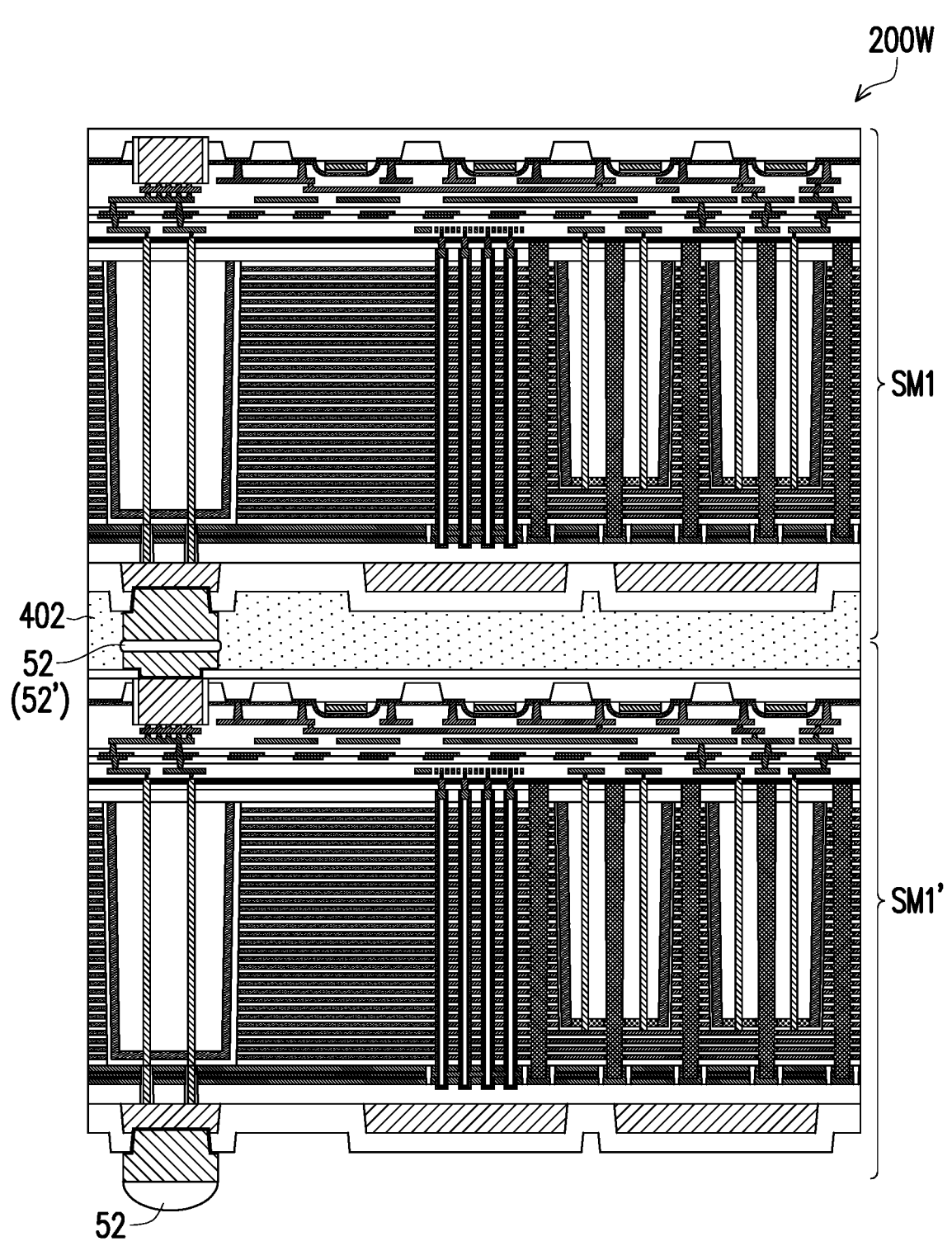
Figure 12C:
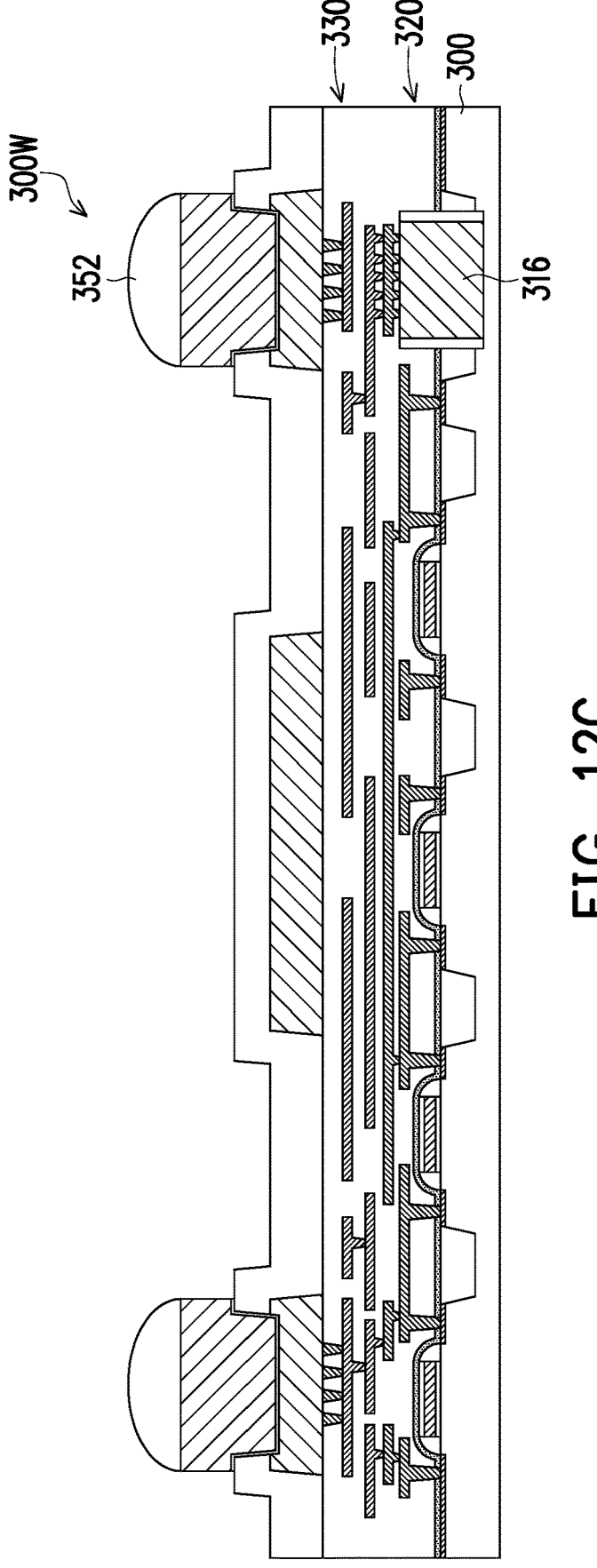

FIG. 12A to FIG. 12C are schematic cross-sectional views of a fabrication process of a stacked chip according to an embodiment of the disclosure.

In the disclosure, a stacked chip may be formed by stacking multiple memory chips SM1, stacking multiple memory chips SM2, or stacking the memory chip SM1 and the memory chip SM2. For simplicity, an example of stacking multiple memory chips SM1 to form a stacked chip 200W will be described.

Referring to FIG. 12A, the substrate 10 of the memory chip SM1 is thinned so that the semiconductor through via (or referred to as silicon through via) 16 is exposed. Afterwards, a dielectric layer 51 and a connector 52' connected to the semiconductor through via (or referred to as silicon through via) 16 are formed on the semiconductor through via (or referred to as silicon through via) 16 to form a memory chip SM1'.

Referring to FIG. 12B, afterwards, the connector 52 of the memory chip SM1 is bonded to the connector 52' of the memory chip SM1' to form a stacked chip 200W.

Referring to FIG. 12C, a chip 300W is provided. The chip 300W may be a logic chip. The chip 300W may include a substrate 300, a semiconductor through via (or referred to as silicon through via) 316, a device layer 320, an interconnect structure 330, and a connector 352. The substrate 300, the semiconductor through via (or referred to as silicon through via) 316, the device layer 320, the interconnect structure 330 and a connector 352 may be the same as, similar to, or different from the substrate 10, the semiconductor through via (or referred to as silicon through via) 16, the device layer 20, the interconnect structure 30, and the connector 52 described above.

Figure 12D:
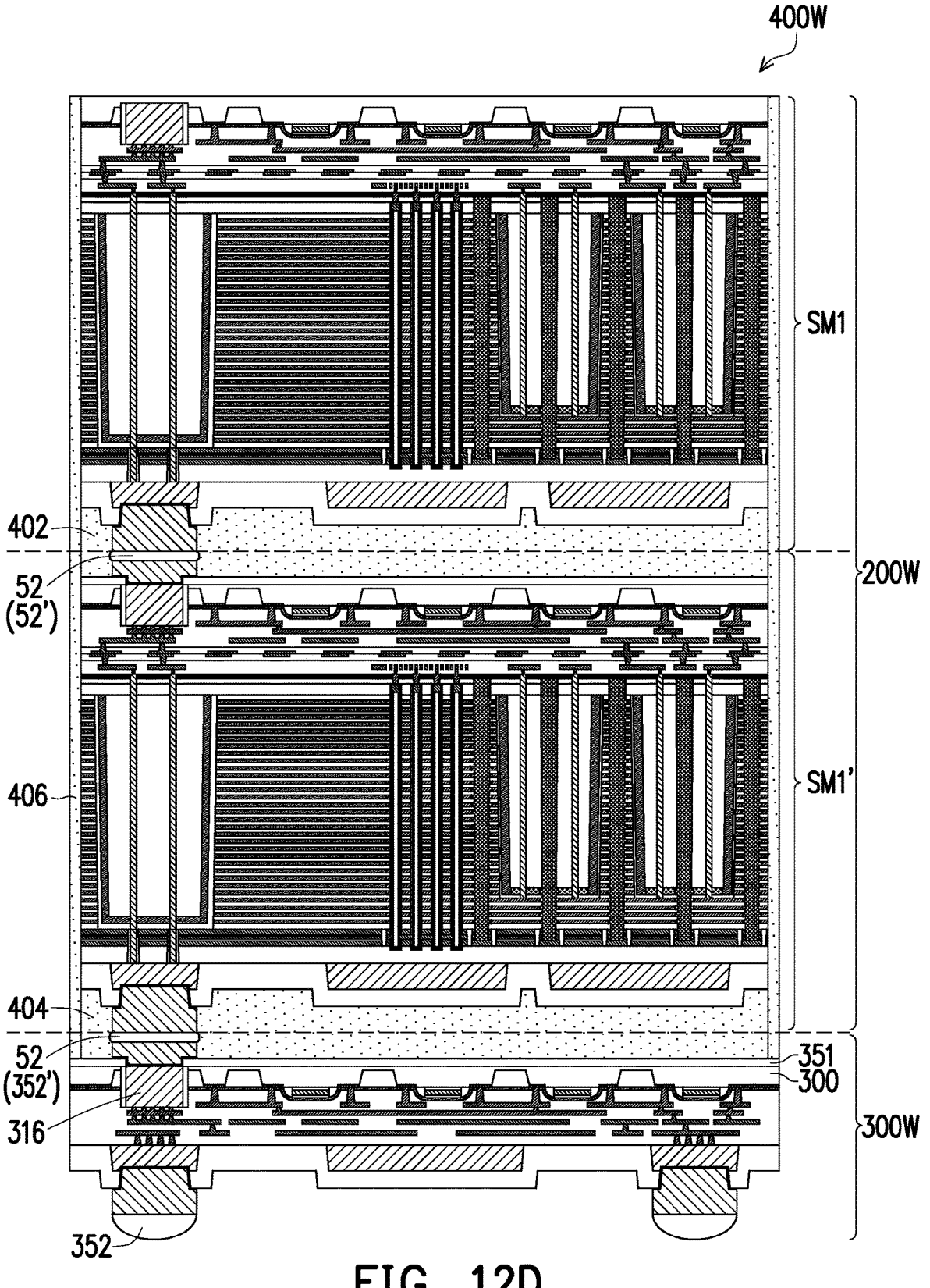

Referring to FIG. 12D, the stacked chip 200W is bonded to the chip 300W to form a stacked chip 400W. Before performing the bonding process, the substrate 300 of chip 300W may be thinned first, so that the semiconductor through via (or referred to as silicon through via) 316 is exposed. Afterwards, a dielectric layer 351 and a connector 352' connected to the semiconductor through via (or referred to as silicon through via) 316 are formed on the semiconductor through via (or referred to as silicon through via) 316.

The stacked chip 200W may be bonded to the connector 352' of the chip 300W through the connector 52. Underfill materials 402 and 404 may be filled between the connector 52 and the connector 52' and between the connector 52 and the connector 352'. An encapsulation layer 406 may be covered around the stacked chip 200W.

The stacked chip 400W according to the embodiment of the disclosure includes two memory chips SM1 and SM1' in the longitudinal direction. However, the embodiment of the disclosure is not limited thereto. A stacked chip 500W may include more memory chips SM1 and SM1' in the longitudinal direction.

Figure 13:
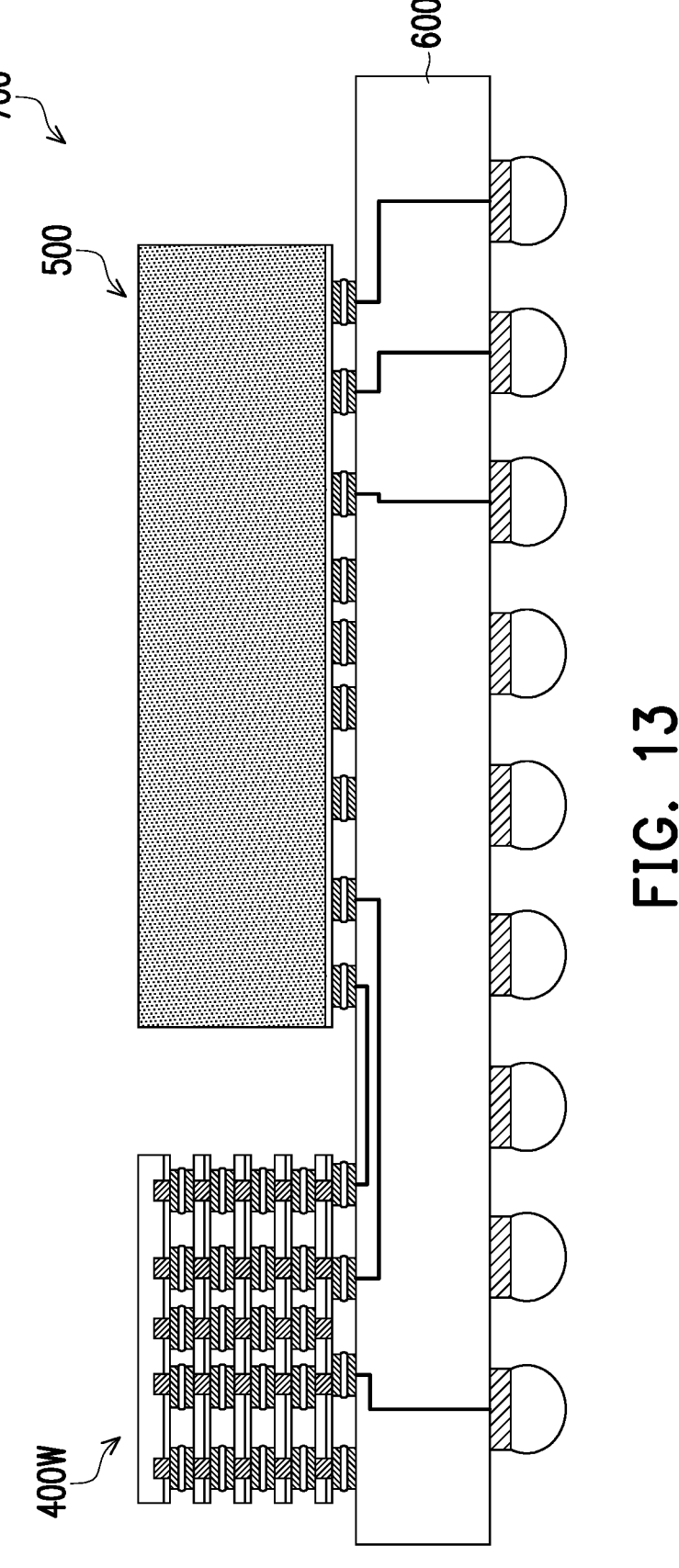
FIG. 13 shows a schematic cross-sectional view of a package structure.

FIG. 13 shows a schematic cross-sectional view of a package structure.

Referring to FIG. 13, the stacked chip 400W may be connected to a controller or directly to a host through semiconductor through via to provide a wide lane width and high speed per lane, so it may serve as a high-bandwidth NAND flash memory.

The stacked chip 400W may be bonded together with an application specific integrated circuit (ASIC) 500 onto an interposer 600 to form a package structure 700. However, the application of the stacked chip 400W is not limited thereto.

In the above description, the 3D NAND flash memory has been taken as an example. However, the disclosure is not limited thereto. The disclosure may also be applied to other 3D flash memories, such as 3D NOR flash memories.

In the embodiments of the disclosure, with the arrangement of the stop layer, it is possible to accurately control the formation of contact holes and through via openings of different depths, and prevent some contact holes and through via openings from being unable to land on the word line or conductive layer of the correct step due to different depths of the contact holes and through via openings. Therefore, in the embodiments of the disclosure, with the arrangement of the stop layer, it is possible to prevent the conductive plug from being unable to land on the word line and prevent an abnormal short circuit from occurring in the conductive plug. Therefore, the embodiments of the disclosure can improve the yield of the fabrication process.

What is claimed is:

1. A memory device, comprising:
   a substrate;
   a stacked structure, located over the substrate, wherein the stacked structure comprises a plurality of conductive layers and a plurality of insulating layers stacked alternately, and the stacked structure has an opening exposing a stepped structure of the stacked structure;
   a first stop layer, covering the stepped structure and at least one portion of sidewalls of the opening;
   a dielectric layer, filling in the opening and covering the first stop layer;
   at least one separation wall, extending through the dielectric layer and the first stop layer in the opening; and
   a conductive plug, extending through the dielectric layer, the first stop layer, and electrically connected to the stepped structure.

2. The memory device of claim 1 further comprises a second stop layer covering a remaining portion of the sidewalls of the opening, wherein the remaining portion of the sidewalls is different from the at least one portion of the sidewalls.

3. The memory device of claim 1, wherein the first stop layer is located on a bottom of the opening, and an interface is present in the first stop layer.

4. The memory device of claim 1, wherein the first stop layer comprises an insulating filling layer.

5. The memory device of claim 1, wherein the plurality of conductive layers have a first thickness, the first stop layer located on a bottom of the opening has a second thickness, and the second thickness is more than two times of the first thickness.

6. The memory device of claim 3, wherein the at least one separation wall has a bottom width, the first stop layer on the bottom of the opening has a second thickness, and the second thickness is less than the bottom width.

7. The memory device of claim 1, wherein the first stop layer comprises a conductive filling layer, the conductive plug comprises a conductive material and a liner material surrounding a sidewall of the conductive material, and the liner material separates the conductive material from the conductive filling layer.

8. A memory device, comprising:
a substrate;
a stacked structure, located over the substrate, wherein the stacked structure comprises a plurality of conductive layers and a plurality of insulating layers alternately stacked, the stacked structure has an opening exposing a stepped structure of the stacked structure, wherein the opening comprises:
a first sidewall;
a second sidewall, connected to the first sidewall;
a third sidewall, connected to the second sidewall, wherein the first sidewall is opposite to the third sidewall;
a fourth sidewall, connected to the third sidewall, wherein the second sidewall is opposite to the fourth sidewall; and
a bottom, connected to the first sidewall, second sidewall, third sidewall and fourth sidewall;
a first stop layer, comprising:
a first portion, covering the stepped structure; and
a second portion, at least covering the first sidewall and the third sidewall;
a dielectric layer, filling in the opening and covering the first stop layer;
at least one separation wall, extending through the dielectric layer and the first portion and the second portion of the first stop layer in the opening; and
a conductive plug, extending through the dielectric layer and the first portion of the first stop layer, and electrically connected to the stepped structure.

9. The memory device of claim 8, wherein the at least one separation wall extends along a direction parallel to the second sidewall and the fourth sidewall.

10. The memory device of claim 8, wherein an interface is present in the first portion of the first stop layer.

11. The memory device of claim 8, wherein the first stop layer comprises a high-k material layer and an insulating filling layer covered by the high-k material layer.

12. The memory device of claim 8, wherein the first stop layer comprises a conductive filling layer.

13. The memory device of claim 8, further comprising:
a first separation wall, extending through the dielectric layer, the first portion of the first stop layer and the stepped structure, and dividing the first portion of the first stop layer into a plurality of sub-portions; and
a plurality of second separation walls, extending through the stacked structure, wherein the second portion of the first stop layer and the first separation wall are located between the plurality of second separation walls.

14. The memory device of claim 13, wherein the first separation wall and the plurality of second separation walls comprise a material different from that of the first stop layer.

15. The memory device of claim 13, further comprising a second stop layer covering the second sidewall and the fourth sidewall.

16. The memory device of claim 15, wherein the first separation wall and the plurality of second separation walls comprise a material different from that of the second stop layer.

17. The memory device of claim 13, wherein at least one separation wall comprises a first separation wall and a second separation wall, the first separation wall is separated from the second separation wall by a first distance, and the sub-portions of the first portion of the first stop layer are located between the first separation wall and the second separation wall, and a length of the sub-portions is more than one-half of the first distance.

18. The memory device of claim 13, wherein the first separation wall is electrically insulated from the second separation wall.

19. The memory device of claim 8, wherein a thickness of the first portion of the first stop layer is less than a bottom width of the at least one separation wall.

20. The memory device of claim 8, wherein the plurality of conductive layers have a first thickness, the first portion of the first stop layer has a second thickness, and the second thickness is more than two times of the first thickness.

* * * * *